US012658989B1

(12) United States Patent
Pick et al.

(10) Patent No.: US 12,658,989 B1
(45) Date of Patent: Jun. 16, 2026

(54) GROUPING LOG-LIKELIHOOD-RATIOS DIFFERENT MULTIPLE-INPUT-MULTIPLE-OUTPUT LAYERS FOR POLAR DECODING

(71) Applicant: QUALCOMM Incorporated, San Diego, CA (US)

(72) Inventors: Jacob Pick, Mevaseret Zion (IL); Shay Landis, Hod Hasharon (IL); Peer Berger, Hod Hasharon (IL)

(73) Assignee: QUALCOMM Incorporated, San Diego, CA (US)

( * ) Notice: Subject to any disclaimer, the term of this patent is extended or adjusted under 35 U.S.C. 154(b) by 21 days.

(21) Appl. No.: 18/979,297

(22) Filed: Dec. 12, 2024

(51) Int. Cl.
| | |
|---|---|
| *H04B 7/0456* | (2017.01) |
| *H03M 13/13* | (2006.01) |

(52) U.S. Cl.
CPC .......... *H04B 7/0473* (2013.01); *H03M 13/13* (2013.01)

(58) Field of Classification Search
CPC .......... H04B 7/02; H04B 7/04; H04B 7/0413; H04B 7/0456; H04B 7/046; H04B 7/0473
See application file for complete search history.

(56) References Cited

U.S. PATENT DOCUMENTS

| | | | | |
|---|---|---|---|---|
| 7,570,697 | B2 * | 8/2009 | van Nee ........... | H03M 13/2757 375/267 |
| 8,411,806 | B1 * | 4/2013 | Lee ................... | H04L 25/03891 375/349 |
| 8,559,543 | B1 * | 10/2013 | Lee ................... | H04B 7/0413 375/267 |
| 8,625,712 | B2 * | 1/2014 | Yeon ................. | H04B 7/0619 375/267 |
| 8,693,588 | B2 * | 4/2014 | McCloud ......... | H04L 25/03242 375/341 |
| 9,559,764 | B1 * | 1/2017 | Lee ................... | H04L 1/0662 |
| 10,601,447 | B2 * | 3/2020 | Lin ................... | H04L 5/0016 |
| 10,680,646 | B2 * | 6/2020 | Richardson ........ | H03M 13/1111 |
| 10,931,400 | B2 * | 2/2021 | Jang ................. | H03M 13/6561 |

(Continued)

OTHER PUBLICATIONS

Cao C., et al., "Irregular Polar Coding for Massive MIMO Channels", GLOBECOM 2017—2017 IEEE Global Communications Conference, IEEE, Dec. 4, 2017, 7 Pages, XP033300513, From p. 1 "Abstract" to p. 3 end of section II.C "Single User Massive MIMO transmission"; figure 2.

(Continued)

*Primary Examiner* — James M Perez
(74) *Attorney, Agent, or Firm* — Harrity & Harrity, LLP

(57) ABSTRACT

Various aspects of the present disclosure generally relate to wireless communication. In some aspects, a transmitter may generate multiple encoded bits using a polar encoder. The transmitter may separate the multiple encoded bits into N layers for a multiple-input-multiple-output (MIMO) transmission. The transmitter may select V layer pairs from the N layers, each layer pair of the V layer pairs including a respective first layer and a respective second layer from the N layers. The transmitter may group, for each layer pair of the V layer pairs, a first M symbol bits of the respective first layer and a second M symbol bits of the respective second layer to generate multiple bit pairs. Each bit pair includes a respective first bit of the first M symbol bits and a respective second bit of the second M symbol bits. Numerous other aspects are described.

30 Claims, 13 Drawing Sheets

800 —

810 ~ Generate multiple encoded bits of a data stream using a polar encoder

820 ~ Separate the multiple encoded bits into N layers for a multiple-input-multiple-output (MIMO) transmission, N being a first integer that is even and greater than zero, the separating being based at least in part on a symbol length of M bits per symbol, M being a second integer 830 ~ Select V layer pairs from the N layers, each layer pair of the V layer pairs including a respective first layer and a respective second layer from the N layers, V being a third integer 840 ~ Group, for each layer pair of the V layer pairs, a first M symbol bits of the respective first layer and a second M symbol bits of the respective second layer of the layer pair to generate a MIMO input bit sequence that includes multiple bit pairs, and each bit pair of the multiple bit pairs includes a respective first bit of the first M symbol bits of the respective first layer and a respective second bit of the second M symbol bits of the respective second layer 850 ~ Transmit the MIMO transmission using the MIMO input bit sequence

(56)                References Cited

U.S. PATENT DOCUMENTS

| | | | | |
|---|---|---|---|---|
| 11,228,394 B2 * | 1/2022 | Chen | H04L 1/0042 | |
| 11,362,676 B2 * | 6/2022 | Wang | H03M 13/616 | |
| 11,362,769 B2 * | 6/2022 | Xu | H04J 11/00 | |
| 11,411,581 B2 * | 8/2022 | Richardson | H04L 1/0057 | |
| 11,570,654 B2 * | 1/2023 | Yang | H04L 1/0002 | |
| 11,632,273 B1 * | 4/2023 | Rezk | H04B 7/0439 | 375/267 |
| 11,784,749 B2 * | 10/2023 | Koken | H03M 13/13 | 714/726 |
| 11,916,571 B2 * | 2/2024 | Richardson | H03M 13/616 | |
| 12,052,201 B2 * | 7/2024 | Paz | H04L 1/0026 | |
| 12,224,857 B2 * | 2/2025 | Berger | H04L 1/0057 | |
| 12,244,417 B2 * | 3/2025 | Shellhammer | H04L 1/0068 | |
| 12,432,009 B2 * | 9/2025 | Kim | G06N 3/0464 | |
| 2006/0002486 A1 * | 1/2006 | van Nee | H03M 13/2757 | 375/260 |
| 2007/0211822 A1 * | 9/2007 | Olesen | H04L 1/0625 | 375/299 |
| 2007/0223618 A1 * | 9/2007 | Jeong | H04L 1/007 | 375/267 |
| 2008/0069262 A1 * | 3/2008 | Prasad | H04L 25/03993 | 375/267 |
| 2008/0225974 A1 * | 9/2008 | Prasad | H04L 25/03203 | 375/262 |
| 2010/0208680 A1 * | 8/2010 | Nam | H04L 5/0023 | 370/329 |
| 2011/0033001 A1 * | 2/2011 | Roh | H04L 1/0009 | 375/260 |
| 2012/0219097 A1 * | 8/2012 | McCloud | H04L 25/03242 | 375/341 |
| 2013/0329830 A1 * | 12/2013 | Yokomakura | H04L 1/0071 | 375/295 |
| 2015/0180682 A1 * | 6/2015 | Paker | H04L 25/0328 | 375/232 |
| 2017/0264351 A1 * | 9/2017 | Lomayev | H04L 5/0094 | |
| 2018/0076831 A1 * | 3/2018 | Hamelin | H03M 13/617 | |
| 2018/0331699 A1 * | 11/2018 | Lin | H04L 1/0072 | |
| 2019/0013827 A1 * | 1/2019 | Richardson | H04L 1/0069 | |
| 2019/0036642 A1 * | 1/2019 | Huang | H04B 7/068 | |
| 2019/0044544 A1 * | 2/2019 | Liao | H04L 1/0057 | |
| 2019/0123860 A1 * | 4/2019 | Xu | H03M 13/13 | |
| 2020/0358555 A1 * | 11/2020 | Chen | H04L 1/0042 | |
| 2021/0013902 A1 * | 1/2021 | Jang | H03M 13/13 | |
| 2021/0203450 A1 * | 7/2021 | Xu | H04L 1/1819 | |
| 2023/0139174 A1 * | 5/2023 | Paz | H04B 7/12 | 370/329 |
| 2023/0179327 A1 * | 6/2023 | Kim | G06N 3/04 | 370/328 |
| 2023/0261785 A1 * | 8/2023 | Koken | H04L 1/0041 | 714/726 |
| 2023/0336274 A1 * | 10/2023 | Perotti | H04L 1/0057 | |
| 2023/0379080 A1 * | 11/2023 | Berger | H03M 13/356 | |
| 2024/0014925 A1 * | 1/2024 | Li | H03M 13/13 | |
| 2024/0014931 A1 * | 1/2024 | Lee | H04L 1/0041 | |
| 2025/0141601 A1 * | 5/2025 | Jassal | H04L 1/0079 | |
| 2025/0357975 A1 * | 11/2025 | Berger | H04B 7/0473 | |

OTHER PUBLICATIONS

International Search Report and Written Opinion—PCT/US2025/051086—ISA/EPO—Jun. 9, 2026.
Qin K., et al., "Convolutional Polar Coded Modulation", IEEE Communications Letters, IEEE Service Center, Piscataway, NJ, US, vol. 24, No. 11, Jul. 14, 2020, pp. 2396-2400, XP011819405, From p. 2396 "Abstract" to p. 2397 end of section II "System Model" figures 1, 2, 3, 4.

* cited by examiner

800

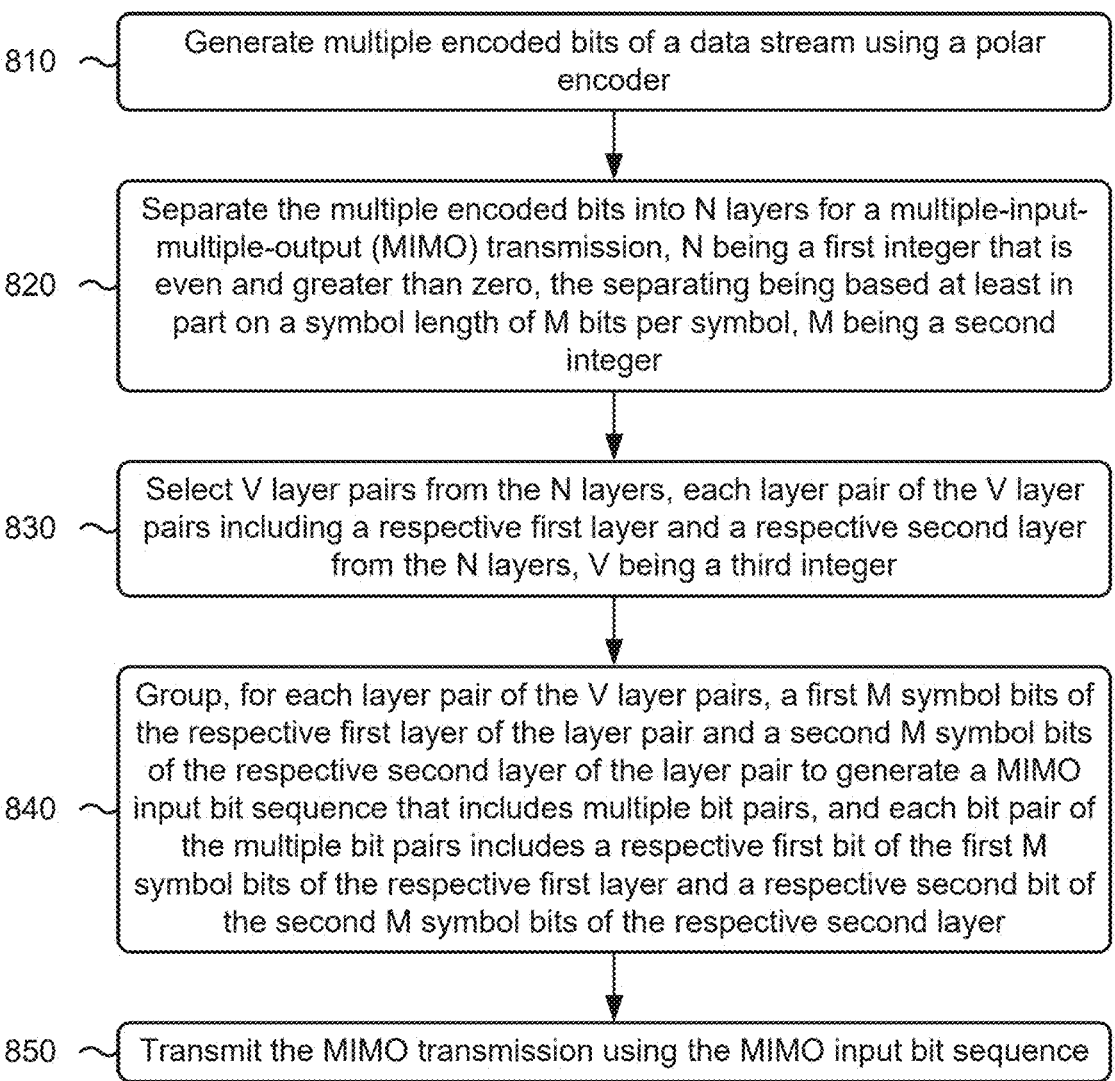

810 ⌐ Generate multiple encoded bits of a data stream using a polar encoder

820 ⌐ Separate the multiple encoded bits into N layers for a multiple-input-multiple-output (MIMO) transmission, N being a first integer that is even and greater than zero, the separating being based at least in part on a symbol length of M bits per symbol, M being a second integer 830 ⌐ Select V layer pairs from the N layers, each layer pair of the V layer pairs including a respective first layer and a respective second layer from the N layers, V being a third integer 840 ⌐ Group, for each layer pair of the V layer pairs, a first M symbol bits of the respective first layer of the layer pair and a second M symbol bits of the respective second layer of the layer pair to generate a MIMO input bit sequence that includes multiple bit pairs, and each bit pair of the multiple bit pairs includes a respective first bit of the first M symbol bits of the respective first layer and a respective second bit of the second M symbol bits of the respective second layer 850 ⌐ Transmit the MIMO transmission using the MIMO input bit sequence

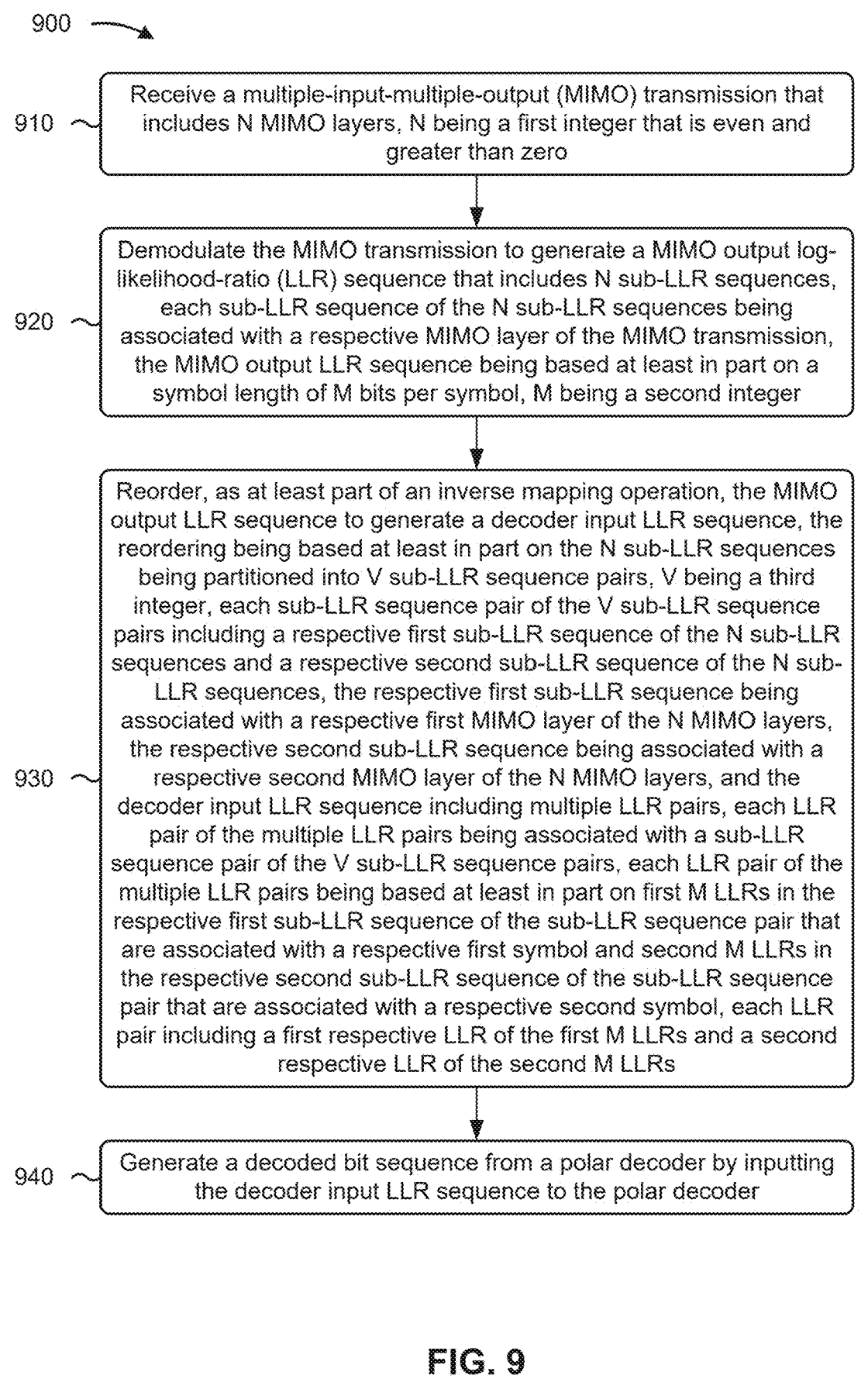

910 — Receive a multiple-input-multiple-output (MIMO) transmission that includes N MIMO layers, N being a first integer that is even and greater than zero 920 — Demodulate the MIMO transmission to generate a MIMO output log-likelihood-ratio (LLR) sequence that includes N sub-LLR sequences, each sub-LLR sequence of the N sub-LLR sequences being associated with a respective MIMO layer of the MIMO transmission, the MIMO output LLR sequence being based at least in part on a symbol length of M bits per symbol, M being a second integer 930 — Reorder, as at least part of an inverse mapping operation, the MIMO output LLR sequence to generate a decoder input LLR sequence, the reordering being based at least in part on the N sub-LLR sequences being partitioned into V sub-LLR sequence pairs, V being a third integer, each sub-LLR sequence pair of the V sub-LLR sequence pairs including a respective first sub-LLR sequence of the N sub-LLR sequences and a respective second sub-LLR sequence of the N sub-LLR sequences, the respective first sub-LLR sequence being associated with a respective first MIMO layer of the N MIMO layers, the respective second sub-LLR sequence being associated with a respective second MIMO layer of the N MIMO layers, and the decoder input LLR sequence including multiple LLR pairs, each LLR pair of the multiple LLR pairs being associated with a sub-LLR sequence pair of the V sub-LLR sequence pairs, each LLR pair of the multiple LLR pairs being based at least in part on first M LLRs in the respective first sub-LLR sequence of the sub-LLR sequence pair that are associated with a respective first symbol and second M LLRs in the respective second sub-LLR sequence of the sub-LLR sequence pair that are associated with a respective second symbol, each LLR pair including a first respective LLR of the first M LLRs and a second respective LLR of the second M LLRs 940 — Generate a decoded bit sequence from a polar decoder by inputting the decoder input LLR sequence to the polar decoder

FIG. 9

GROUPING LOG-LIKELIHOOD-RATIOS DIFFERENT MULTIPLE-INPUT-MULTIPLE-OUTPUT LAYERS FOR POLAR DECODING

FIELD OF THE DISCLOSURE

Aspects of the present disclosure generally relate to wireless communication and specifically relate to techniques, apparatuses, and methods associated with grouping log-likelihood-ratios from different multiple-input-multiple-output layers for polar decoding.

BACKGROUND

Wireless communication systems are widely deployed to provide various services, which may involve carrying or supporting voice, text, other messaging, video, data, and/or other traffic. Typical wireless communication systems may employ multiple-access radio access technologies (RATs) capable of supporting communication among multiple wireless communication devices including user devices or other devices by sharing the available system resources (for example, time domain resources, frequency domain resources, spatial domain resources, and/or device transmit power, among other examples). Such multiple-access RATs are supported by technological advancements that have been adopted in various telecommunication standards, which define common protocols that enable different wireless communication devices to communicate on a local, munici-pal, national, regional, or global level.

An example telecommunication standard is New Radio (NR). NR, which may also be referred to as 5G, is part of a continuous mobile broadband evolution promulgated by the Third Generation Partnership Project (3GPP). NR (and other RATs beyond NR) may be designed to better support enhanced mobile broadband (eMBB) access, Internet of things (IoT) networks or reduced capability device deploy-ments, and ultra-reliable low latency communication (URLLC) applications. To support these verticals, NR sys-tems may be designed to implement a modularized func-tional infrastructure, a disaggregated and service-based net-work architecture, network function virtualization, network slicing, multi-access edge computing, millimeter wave (mmWave) technologies including massive multiple-input multiple-output (MIMO), licensed and unlicensed spectrum access, non-terrestrial network (NTN) deployments, sidelink and other device-to-device direct communication technolo-gies (for example, cellular vehicle-to-everything (CV2X) communication), multiple-subscriber implementations, high-precision positioning, and/or radio frequency (RF) sensing, among other examples. As the demand for connec-tivity continues to increase, further improvements in NR may be implemented, and other RATs, such as 6G and beyond, may be introduced to enable new applications and facilitate new use cases.

A wireless communication channel may introduce errors in communications due to random noise, interference, device impairments, and other factors. These errors may corrupt such communications at a receiver. Some wireless communications may be encoded using polar coding to improve resilience to non-ideal channel conditions. "Chan-nel splitting" denotes the process of creating reliable sub-channels and unreliable subchannels (e.g., synthetic chan-nels) that are used for channel polarization in polar encoding, and a polarization metric may indicate a degree of polarization between the reliable subchannels and the unreliable subchannels. That is, a polarization metric may indi-cate how distinguishable a reliable subchannel is from an unreliable subchannel and/or a probability of recovery errors at a receiver.

SUMMARY

Some aspects described herein relate to a method of wireless communication performed by a transmitter. The method may include generating multiple encoded bits of a data stream using a polar encoder. The method may include separating the multiple encoded bits into N layers for a multiple-input-multiple-output (MIMO) transmission, N being a first integer that is even and greater than zero, the separating being based at least in part on a symbol length of M bits per symbol, M being a second integer. The method may include selecting V layer pairs from the N layers, each layer pair of the V layer pairs including a respective first layer and a respective second layer from the N layers, V being a third integer. The method may include grouping, for each layer pair of the V layer pairs, a first M symbol bits of the respective first layer of the layer pair and a second M symbol bits of the respective second layer of the layer pair to generate a MIMO input bit sequence that includes mul-tiple bit pairs, and each bit pair of the multiple bit pairs includes a respective first bit of the first M symbol bits of the respective first layer and a respective second bit of the second M symbol bits of the respective second layer. That is, the method may include reordering the first M symbol bits and the second M symbol bits to generate multiple bit pairs that include a respective first bit associated with the respec-tive first layer and a respective second bit associated with the respective second layer. The method may include transmit-ting the MIMO transmission using the MIMO input bit sequence.

Some aspects described herein relate to a method of wireless communication performed by a receiver. The method may include receiving a MIMO transmission that includes N MIMO layers, N being a first integer that is even and greater than zero. The method may include demodulat-ing the MIMO transmission to generate a MIMO output log-likelihood-ratio (LLR) sequence that includes N sub-LLR sequences, where each sub-LLR sequence of the N sub-LLR sequences is associated with a respective MIMO layer of the MIMO transmission. The MIMO output LLR sequence may be based at least in part on a symbol length of M bits per symbol, M being a second integer. The method may include reordering, as at least part of an inverse mapping operation, the MIMO output LLR sequence to generate a decoder input LLR sequence. In some aspects, the reordering may be based at least in part on the N sub-LLR sequences being partitioned into V sub-LLR sequence pairs, V being a third integer. Each sub-LLR sequence pair of the V sub-LLR sequence pairs may include a respective first sub-LLR sequence of the N sub-LLR sequences and a respective second sub-LLR sequence of the N sub-LLR sequences, where the respective first sub-LLR sequence is associated with a respective first MIMO layer of the N MIMO layers and the respective second sub-LLR sequence is associated with a respective second MIMO layer of the N MIMO layers. The decoder input LLR sequence generated based at least in part on the reordering may include multiple LLR pairs, where each LLR pair of the multiple LLR pairs is associated with a sub-LLR sequence pair of the V sub-LLR sequence pairs. Alternatively, or additionally, each LLR pair of the multiple LLR pairs is based at least in part on first M LLRs in the respective first sub-LLR sequence of the sub-LLR sequence pair that are associated with a respective first symbol and second M LLRs in the respective second sub-LLR sequence of the sub-LLR sequence pair that are associated with a respective second symbol. The reordering may generate the decoder input LLR sequence such that each LLR pair includes a first respective LLR of the first M LLRs and a second respective LLR of the second M LLRs. The method may include generating a decoded bit sequence from a polar decoder by inputting the decoder input LLR sequence to the polar decoder.

Some aspects described herein relate to an apparatus for wireless communication at a transmitter. The apparatus may include one or more memories and one or more processors coupled to the one or more memories. The one or more processors may be configured to generate multiple encoded bits of a data stream using a polar encoder. The one or more processors may be configured to separate the multiple encoded bits into N layers for a MIMO transmission, N being a first integer that is even and greater than zero, the separating being based at least in part on a symbol length of M bits per symbol, M being a second integer. The one or more processors may be configured to select V layer pairs from the N layers, each layer pair of the V layer pairs including a respective first layer and a respective second layer from the N layers, V being a third integer. The one or more processors may be configured to group, for each layer pair of the V layer pairs, a first M symbol bits of the respective first layer of the layer pair and a second M symbol bits of the respective second layer of the layer pair to generate a MIMO input bit sequence that includes multiple bit pairs, and each bit pair of the multiple bit pairs includes a respective first bit of the first M symbol bits of the respective first layer and a respective second bit of the second M symbol bits of the respective second layer. For instance, the one or more processors may be configured to reorder the first M symbol bits and the second M symbol bits to generate multiple bit pairs that include a respective first bit associated with the respective first layer and a respective second bit associated with the respective second layer. The one or more processors may be configured to transmit the MIMO transmission using the MIMO input bit sequence.

Some aspects described herein relate to an apparatus for wireless communication at a receiver. The apparatus may include one or more memories and one or more processors coupled to the one or more memories. The one or more processors may be configured to receive a MIMO transmission that includes N MIMO layers, N being a first integer that is even and greater than zero. The one or more processors may be configured to demodulate the MIMO transmission to generate a MIMO output LLR sequence that includes N sub-LLR sequences, where each sub-LLR sequence of the N sub-LLR sequences is associated with a respective MIMO layer of the MIMO transmission. The MIMO output LLR sequence may be based at least in part on a symbol length of M bits per symbol, M being a second integer. The one or more processors may be configured to reorder, as at least part of an inverse mapping operation, the MIMO output LLR sequence to generate a decoder input LLR sequence. In some aspects, the one or more processors may be configured to reorder the MIMO output LLR sequence based at least in part on the N sub-LLR sequences being partitioned into V sub-LLR sequence pairs, V being a third integer. Each sub-LLR sequence pair of the V sub-LLR sequence pairs may include a respective first sub-LLR sequence of the N sub-LLR sequences and a respective second sub-LLR sequence of the N sub-LLR sequences, where the respective first sub-LLR sequence is associated with a respective first MIMO layer of the N MIMO layers and the respective second sub-LLR sequence is associated with a respective second MIMO layer of the N MIMO layers. The one or more processors may be configured to reorder the MIMO output LLR sequence such that the decoder input LLR sequence includes multiple LLR pairs, where each LLR pair of the multiple LLR pairs is associated with a sub-LLR sequence pair of the V sub-LLR sequence pairs. Alternatively, or additionally, each LLR pair of the multiple LLR pairs is based at least in part on first M LLRs in the respective first sub-LLR sequence of the sub-LLR sequence pair that are associated with a respective first symbol and second M LLRs in the respective second sub-LLR sequence of the sub-LLR sequence pair that are associated with a respective second symbol. Each LLR pair may include a first respective LLR of the first M LLRs and a second respective LLR of the second M LLRs. The one or more processors may be configured to generate a decoded bit sequence from a polar decoder by inputting the decoder input LLR sequence to the polar decoder.

Some aspects described herein relate to a non-transitory computer-readable medium that stores a set of instructions for wireless communication by a transmitter. The set of instructions, when executed by one or more processors of the transmitter, may cause the transmitter to generate multiple encoded bits of a data stream using a polar encoder. The set of instructions, when executed by one or more processors of the transmitter, may cause the transmitter to separate the multiple encoded bits into N layers for a MIMO transmission, N being a first integer that is even and greater than zero, the separating being based at least in part on a symbol length of M bits per symbol, M being a second integer. The set of instructions, when executed by one or more processors of the transmitter, may cause the transmitter to select V layer pairs from the N layers, each layer pair of the V layer pairs including a respective first layer and a respective second layer from the N layers, V being a third integer. The set of instructions, when executed by one or more processors of the transmitter, may cause the transmitter to group, for each layer pair of the V layer pairs, a first M symbol bits of the respective first layer of the layer pair and a second M symbol bits of the respective second layer of the layer pair to generate a MIMO input bit sequence that includes multiple bit pairs, and each bit pair of the multiple bit pairs includes a respective first bit of the first M symbol bits of the respective first layer and a respective second bit of the second M symbol bits of the respective second layer. For example, the set of instructions, when executed by one or more processors of the transmitter, may reorder the first M symbol bits and the second M symbol bits to generate multiple bit pairs that include a respective first bit associated with the respective first layer and a respective second bit associated with the respective second layer. The set of instructions, when executed by one or more processors of the transmitter, may cause the transmitter to transmit the MIMO transmission using the MIMO input bit sequence.

Some aspects described herein relate to a non-transitory computer-readable medium that stores a set of instructions for wireless communication by a receiver. The set of instructions, when executed by one or more processors of the receiver, may cause the receiver to receive a MIMO transmission that includes N MIMO layers, N being a first integer that is even and greater than zero. The set of instructions, when executed by one or more processors of the receiver, may cause the receiver to demodulate the MIMO transmission to generate a MIMO output LLR sequence that includes N sub-LLR sequences, each sub-LLR sequence of the N sub-LLR sequences being associated with a respective MIMO layer of the MIMO transmission, the MIMO output LLR sequence being based at least in part on a symbol length of M bits per symbol, M being a second integer. The set of instructions, when executed by one or more processors of the receiver, may cause the receiver to reorder, as at least part of an inverse mapping operation, the MIMO output LLR sequence to generate a decoder input LLR sequence, the reordering being based at least in part on, the N sub-LLR sequences being partitioned into V sub-LLR sequence pairs, V being a third integer, each sub-LLR sequence pair of the V sub-LLR sequence pairs including a respective first sub-LLR sequence of the N sub-LLR sequences and a respective second sub-LLR sequence of the N sub-LLR sequences, the respective first sub-LLR sequence being associated with a respective first MIMO layer of the N MIMO layers, the respective second sub-LLR sequence being associated with a respective second MIMO layer of the N MIMO layers, and the decoder input LLR sequence including multiple LLR pairs, each LLR pair of the multiple LLR pairs being associated with a sub-LLR sequence pair of the V sub-LLR sequence pairs, each LLR pair of the multiple LLR pairs being based at least in part on first M LLRs in the respective first sub-LLR sequence of the sub-LLR sequence pair that are associated with a respective first symbol and second M LLRs in the respective second sub-LLR sequence of the sub-LLR sequence pair that are associated with a respective second symbol, each LLR pair including a first respective LLR of the first M LLRs and a second respective LLR of the second M LLRs. The set of instructions, when executed by one or more processors of the receiver, may cause the receiver to generate a decoded bit sequence from a polar decoder by inputting the decoder input LLR sequence to the polar decoder.

Some aspects described herein relate to an apparatus for wireless communication. The apparatus may include means for generating multiple encoded bits of a data stream using a polar encoder. The apparatus may include means for separating the multiple encoded bits into N layers for a MIMO transmission, N being a first integer that is even and greater than zero, the separating being based at least in part on a symbol length of M bits per symbol, M being a second integer. The apparatus may include means for selecting V layer pairs from the N layers, each layer pair of the V layer pairs including a respective first layer and a respective second layer from the N layers, V being a third integer. The apparatus may include means for grouping, for each layer pair of the V layer pairs, a first M symbol bits of the respective first layer of the layer pair and a second M symbol bits of the respective second layer of the layer pair to generate a MIMO input bit sequence that includes multiple bit pairs, and each bit pair of the multiple bit pairs includes a respective first bit of the first M symbol bits of the respective first layer and a respective second bit of the second M symbol bits of the respective second layer. To illustrate, the means for grouping may include means for reordering the first M symbol bits and the second M symbol bits to generate multiple bit pairs that include a respective first bit associated with the respective first layer and a respective second bit associated with the respective second layer. The apparatus may include means for transmitting the MIMO transmission using the MIMO input bit sequence.

Some aspects described herein relate to an apparatus for wireless communication. The apparatus may include means for receiving a MIMO transmission that includes N MIMO layers, N being a first integer that is even and greater than zero. The apparatus may include means for demodulating the MIMO transmission to generate a MIMO output LLR sequence that includes N sub-LLR sequences, each sub-LLR sequence of the N sub-LLR sequences being associated with a respective MIMO layer of the MIMO transmission, the MIMO output LLR sequence being based at least in part on a symbol length of M bits per symbol, M being a second integer. The apparatus may include means for reordering, as at least part of an inverse mapping operation, the MIMO output LLR sequence to generate a decoder input LLR sequence, the reordering being based at least in part on, the N sub-LLR sequences being partitioned into V sub-LLR sequence pairs, V being a third integer, each sub-LLR sequence pair of the V sub-LLR sequence pairs including a respective first sub-LLR sequence of the N sub-LLR sequences and a respective second sub-LLR sequence of the N sub-LLR sequences, the respective first sub-LLR sequence being associated with a respective first MIMO layer of the N MIMO layers, the respective second sub-LLR sequence being associated with a respective second MIMO layer of the N MIMO layers, and the decoder input LLR sequence including multiple LLR pairs, each LLR pair of the multiple LLR pairs being associated with a sub-LLR sequence pair of the V sub-LLR sequence pairs, each LLR pair of the multiple LLR pairs being based at least in part on first M LLRs in the respective first sub-LLR sequence of the sub-LLR sequence pair that are associated with a respective first symbol and second M LLRs in the respective second sub-LLR sequence of the sub-LLR sequence pair that are associated with a respective second symbol, each LLR pair including a first respective LLR of the first M LLRs and a second respective LLR of the second M LLRs. The apparatus may include means for generating a decoded bit sequence from a polar decoder by inputting the decoder input LLR sequence to the polar decoder.

Aspects of the present disclosure may generally be implemented by or as a method, apparatus, system, computer program product, non-transitory computer-readable medium, user equipment, base station, network node, network entity, wireless communication device, and/or processing system as substantially described with reference to, and as illustrated by, this specification and accompanying drawings.

The foregoing paragraphs of this section have broadly summarized some aspects of the present disclosure. These and additional aspects and associated advantages will be described hereinafter. The disclosed aspects may be used as a basis for modifying or designing other aspects for carrying out the same or similar purposes of the present disclosure. Such equivalent aspects do not depart from the scope of the appended claims. Characteristics of the aspects disclosed herein, both their organization and method of operation, together with associated advantages, will be better understood from the following description when considered in connection with the accompanying drawings.

BRIEF DESCRIPTION OF THE DRAWINGS

The appended drawings illustrate some aspects of the present disclosure but are not limiting of the scope of the present disclosure because the description may enable other aspects. Each of the drawings is provided for purposes of illustration and description, and not as a definition of the limits of the claims. The same or similar reference numbers in different drawings may identify the same or similar elements.

FIG. 8 is a diagram illustrating an example process performed, for example, at a transmitter or an apparatus of a transmitter, in accordance with the present disclosure.

FIG. 9 is a diagram illustrating an example process performed, for example, at a receiver or an apparatus of a receiver, in accordance with the present disclosure.

DETAILED DESCRIPTION

Figure 1:
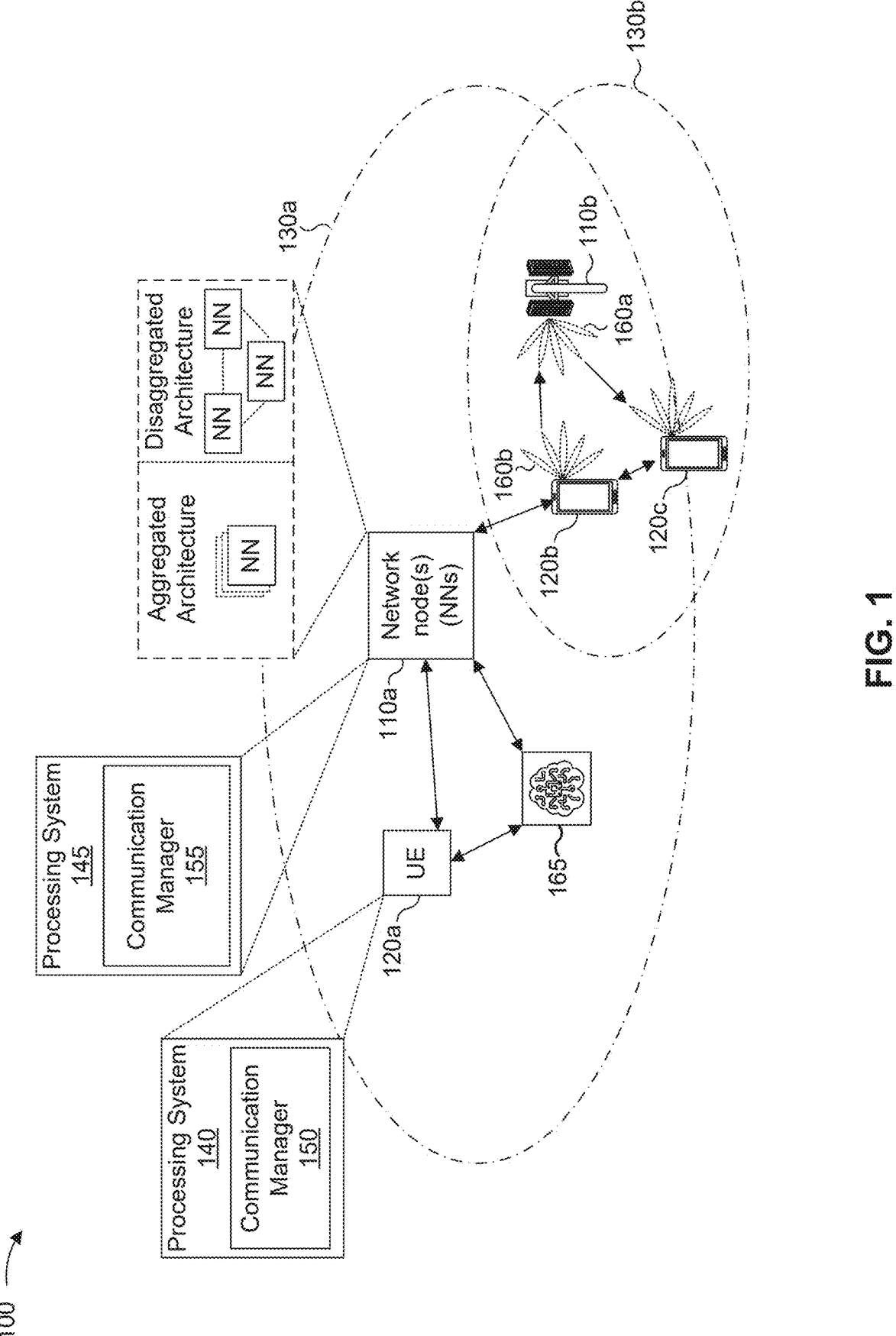
FIG. 1 is a diagram illustrating an example of a wireless communication network, in accordance with the present disclosure.

Various aspects of the present disclosure are described hereinafter with reference to the accompanying drawings. However, aspects of the present disclosure may be embodied in many different forms. The present disclosure is not to be construed as limited to any specific aspect illustrated by or described with reference to an accompanying drawing or otherwise presented in this disclosure. Rather, these aspects are provided so that this disclosure will be thorough and complete, and will fully convey the scope of the disclosure to those skilled in the art. One skilled in the art may appreciate that the scope of the disclosure is intended to cover any aspect of the disclosure disclosed herein, whether implemented independently of or in combination with any other aspect of the disclosure. For example, an apparatus may be implemented or a method may be practiced using various combinations or quantities of the aspects set forth herein. In addition, the scope of the disclosure is intended to cover an apparatus having, or a method that is practiced using, other structures and/or functionalities in addition to or other than the structures and/or functionalities with which various aspects of the disclosure set forth herein may be practiced. Any aspect of the disclosure disclosed herein may be embodied by one or more elements of a claim.

Several aspects of telecommunication systems will now be presented with reference to various methods, operations, apparatuses, and techniques. These methods, operations, apparatuses, and techniques will be described in the following detailed description and illustrated in the accompanying drawings by various blocks, modules, components, circuits, steps, processes, or algorithms (collectively referred to as "elements"). These elements may be implemented using hardware, software, or a combination of hardware and software. Whether such elements are implemented as hardware or software depends upon the particular application and design constraints imposed on the overall system.

A wireless communication channel may introduce errors in communications due to random noise, interference, device impairments, and other factors. These errors may corrupt such communications at a receiver. Some wireless communications may be encoded using polar coding to improve resilience to non-ideal channel conditions. "Channel splitting" denotes the process of creating reliable subchannels and unreliable subchannels (e.g., synthetic channels) that are used for channel polarization in polar encoding, and a polarization metric may indicate a degree of polarization between the reliable subchannels and the unreliable subchannels. That is, a polarization metric may indicate how distinguishable a reliable subchannel is from an unreliable subchannel.

Alternatively, or additionally, some wireless communications are configured as a multiple-input-multiple-output (MIMO) communication to increase data throughput. A MIMO communication may transmit user data and/or information bits over parallel streams (e.g., spatial streams via respective beams), that may also be referred to as layers. For instance, a two (2)-layer MIMO communication may include two parallel spatial streams that carry respective user data streams that are independent from one another, or carry portions of a (same) user data stream.

A polar decoder at a receiver may be configured to process pairs of log-likelihood ratios (LLRs) based at least in part on recursive operations that are associated with the synthetic channels and the polarization of the synthetic channels. To illustrate, processing pairs of LLRs in a recursive decoding process may enable the polar decoder to leverage the polarization of the synthetic channels to refine bit decisions efficiently using fewer computations and/or less processing time. Alternatively, or additionally, as at least part of the recursive decoding process, the polar decoder may combine the LLRs included in a respective LLR pair at one or more stages to make an intermediate bit determination and/or to refine a bit determination.

A magnitude difference of the LLRs in an LLR pair may affect how reliably the polar decoder estimates and/or decodes information bits. For instance, LLRs with similar magnitudes (e.g., within a difference threshold) may result in the polar decoder having less certainty in a bit decision, which may lead to less reliable bit estimations and/or increased bit recovery errors. Increased bit recovery errors may lead to reduced data throughput, increased data transfer delays, and/or data loss in a wireless network. To illustrate, increased bit recovery errors may increase a quantity of retransmission requests, leading to longer data transfer delays for completion of a data transfer and/or increased air interface resource consumption for the data transfer.

Various aspects relate generally to grouping LLRs from different MIMO layers for polar decoding. Some aspects more specifically relate to applying mapping at a transmitter, and inverse mapping at a receiver, that collectively generate an LLR pair as an input of a polar decoder, where the LLR pair includes a first LLR that is associated with a first MIMO layer and a second LLR that is associated with a second MIMO layer. In some aspects, a transmitter may generate multiple encoded bits of a data stream using a polar encoder. The transmitter may separate the multiple encoded bits into N layers for a MIMO transmission. The separating may be based at least in part on N being a first integer that is even and greater than zero and a symbol length of M bits per symbol, M being a second integer. The transmitter may select V layer pairs (V being a third integer) from the N layers, where each layer pair of the V layer pairs includes a respective first layer and a respective second layer from the N layers. In some aspects, the transmitter may group, for each layer pair of the V layer pairs, a first M symbol bits of the respective first layer of the layer pair and a second M symbol bits of the respective second layer of the layer pair to generate a MIMO input bit sequence that includes multiple bit pairs. To group the first M symbol bits and the second M symbol bits, the transmitter may order and/or reorder the bits such that each bit pair includes a respective first bit of the first M symbol bits of the respective first layer and a respective second bit of the second M symbol bits of the respective second layer. The transmitter may transmit the MIMO transmission using the MIMO input bit sequence.

Alternatively, or additionally, a receiver may receive a MIMO transmission that includes N layers. As described above, N may be a first integer that is even and greater than zero. The receiver may demodulate the MIMO transmission to generate a MIMO output LLR sequence. In some aspects, the LLR sequence may be based at least in part on a symbol length of M bits per symbol (M being a second integer). The receiver may reorder the MIMO output LLR sequence as at least part of an inverse mapping operation, where the inverse mapping operation may generate a decoder input LLR sequence. In some aspects, the reordering may be based at least in part on the N layers being partitioned into V layer pairs (V being a third integer). Each layer pair of the V layer pairs may include a respective first layer and a respective second layer of the N layers. Alternatively, or additionally, the reordering may be based at least in part on the MIMO output LLR sequence including multiple LLR pairs, where each LLR pair of the multiple LLR pairs is associated with a layer pair of the V layer pairs. In some aspects, each LLR pair of the multiple LLR pairs is based at least in part on a first M LLRs in the MIMO output LLR sequence that are associated with a respective first symbol of the respective first layer and a second M LLRs in the MIMO output LLR sequence that are associated with a respective second symbol of the respective second layer. Alternatively, or additionally, each LLR pair includes a first respective LLR of the first M LLRs and a second respective LLR of the second M LLRs. The receiver may generate a decoded bit sequence from a polar decoder by inputting the decoder input LLR sequence to the polar decoder.

Particular aspects of the subject matter described in this disclosure can be implemented to realize one or more of the following potential advantages. In some examples, by grouping LLRs from different MIMO layers in an LLR pair, the described techniques can be used to increase an LLR magnitude difference between the LLRs in the LLR pair and, consequently, increase a confidence in bit decoding at a polar decoder. To illustrate, in statistical terms and on average, the magnitudes of LLRs from different MIMO layers are more likely to have a larger difference than LLRs from the same MIMO layer. Increasing a confidence of bit decoding at a polar decoder may reduce bit decoding errors, increase data throughput, and/or decrease data transfer latencies.

As described above, wireless communication systems may be deployed to provide various services, which may involve carrying or supporting voice, text, other messaging, video, data, and/or other traffic. Some wireless communications systems may employ multiple-access radio access technologies (RATs). The multiple-access RATs may be capable of supporting communication with multiple wireless communication devices by sharing the available system resources (for example, time domain resources, frequency domain resources, spatial domain resources, and/or device transmit power, among other examples). Examples of such multiple-access RATs include code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, and time division synchronous code division multiple access (TD-SCDMA) systems.

Multiple-access RATs are supported by technological advancements that have been adopted in various telecommunication standards, which define common protocols that enable wireless communication devices to communicate on a local, municipal, enterprise, national, regional, or global level. For example, 5G New Radio (NR) is part of a continuous mobile broadband evolution promulgated by the Third Generation Partnership Project (3GPP). 5G NR may support enhanced mobile broadband (eMBB) access, Internet of Things (IoT) networks or reduced capability (RedCap) device deployments, ultra-reliable low-latency communication (URLLC) applications, and/or massive machine-type communication (mMTC), among other examples.

To support these and other target verticals, a wireless communication system may be designed to implement a modularized functional infrastructure, a disaggregated and service-based network architecture, network function virtualization, network slicing, multi-access edge computing, millimeter wave (mmWave) technologies including massive multiple-input multiple-output (MIMO), beamforming, IoT device or RedCap device connectivity and management, industrial connectivity, licensed and unlicensed spectrum access, sidelink and other device-to-device direct communication (for example, cellular vehicle-to-everything (CV2X) communication), frequency spectrum expansion, overlapping spectrum use, small cell deployments, non-terrestrial network (NTN) deployments, device aggregation, advanced duplex communication (for example, sub-band full-duplex (SBFD)), multiple-subscriber implementations, high-precision positioning, radio frequency (RF) sensing, network energy savings (NES), low-power signaling and radios, and/or artificial intelligence or machine learning (AI/ML), among other examples.

The foregoing and other technological improvements may support use cases, such as wireless fronthauls, wireless midhauls, wireless backhauls, wireless data centers, extended reality (XR) and metaverse applications, meta services for supporting vehicle connectivity, holographic and mixed reality communication, autonomous and collaborative robots, vehicle platooning and cooperative maneuvering, sensing networks, gesture monitoring, human-brain interfacing, digital twin applications, asset management, and universal coverage applications using non-terrestrial and/or aerial platforms, among other examples.

As the demand for connectivity continues to increase, further improvements in NR may be implemented, and other RATs, such as 6G and beyond, may be introduced to enable new applications and facilitate new use cases. The methods, operations, apparatuses, and techniques described herein may enable one or more of the foregoing technologies or new technologies and/or support one or more of the foregoing use cases or new use cases.

FIG. 1 is a diagram illustrating an example of a wireless communication network 100, in accordance with the present disclosure. The wireless communication network 100 may be or may include elements of a 5G (or NR) network or a 6G network, among other examples. The wireless communication network 100 may include multiple network nodes 110. For example, in FIG. 1, the wireless communication network 100 includes a network node (NN) 110a and a network node 110b. The network nodes 110 may support communications with a least one user equipment (UE) 120. For example, in FIG. 1, the network nodes 110 support communication with a UE 120a, a UE 120b, and a UE 120c. In some examples, a UE 120 may also communicate with other UEs 120 and a network node 110 may communicate with a core network and with other network nodes 110.

The network nodes 110 and the UEs 120 of the wireless communication network 100 may communicate using the electromagnetic spectrum, which may be subdivided by frequency or wavelength into various classes, bands, carriers, and/or channels. For example, devices of the wireless communication network 100 may communicate using one or more operating bands. In some aspects, multiple wireless communication networks 100 may be deployed in a given geographic area. Each wireless communication network 100 may support a particular RAT (which may also be referred to as an air interface) and may operate on one or more carrier frequencies in one or more frequency bands or ranges. In some examples, when multiple RATs are deployed in a given geographic area, each RAT in the geographic area may operate on different frequencies to avoid interference with other RATs. Additionally or alternatively, in some examples, the wireless communication network 100 may implement dynamic spectrum sharing (DSS), in which multiple RATs are implemented with dynamic bandwidth allocation (for example, based on user demand) in a single frequency band. In some examples, the wireless communication network 100 may support communication over unlicensed spectrum, where access to an unlicensed channel is subject to a channel access mechanism. For example, in a shared or unlicensed frequency band, a transmitting device may perform a channel access procedure, such as a listen-before-talk (LBT) procedure, to contend against other devices for channel access before transmitting on a shared or unlicensed channel.

Various operating bands have been defined as frequency range designations FR1 (410 MHz through 7.125 GHz), FR2 (24.25 GHz through 52.6 GHz), FR3 (7.125 GHz through 24.25 GHz), FR4a or FR4-1 (52.6 GHz through 71 GHz), FR4 (52.6 GHz through 114.25 GHz), and FR5 (114.25 GHz through 300 GHz). Although a portion of FR1 is greater than 6 GHz, FR1 is often referred to (interchangeably) as a "sub-6 GHz" band in some documents and articles. Similarly, FR2 is often referred to (interchangeably) as a "millimeter wave" band in some documents and articles, despite being different than the extremely high frequency (EHF) band (30 GHz through 300 GHz), which is identified by the International Telecommunications Union (ITU) as a "millimeter wave" band. The frequencies between FR1 and FR2 are often referred to as mid-band frequencies, which include FR3. Frequency bands falling within FR3 may inherit FR1 characteristics or FR2 characteristics, and thus may effectively extend features of FR1 or FR2 into the mid-band frequencies. Thus, "sub-6 GHz," if used herein, may broadly refer to frequencies that are less than 6 GHz, that are within FR1, and/or that are included in mid-band frequencies. Similarly, the term "millimeter wave," if used herein, may broadly refer to mid-band frequencies or to frequencies that are within FR2, FR4, FR4-a or FR4-1, FR5, and/or the EHF band. Higher frequency bands may extend 5G NR operation, 6G operation, and/or other RATs beyond 52.6 GHz.

A network node 110 and/or a UE 120 may include one or more devices, components, or systems that enable communication with other devices, components, or systems of the wireless communication network 100. For example, a UE 120 and a network node 110 may each include one or more chips, system-on-chips (SoCs), chipsets, packages, or devices that individually or collectively constitute or comprise a processing system, such as a processing system 140 of the UE 120 or a processing system 145 of the network node 110. A processing system (for example, the processing system 140 and/or the processing system 145) includes processor (or "processing") circuitry in the form of one or multiple processors, microprocessors, processing units (such as central processing units (CPUs), graphics processing units (GPUs), neural processing units (NPUs) (also referred to as neural network processors or deep learning processors (DLPs)), and/or digital signal processors (DSPs)), processing blocks, application-specific integrated circuits (ASICs), programmable logic devices (PLDs), or other discrete gate or transistor logic or circuitry (any one or more of which may be generally referred to herein individually as a "processor" or collectively as "the processor" or "the processor circuitry"). Such processors may be individually or collectively configurable or configured to perform various functions or operations described herein. A group of processors collectively configurable or configured to perform a set of functions may include a first processor configurable or configured to perform a first function of the set and a second processor configurable or configured to perform a second function of the set. In some other examples, each of a group of processors may be configurable or configured to perform a same set of functions.

The processing system 140 and the processing system 145 may each include memory circuitry in the form of one or multiple memory devices, memory blocks, memory elements, or other discrete gate or transistor logic or circuitry, each of which may include or implement tangible storage media such as random-access memory (RAM) or read-only memory (ROM), or combinations thereof (any one or more of which may be generally referred to herein individually as a "memory" or collectively as "the memory" or "the memory circuitry"). One or more of the memories may be coupled (for example, operatively coupled, communicatively coupled, electronically coupled, or electrically coupled) with one or more of the processors and may individually or collectively store processor-executable code or instructions (such as software) that, when executed by one or more of the processors, may configure one or more of the processors to perform various functions or operations described herein. Additionally or alternatively, in some examples, one or more of the processors may be configured to perform various functions or operations described herein without requiring configuration by software. "Software" shall be construed broadly to mean instructions, instruction sets, code, code segments, program code, programs, subprograms, software modules, applications, software applications, software packages, routines, subroutines, objects, executables, threads of execution, procedures, or functions, among other examples, whether referred to as software, firmware, middleware, microcode, hardware description language, or otherwise.

The processing system 140 and the processing system 145 may each include or be coupled with one or more modems (such as a cellular (for example, a 5G or 6G compliant) modem). In some examples, one or more processors of the processing system 140 and/or the processing system 145 include or implement one or more of the modems. The processing system 140 and the processing system 145 may also include or be coupled with multiple radios (collectively "the radio"), multiple RF chains, or multiple transceivers, each of which may in turn be coupled with one or more of multiple antennas. In some examples, one or more processors of the processing system 140 and/or the processing system 145 include or implement one or more of the radios, RF chains, or transceivers. An RF chain may include one or more filters, mixers, oscillators, amplifiers, analog-to-digital converters (ADCs), and/or other devices that convert between an analog signal (such as for transmission or reception via an air interface) and a digital signal (such as for processing by the processing system 140 of the UE 120 or by the processing system 145 of the network node 110).

A network node 110 and a UE 120 may each include one or multiple antennas or antenna arrays. Typical network nodes 110 and UEs 120 may include multiple antennas, which may be organized or structured into one or more antenna panels, one or more antenna groups, one or more sets of antenna elements, or one or more antenna arrays, among other examples. As used herein, the term "antenna" can refer to one or more antennas, one or more antenna panels, one or more antenna groups, one or more sets of antenna elements, or one or more antenna arrays. The term "antenna panel" can refer to a group of antennas (such as antenna elements) arranged in an array or panel, which may facilitate beamforming by manipulating parameters associated with the group of antennas. The term "antenna module" may refer to circuitry including one or more antennas as well as one or more other components (such as filters, amplifiers, or processors) associated with integrating the antenna module into a wireless communication device such as the network node 110 and the UE 120.

A network node 110 may be, may include, or may also be referred to as an NR network node, a 5G network node, a 6G network node, a Node B, a gNB, an access point (AP), a transmission reception point (TRP), a network entity, a network element, a network equipment, and/or another type of device, component, or system included in a radio access network (RAN). In various deployments, a network node 110 may be implemented as a single physical node (for example, a single physical structure) or may be implemented as two or more physical nodes (for example, two or more distinct physical structures). For example, a network node 110 may be a device or system that implements a part of a radio protocol stack, a device or system that implements a full radio protocol stack (such as a full gNB protocol stack), or a collection of devices or systems that collectively implement the full radio protocol stack. For example, and as shown, a network node 110 may be an aggregated network node having an aggregated architecture, meaning that the network node 110 may implement a full radio protocol stack that is physically and logically integrated within a single physical structure in the wireless communication network 100. For example, an aggregated network node 110 may consist of a single standalone base station or a single TRP that operates with a full radio protocol stack to enable or facilitate communication between a UE 120 and a core network of the wireless communication network 100.

Alternatively, and as also shown, a network node 110 may be a disaggregated network node (sometimes referred to as a disaggregated base station), having a disaggregated architecture, meaning that the network node 110 may operate with a radio protocol stack that is physically distributed and/or logically distributed among two or more nodes in the same geographic location or in different geographic locations. An example disaggregated network node architecture is described in more detail below with reference to FIG. 2. In some deployments, disaggregated network nodes 110 may be used in an integrated access and backhaul (IAB) network, in an open radio access network (O-RAN) (such as a network configuration in compliance with the O-RAN Alliance), or in a virtualized radio access network (vRAN), also known as a cloud radio access network (C-RAN), to facilitate scaling by separating network functionality into multiple units or modules that can be individually deployed.

The network nodes 110 of the wireless communication network 100 may include one or more central units (CUs), one or more distributed units (DUs), and one or more radio units (RUs). A CU may host one or more higher layers, such as a radio resource control (RRC) layer, a packet data convergence protocol (PDCP) layer, and a service data adaptation protocol (SDAP) layer, among other examples. A DU may host one or more of a radio link control (RLC) layer, a medium access control (MAC) layer, and/or one or more higher physical (PHY) layers depending, at least in part, on a functional split, such as a functional split defined by the 3GPP. In some examples, a DU also may host a lower PHY layer that is configured to perform functions, such as a fast Fourier transform (FFT), an inverse FFT (IFFT), beamforming, and/or physical random access channel (PRACH) extraction and filtering, among other examples. An RU may perform RF processing functions or lower PHY layer functions, such as an FFT, an IFFT, beamforming, or PRACH extraction and filtering, among other examples, according to a functional split, such as a lower layer split (LLS). In such an architecture, each RU can be operated to handle over the air (OTA) communication with one or more UEs 120. In some examples, a single network node 110 may include a combination of one or more CUs, one or more DUs, and/or one or more RUs. In some examples, a CU, a DU, and/or an RU may be implemented as a virtual unit, such as a virtual central unit (VCU), a virtual distributed unit (VDU), or a virtual radio unit (VRU), among other examples, which may be implemented as a virtual network function, such as in a cloud deployment.

Some network nodes 110 (for example, a base station, an RU, or a TRP) may provide communication coverage for a particular geographic area. The term "cell" can refer to a coverage area of a network node 110 or to a network node 110 itself, depending on the context in which the term is used. A network node 110 may support one or more cells (for example, each cell may support communication within an angular (for example, 60 degree) range around the network node). In some examples, a network node 110 may provide communication coverage for a macro cell, a pico cell, a femto cell, or another type of cell. A macro cell may cover a relatively large geographic area (for example, several kilometers in radius) and may allow unrestricted access by UEs 120 with associated service subscriptions. A pico cell may cover a relatively small geographic area and may also allow unrestricted access by UEs 120 with associated service subscriptions. A femto cell may cover a relatively small geographic area (for example, a home) and may allow restricted access by UEs 120 having association with the femto cell (for example, UEs 120 in a closed subscriber group (CSG)). In some examples, a cell may not necessarily be stationary. For example, the geographic area of the cell may move according to the location of an associated mobile network node 110 (for example, a train, a satellite, an unmanned aerial vehicle, or an NTN network node).

The wireless communication network 100 may be a heterogeneous network that includes network nodes 110 of different types, such as macro network nodes, pico network nodes, femto network nodes, relay network nodes, aggregated network nodes, and/or disaggregated network nodes, among other examples. Various different types of network nodes 110 may generally transmit at different power levels, serve different coverage areas (for example, a cell 130a and a cell 130b), and/or have different impacts on interference in the wireless communication network 100 than other types of network nodes 110.

The UEs 120 may be physically dispersed throughout the coverage area of the wireless communication network 100, and each UE 120 may be stationary or mobile. A UE 120 may be, may include, or may also be referred to as an access terminal, a mobile station, or a subscriber unit. A UE 120 may be, include, or be coupled with a cellular phone (for example, a smart phone), a personal digital assistant (PDA), a wireless modem, a wireless communication device, a handheld device, a laptop computer, a cordless phone, a wireless local loop (WLL) station, a tablet, a camera, a netbook, a smartbook, an ultrabook, a medical device, a biometric device, a wearable device (for example, a smart watch, smart clothing, smart glasses, a smart wristband, or smart jewelry), a gaming device, an entertainment device (for example, a music device, a video device, or a satellite radio), an XR device, a vehicular component or sensor, a smart meter or sensor, industrial manufacturing equipment, a Global Navigation Satellite System (GNSS) device (such as a Global Positioning System device or another type of positioning device), a UE function of a network node, and/or any other suitable device or function that may communicate via a wireless medium.

Some UEs 120 may be classified according to different categories in association with different complexities and/or different capabilities. UEs 120 in a first category may facilitate massive IoT in the wireless communication network 100, and may offer low complexity and/or cost relative to UEs 120 in a second category. UEs 120 in a second category may include mission-critical IoT devices, legacy UEs, baseline UEs, high-tier UEs, advanced UEs, full-capability UEs, and/or premium UEs that are capable of URLLC, eMBB, and/or precise positioning in the wireless communication network 100, among other examples. A third category of UEs 120 may have mid-tier complexity and/or capability (for example, a capability between that of the UEs 120 of the first category and that of the UEs 120 of the second capability). A UE 120 of the third category may be referred to as a reduced capability UE ("RedCap UE"), a mid-tier UE, an NR-Light UE, and/or an NR-Lite UE, among other examples. RedCap UEs may bridge a gap between the capability and complexity of NB-IoT devices and/or eMTC UEs, and mission-critical IoT devices and/or premium UEs. RedCap UEs may include, for example, wearable devices, IoT devices, industrial sensors, or cameras that are associated with a limited bandwidth, power capacity, and/or transmission range, among other examples. RedCap UEs may support healthcare environments, building automation, electrical distribution, process automation, transport and logistics, or smart city deployments, among other examples.

In some examples, a network node 110 may be, may include, or may operate as an RU, a TRP, or a base station that communicates with one or more UEs 120 via a radio access link (which may be referred to as a "Uu" link). The radio access link may include a downlink and an uplink. "Downlink" (or "DL") refers to a communication direction from a network node 110 to a UE 120, and "uplink" (or "UL") refers to a communication direction from a UE 120 to a network node 110. Downlink and uplink resources may include time domain resources (for example, frames, subframes, slots, and symbols), frequency domain resources (for example, frequency bands, component carriers (CCs), subcarriers, resource blocks, and resource elements), and spatial domain resources (for example, particular transmit directions or beams).

Frequency domain resources may be subdivided into bandwidth parts (BWPs). A BWP may be a block of frequency domain resources (for example, a continuous set of resource blocks (RBs) within a full component carrier bandwidth) that may be configured at a UE-specific level. A UE 120 may be configured with both an uplink BWP and a downlink BWP (which may be the same or different). Each BWP may be associated with its own numerology (indicating a sub-carrier spacing (SCS) and cyclic prefix (CP)). A BWP may be dynamically configured or activated (for example, by a network node 110 transmitting a downlink control information (DCI) configuration to the one or more UEs 120) and/or reconfigured (for example, in real-time or near-real-time) according to changing network conditions in the wireless communication network 100 and/or specific requirements of one or more UEs 120. An active BWP defines the operating bandwidth of the UE 120 within the operating bandwidth of the serving cell. The use of BWPs enables more efficient use of the available frequency domain resources in the wireless communication network 100 because fewer frequency domain resources may be allocated to a BWP for a UE 120 (which may reduce the quantity of frequency domain resources that a UE 120 is required to monitor and reduce UE power consumption by enabling the UE to monitor fewer frequency domain resources), leaving more frequency domain resources to be spread across multiple UEs 120. Thus, BWPs may also assist in the implementation of lower-capability (for example, RedCap) UEs 120 by facilitating the configuration of smaller bandwidths for communication by such UEs 120 and/or by facilitating reduced UE power consumption.

As used herein, a downlink signal may be or include a reference signal, control information, or data. For example, downlink reference signals include a primary synchronization signal (PSS), a secondary SS (SSS), an SS block (SSB) (for example, that includes a PSS, an SSS, and a physical broadcast channel (PBCH)), a demodulation reference signal (DMRS), a phase tracking reference signal (PTRS), a tracking reference signal (TRS), and a channel state information (CSI) reference signal (CSI-RS), among other examples. A downlink signal carrying control information or data may be transmitted via a downlink channel. Downlink channels may include one or more control channels for transmitting control information and one or more data channels for transmitting data. Downlink reference signals may be transmitted in addition to, or multiplexed with, downlink control channel communications and/or downlink data channel communications. A downlink control channel may be specifically used to transmit DCI from a network node 110 to a UE 120. DCI generally contains the information the UE 120 needs to identify RBs in a subsequent subframe and how to decode them, including a modulation and coding scheme (MCS) or redundancy version parameters. Different DCI formats carry different information, such as scheduling information in the form of downlink or uplink grants, slot format indicators (SFIs), preemption indicators (PIs), transmit power control (TPC) commands, hybrid automatic repeat request (HARQ) information, new data indicators (NDIs), among other examples. A downlink data channel may be used to transmit downlink data (for example, user data associated with a UE 120) from a network node 110 to a UE 120. Downlink control channels may include physical downlink control channels (PDCCHs), and downlink data channels may include physical downlink shared channels (PDSCHs). Control information or data communications may be transmitted on a PDCCH and PDSCH, respectively. For example, a PDCCH can carry DCI, while a PDSCH can carry a MAC control element (CE), an RRC message, or user data, among other examples. Each PDSCH may carry one or more transport blocks (TBs) of data.

As used herein, an uplink signal may include a reference signal, control information, or data. For example, uplink reference signals include a sounding reference signal (SRS), a PTRS, and a DMRS, among other examples. An uplink signal carrying control information or data may be transmitted via an uplink channel. An uplink channel may include one or more control channels for transmitting control information and one or more data channels for transmitting data. Uplink reference signals may be transmitted in addition to, or multiplexed with, uplink control channel communications and/or uplink data channel communications. An uplink control channel may be specifically used to transmit uplink control information (UCI) from a UE 120 to a network node 110. An uplink data channel may be used to transmit uplink data (for example, user data associated with a UE 120) from a UE 120 to a network node 110. Uplink control channels may include physical uplink control channels (PUCCHs), and uplink data channels may include physical uplink shared channels (PUSCHs). Control information or data communications may be transmitted on a PUCCH and PUSCH, respectively. For example, a PUCCH can carry UCI, while a PUSCH can carry a MAC CE, an RRC message, or user data, among other examples. UCI can include a scheduling request (SR), HARQ feedback information (for example, a HARQ acknowledgement (ACK) indication or a HARQ negative acknowledgement (NACK) indication), uplink power control information (for example, an uplink TPC parameter), and/or CSI, among other examples. CSI can include a channel quality indicator (CQI) (indicative of downlink channel conditions to facilitate selection of transmission parameters, such as an MCS, by a network node 110), a precoding matrix indicator (PMI), a CSI-RS resource indicator (CRI) (for example, indicative of a beam used to transmit a CSI-RS), an SS/PBCH resource block indicator (SSBRI) (for example, indicative of a beam used to transmit an SSB), a layer indicator (LI), a rank indicator (RI), and/or measurement information (for example, a layer 1 (L1)-reference signal received power (RSRP) parameter, a received signal strength indicator (RSSI) parameter, a reference signal received quality (RSRQ) parameter, among other examples) which can be used for beam management, among other examples. Each PUSCH may carry one or more TBs of data.

The information (for example, data, control information, or reference signal information) transmitted by a network node 110 to a UE 120, or vice versa, may be represented as a sequence of binary bits that are mapped (for example, modulated) to an analog signal waveform (for example, a discrete Fourier transform (DFT)-spread-orthogonal frequency division multiplexing (OFDM) (DFT-s-OFDM) waveform or a CP-OFDM waveform) that is transmitted by the network node 110 or UE 120 over a wireless communication channel. In some examples, the network node 110 or the UE 120 (for example, using the processing system 145 or the processing system 140, respectively) may select an MCS (for example, an order of quadrature amplitude modulation (QAM), such as 64-QAM, 128-QAM, or 256-QAM, among other examples) for a downlink signal or an uplink signal. For example, the network node 110 may select an MCS for a downlink signal in accordance with UCI received from the UE 120. The network node 110 may transmit, to the UE 120, an indication of the selected MCS for the downlink signal, such as via DCI that schedules the downlink signal. As another example, the network node 110 may transmit, and the UE 120 may receive, an indication of an MCS to be applied for the one or more uplink signals, such as via DCI scheduling transmission of the one or more uplink signals.

The network node 110 or the UE 120 (such as by using the processing system 145 or the processing system 140, respectively, and/or one or more coupled modems) may perform signal processing on the information (such as filtering, amplification, modulation, digital-to-analog conversion, an IFFT operation, multiplexing, interleaving, mapping, and/or encoding, among other examples) to generate a processed signal in accordance with the selected MCS. In some examples, the network node 110 or the UE 120 (for example, using the processing system 145 or the processing system 140, respectively, and/or one or more coupled encoders or modems) may perform a channel coding operation or a forward error correction (FEC) operation to control errors in transmitted information. For example, the network node 110 or the UE 120 may perform an encoding operation to generate encoded information (such as by selectively introducing redundancy into the information, typically using an error correction code (ECC), such as a polar code or a low-density parity-check (LDPC) code). The network node 110 or the UE 120 (for example, using the processing system 145 and/or one or more modems) may further perform spatial processing (for example, precoding) on the encoded information to generate one or more processed or precoded signals for downlink or uplink transmission, respectively. In some examples, the network node 110 or the UE 120 may perform codebook-based precoding or non-codebook-based precoding. Codebook-based precoding may involve selecting a precoder (for example, a precoding matrix) using a codebook. For example, the network node 110 may provide precoding information indicating which precoder, defined by the codebook, is to be used by the UE 120. Non-codebook-based precoding may involve selecting or deriving a precoder based on, or otherwise associated with, one or more downlink or uplink signal measurements. The network node 110 or the UE 120 may transmit the processed downlink or uplink signals, respectively, via one or more antennas.

The network node 110 or the UE 120 may receive uplink signals or downlink signals, respectively, via one or more antennas. The network node 110 or the UE 120 (for example, using the processing system 145 or the processing system 140, respectively, and/or one or more coupled modems) may perform signal processing (for example, in accordance with the MCS) on the received uplink or downlink signals, respectively (such as filtering, amplification, demodulation, analog-to-digital conversion, an FFT operation, demultiplexing, deinterleaving, de-mapping, equalization, interference cancellation, and/or decoding, among other examples), to map the received signal(s) to a sequence of binary bits (for example, received information) that estimates the information transmitted by the network node 110 or the UE 120 via the downlink or uplink signals. The network node 110 or the UE 120 (for example, using the processing system 145 or the processing system 140, respectively, and/or a coupled decoder or one or more modems) may decode the received information (such as by using an ECC, a decoding operation, and/or an FEC operation) to detect errors and/or correct bit errors in the received information to generate decoded information. The decoded information may estimate the information transmitted via the downlink or uplink signals.

In some examples, a UE 120 and a network node 110 may perform MIMO communication. "MIMO" generally refers to transmitting or receiving multiple signals (such as multiple layers or multiple data streams) simultaneously over the same time and frequency resources. MIMO techniques generally exploit multipath propagation. A network node 110 and/or UE 120 may communicate using massive MIMO, multi-user MIMO, or single-user MIMO, which may involve rapid switching between beams or cells. For example, the amplitudes and/or phases of signals transmitted via antenna elements and/or sub-elements may be modulated and shifted relative to each other (such as by manipulating a phase shift, a phase offset, and/or an amplitude) to generate one or more beams, which is referred to as beamforming. For example, the network node 110b may generate one or more beams 160a, and the UE 120b may generate one or more beams 160b. The term "beam" may refer to a directional transmission of a wireless signal toward a receiving device or otherwise in a desired direction, a directional reception of a wireless signal from a transmitting device or otherwise in a desired direction, a direction associated with a directional transmission or directional reception, a set of directional resources associated with a signal transmission or signal reception (for example, an angle of arrival, a horizontal direction, and/or a vertical direction), a set of parameters that indicate one or more aspects of a directional signal, a direction associated with the signal, and/or a set of directional resources associated with the signal, among other examples.

MIMO may be implemented using various spatial processing or spatial multiplexing operations. In some examples, MIMO may include a massive MIMO technique which may be associated with an increased (for example, "massive") quantity of antennas at the network node 110 and/or at the UE 120, such as in a network implementing mmWave technology. Massive MIMO may improve communication reliability by enabling a network node 110 and/or a UE 120 to communicate the same data across different propagation (or spatial) paths. In some examples, MIMO may support simultaneous transmission to multiple receivers, referred to as multi-user MIMO (MU-MIMO). Some RATs may employ MIMO techniques, such as multi-TRP (mTRP) operation (including redundant transmission or reception on multiple TRPs), reciprocity in the time domain or the frequency domain, single-frequency-network (SFN) transmission, or non-coherent joint transmission (NC-JT).

To support MIMO techniques, the network node 110 and the UE 120 may perform one or more beam management operations, such as an initial beam acquisition operation, one or more beam refinement operations, and/or a beam recovery operation. For example, an initial beam acquisition operation may involve the network node 110 transmitting signals (for example, SSBs, CSI-RSs, or other signals) via respective beams (for example, of the beams 160a of the network node 110) and the UE 120 receiving and measuring the signal(s) via respective beams of multiple beams (for example, from the beams 160b of the UE 120) to identify a best beam (or beam pair) for communication between the UE 120 and the network node 110. For example, the UE 120 may transmit an indication (for example, in a message associated with a random access channel (RACH) operation) of a (best) identified beam of the network node 110 (for example, by indicating an SSBRI or other identifier associated with the beam). A beam refinement operation may involve a first device (for example, the UE 120 or the network node 110) transmitting signal(s) via a subset of beams (for example, identified based on, or otherwise associated with, measurements reported as part of one or more other beam management operations). A second device (for example, the network node 110 or the UE 120) may receive the signal(s) via a single beam (for example, to identify the best beam for communication from the subset of beams). The beam(s) may be identified via one or more spatial parameters, such as a transmission configuration indicator (TCI) state and/or a quasi co-location (QCL) parameter, among other examples. The network node 110 and the UE 120 may increase reliability and/or achieve efficiencies in throughput, signal strength, and/or other signal properties for massive MIMO operations by performing the beam management operations.

Some aspects and techniques as described herein may be implemented, at least in part, using an artificial intelligence (AI) program (for example, referred to herein as an "AI/ML model"), such as a program that includes a machine learning (ML) model and/or an artificial neural network (ANN) model. The AI/ML model may be deployed at one or more devices 165 (for example, one or more network nodes 110, one or more UEs 120, and/or one or more servers, and/or one or more components of a cloud computing network, among other examples). For example, in an deployment where AI/ML functionality is performed independently at a device 165, sometimes referred to as "overlay AI/ML", the AI/IL model (or an instance or portion of the AI/ML model) may be deployed at a UE 120 (for example, at the processing system 140), a network node 110 (for example, at the processing system 145), one or more servers, and/or one or more components of a cloud computing network, among other examples. Additionally or alternatively, in a deployment where AI/ML functionality is coordinated between different devices 165, sometimes referred to as "coordinated AI/ML", or performed at all device and network layers, sometimes referred to as "native AI/ML", the AI/ML model (or an instance of the AI/ML model) may be deployed at multiple devices 165 (for example, a first portion of the AI/ML model may be deployed at a UE 120 and a second portion of the AI/ML model may be deployed at a network node 110). In other examples of coordinated AI/ML and/or native AI/ML, a first AI/ML model may be deployed at a UE 120 and a second AI/ML model may be deployed at a network node 110. The AI/ML model(s) may be configured to enhance various aspects of the wireless communication network 100 (for example, to increase privacy, reliability, and/or efficient use of network bandwidth, and/or to reduce latency, among other examples). For example, the AI/ML model(s) may be trained to identify patterns or relationships in data corresponding to the wireless communication network 100, a device, and/or an air interface, among other examples. The AI/ML model(s) may support operational decisions relating to one or more aspects associated with wireless communications devices, networks, or services.

Accordingly, in some examples, the AI/ML model(s) may enable AI-as-a-Service (for example, an end-to-end AI/ML service via a user plane) for use cases such as a self-organizing network (SON), minimization of drive test (MDT), quality of experience (QoE), positioning, sensing, predictive mobility, and/or traffic prediction, among other examples. In some examples, AI-as-a-Service use cases may include measurement collection reporting by a UE 120, device selection criteria (for example, according to a geographical area where measurements are to be collected and/or UE capabilities to be used to collected measurements), and/or reporting configurations (for example, reporting parameters such as location, time, and/or sensor information, among other examples). Additionally or alternatively, the AI/ML model(s) may enable AI/ML procedures (for example, RAN-triggered service establishment, configuration, inferencing using UE-side and/or network-side models, performance monitoring and/or management, and/or capability signaling, among other examples). Additionally or alternatively, the AI/ML model(s) may enable RAN-based AI/ML services via one or more application program interfaces (APIs) and/or management interfaces for use cases such as beam management, radio resource monitoring (RRM) relaxation, mobility prediction, load prediction, network energy savings, and/or coverage and capacity improvements, among other examples).

In some aspects, a UE (e.g., a UE 120) may include a communication manager 150. As described in more detail elsewhere herein, based at least in part on the UE being a transmitter, the communication manager 150 may generate multiple encoded bits of a data stream using a polar encoder; separate the multiple encoded bits into N layers for a MIMO transmission, N being a first integer that is even and greater than zero, the separating being based at least in part on a symbol length of M bits per symbol, M being a second integer; select V layer pairs from the N layers, each layer pair of the V layer pairs including a respective first layer and a respective second layer from the N layers, V being a third integer; group, for each layer pair of the V layer pairs, a first M symbol bits of the respective first layer of the layer pair and a second M symbol bits of the respective second layer of the layer pair to generate a MIMO input bit sequence that includes multiple bit pairs, and each bit pair of the multiple bit pairs includes a respective first bit of the first M symbol bits of the respective first layer and a respective second bit of the second M symbol bits of the respective second layer; and transmit the MIMO transmission using the MIMO input bit sequence. As one example, the communication manager 150 may order and/or reorder the first M symbol bits and the second M symbol bits to generate multiple bit pairs that include a respective first bit associated with the respective first layer and a respective second bit associated with the respective second layer.

Additionally, or alternatively, based at least in part on the UE being a receiver, the communication manager 150 may receive a MIMO transmission that includes N MIMO layers, N being a first integer that is even and greater than zero; demodulate the MIMO transmission to generate a MIMO output LLR sequence that includes N sub-LLR sequences, each sub-LLR sequence of the N sub-LLR sequences being associated with a respective MIMO layer of the MIMO transmission, the MIMO output LLR sequence being based at least in part on a symbol length of M bits per symbol, M being a second integer; reorder, as at least part of an inverse mapping operation, the MIMO output LLR sequence to generate a decoder input LLR sequence, the reordering being based at least in part on: the N sub-LLR sequences being partitioned into V sub-LLR sequence pairs, V being a third integer, each sub-LLR sequence pair of the V sub-LLR sequence pairs including a respective first sub-LLR sequence of the N sub-LLR sequences and a respective second sub-LLR sequence of the N sub-LLR sequences, the respective first sub-LLR sequence being associated with a respective first MIMO layer of the N MIMO layers, the respective second sub-LLR sequence being associated with a respective second MIMO layer of the N MIMO layers, and the decoder input LLR sequence including multiple LLR pairs, each LLR pair of the multiple LLR pairs being associated with a sub-LLR sequence pair of the V sub-LLR sequence pairs, each LLR pair of the multiple LLR pairs being based at least in part on first M LLRs in the respective first sub-LLR sequence of the sub-LLR sequence pair that are associated with a respective first symbol and second M LLRs in the respective second sub-LLR sequence of the sub-LLR sequence pair that are associated with a respective second symbol, each LLR pair including a first respective LLR of the first M LLRs and a second respective LLR of the second M LLRs; and generate a decoded bit sequence from a polar decoder by inputting the decoder input LLR sequence to the polar decoder. Additionally, or alternatively, the communication manager 150 may perform one or more other operations described herein.

In some aspects, a network node (e.g., a network node 110) may include a communication manager 155. As described in more detail elsewhere herein, based at least in part on the network node being a transmitter, the communication manager 155 may generate multiple encoded bits of a data stream using a polar encoder; separate the multiple encoded bits into N layers for a MIMO transmission, N being a first integer that is even and greater than zero, the separating being based at least in part on a symbol length of M bits per symbol, M being a second integer; select V layer pairs from the N layers, each layer pair of the V layer pairs including a respective first layer and a respective second layer from the N layers, V being a third integer; group, for each layer pair of the V layer pairs, a first M symbol bits of the respective first layer of the layer pair and a second M symbol bits of the respective second layer of the layer pair to generate a MIMO input bit sequence that includes multiple bit pairs, and each bit pair of the multiple bit pairs includes a respective first bit of the first M symbol bits of the respective first layer and a respective second bit of the second M symbol bits of the respective second layer; and transmit the MIMO transmission using the MIMO input bit sequence. As one example, the communication manager 155 may order and/or reorder the first M symbol bits and the second M symbol bits to generate multiple bit pairs that include a respective first bit associated with the respective first layer and a respective second bit associated with the respective second layer.

Additionally, or alternatively, based at least in part on the network node being a receiver, the communication manager 155 may receive a MIMO transmission that includes N MIMO layers, N being a first integer that is even and greater than zero; demodulate the MIMO transmission to generate a MIMO output LLR sequence that includes N sub-LLR sequences, each sub-LLR sequence of the N sub-LLR sequences being associated with a respective MIMO layer of the MIMO transmission, the MIMO output LLR sequence being based at least in part on a symbol length of M bits per symbol, M being a second integer; reorder, as at least part of an inverse mapping operation, the MIMO output LLR sequence to generate a decoder input LLR sequence, the reordering being based at least in part on: the N sub-LLR sequences being partitioned into V sub-LLR sequence pairs, V being a third integer, each sub-LLR sequence pair of the V sub-LLR sequence pairs including a respective first sub-LLR sequence of the N sub-LLR sequences and a respective second sub-LLR sequence of the N sub-LLR sequences, the respective first sub-LLR sequence being associated with a respective first MIMO layer of the N MIMO layers, the respective second sub-LLR sequence being associated with a respective second MIMO layer of the N MIMO layers, and the decoder input LLR sequence including multiple LLR pairs, each LLR pair of the multiple LLR pairs being associated with a sub-LLR sequence pair of the V sub-LLR sequence pairs, each LLR pair of the multiple LLR pairs being based at least in part on first M LLRs in the respective first sub-LLR sequence of the sub-LLR sequence pair that are associated with a respective first symbol and second M LLRs in the respective second sub-LLR sequence of the sub-LLR sequence pair that are associated with a respective second symbol, each LLR pair including a first respective LLR of the first M LLRs and a second respective LLR of the second M LLRs; and generate a decoded bit sequence from a polar decoder by inputting the decoder input LLR sequence to the polar decoder. Additionally, or alternatively, the communication manager 150 may perform one or more other operations described herein.

Figure 2:
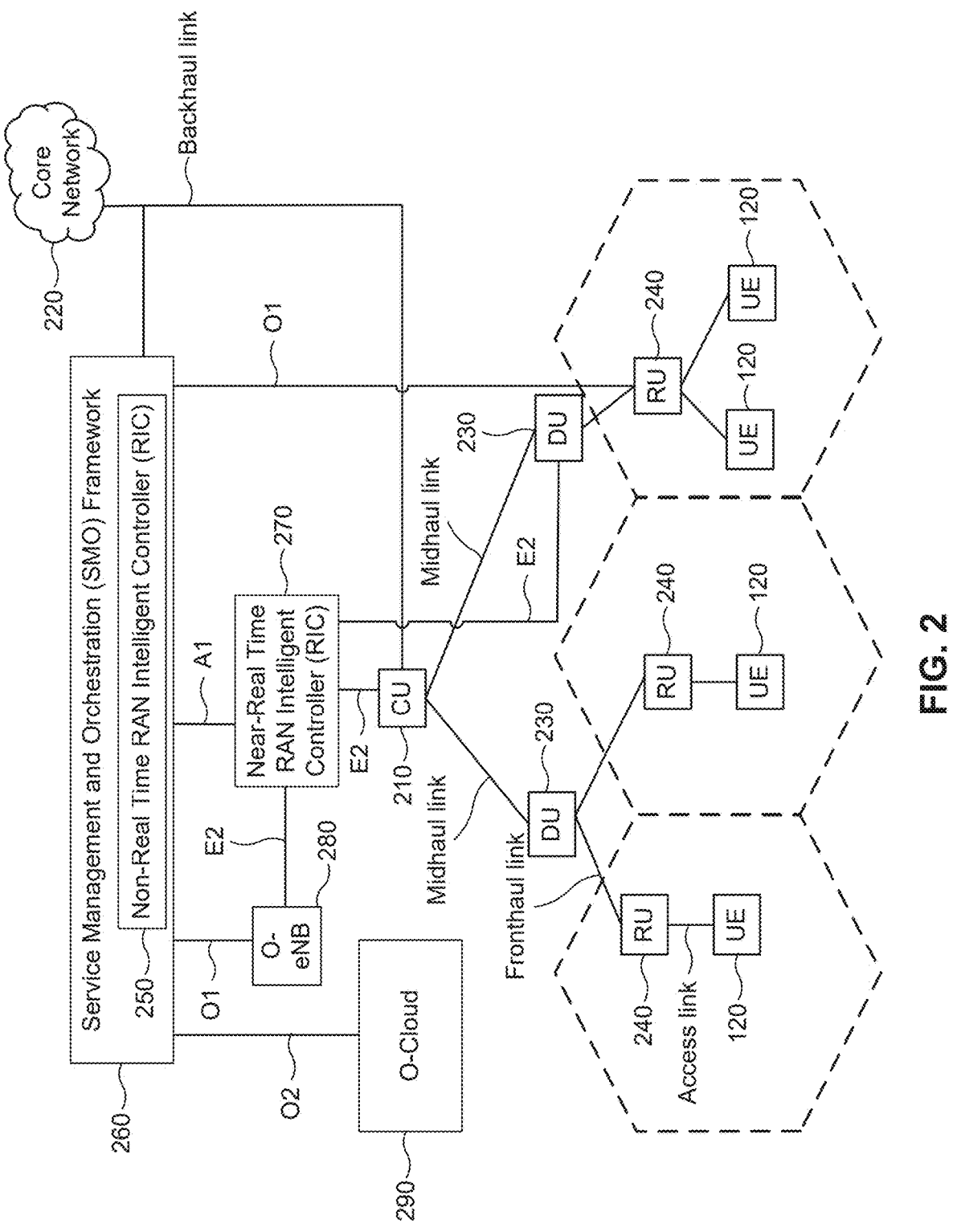
FIG. 2 is a diagram illustrating an example disaggregated network node architecture, in accordance with the present disclosure.

FIG. 2 is a diagram illustrating an example disaggregated network node architecture 200, in accordance with the present disclosure. One or more components of the example disaggregated network node architecture 200 may be, may include, or may be included in one or more network nodes (such one or more network nodes 110). The disaggregated network node architecture 200 may include a CU 210 that can communicate directly with a core network 220 via a backhaul link, or that can communicate indirectly with the core network 220 via one or more disaggregated control units, such as a non-real-time (Non-RT) RAN intelligent controller (RIC) 250 associated with a Service Management and Orchestration (SMO) Framework 260 and/or a near-real-time (Near-RT) RIC 270 (for example, via an E2 link). The CU 210 may communicate with one or more DUs 230 via respective midhaul links, such as via F1 interfaces. Each of the DUs 230 may communicate with one or more RUs 240 via respective fronthaul links. Each of the RUs 240 may communicate with one or more UEs 120 via respective RF access links. In some deployments, a UE 120 may be simultaneously served by multiple RUs 240.

Each of the components of the disaggregated network node architecture 200, including the CUs 210, the DUs 230, the RUs 240, the Near-RT RICs 270, the Non-RT RICs 250, and the SMO Framework 260, may include one or more interfaces or may be coupled with one or more interfaces for receiving or transmitting signals, such as data or information, via a wired or wireless transmission medium.

In some aspects, the CU 210 may be logically split into one or more CU user plane (CU-UP) units and one or more CU control plane (CU-CP) units. A CU-UP unit may communicate bidirectionally with a CU-CP unit via an interface, such as the E1 interface when implemented in an O-RAN configuration. The CU 210 may be deployed to communicate with one or more DUs 230, as necessary, for network control and signaling. Each DU 230 may correspond to a logical unit that includes one or more base station functions to control the operation of one or more RUs 240. For example, a DU 230 may host various layers, such as an RLC layer, a MAC layer, or one or more PHY layers, such as one or more high PHY layers or one or more low PHY layers. Each layer (which also may be referred to as a module) may be implemented with an interface for communicating signals with other layers (and modules) hosted by the DU 230, or for communicating signals with the control functions hosted by the CU 210. Each RU 240 may implement lower layer functionality. In some aspects, real-time and non-real-time aspects of control and user plane communication with the RU(s) 240 may be controlled by the corresponding DU 230.

The SMO Framework 260 may support RAN deployment and provisioning of non-virtualized and virtualized network elements. For non-virtualized network elements, the SMO Framework 260 may support the deployment of dedicated physical resources for RAN coverage requirements, which may be managed via an operations and maintenance interface, such as an O1 interface. For virtualized network elements, the SMO Framework 260 may interact with a cloud computing platform (such as an open cloud (O-Cloud) platform 290) to perform network element life cycle management (such as to instantiate virtualized network elements) via a cloud computing platform interface, such as an O2 interface. A virtualized network element may include, but is not limited to, a CU 210, a DU 230, an RU 240, a non-RT RIC 250, and/or a Near-RT RIC 270. In some aspects, the SMO Framework 260 may communicate with a hardware aspect of a 4G RAN, a 5G NR RAN, and/or a 6G RAN, such as an open eNB (O-eNB) 280, via an O1 interface. Additionally or alternatively, the SMO Framework 260 may communicate directly with each of one or more RUs 240 via a respective O1 interface. In some deployments, this configuration can enable each DU 230 and the CU 210 to be implemented in a cloud-based RAN architecture, such as a vRAN architecture.

The Non-RT RIC 250 may include or may implement a logical function that enables non-real-time control and optimization of RAN elements and resources, AI/ML workflows including model training and updates, and/or policy-based guidance of applications and/or features in the Near-RT RIC 270. The Non-RT RIC 250 may be coupled to or may communicate with (such as via an AI interface) the Near-RT RIC 270. The Near-RT RIC 270 may include or may implement a logical function that enables near-real-time control and optimization of RAN elements and resources via data collection and actions via an interface (such as via an E2 interface) connecting one or more CUs 210, one or more DUs 230, and/or an O-eNB 280 with the Near-RT RIC 270.

In some aspects, to generate AI/ML models to be deployed in the Near-RT RIC 270, the Non-RT RIC 250 may receive parameters or external enrichment information from external servers. Such information may be utilized by the Near-RT RIC 270 and may be received at the SMO Framework 260 or the Non-RT RIC 250 from non-network data sources or from network functions. In some examples, the Non-RT RIC 250 or the Near-RT RIC 270 may tune RAN behavior or performance. For example, the Non-RT RIC 250 may monitor long-term trends and patterns for performance and may employ AI/ML models to perform corrective actions via the SMO Framework 260 (such as reconfiguration via an O1 interface) or via creation of RAN management policies (such as AI interface policies). The network node 110, the processing system 145 of the network node 110, the UE 120, the processing system 140 of the UE 120, the CU 210, the DU 230, the RU 240, or any other component(s) of FIG. 1 and/or FIG. 2 may implement one or more techniques or perform one or more operations associated with grouping LLRs from different MIMO layers for polar decoding, as described in more detail elsewhere herein. For example, the processing system 145 of the network node 110, the processing system 140 of the UE 120, the CU 210, the DU 230, or the RU 240 may perform or direct operations of, for example, process 800 of FIG. 8, process 900 of FIG. 9, or other processes as described herein (alone or in conjunction with one or more other processors).

In some aspects, the transmitter described herein is the network node 110, is included in the network node 110, or includes one or more components of the network node 110 shown in FIG. 1. Alternatively, or additionally, the transmitter described herein is the UE 120, is included in the UE 120, or includes one or more components of the UE 120 shown in FIG. 1. In some aspects, the receiver described herein is the network node 110, is included in the network node 110, or includes one or more components of the network node 110 shown in FIG. 1. Alternatively, or additionally, the receiver described herein is the UE 120, is included in the UE 120, or includes one or more components of the UE 120 shown in FIG. 1.

Memory of the network node 110 may store data and program code (or instructions) for the network node 110, the CU 210, the DU 230, or the RU 240. In some examples, the memory of the network node 110 may store data relating to a UE 120, such as RRC state information or a UE context. Memory of a UE 120 may store data and program code (or instructions) for the UE 120, such as context information. In some examples, the memory of the UE 120 or the memory of the network node 110 may include a non-transitory computer-readable medium storing a set of instructions for wireless communication. For example, the set of instructions, when executed by one or more processors (for example, of the processing system 145 or the processing system 140) of the network node 110, the UE 120, the CU 210, the DU 230, or the RU 240, may cause the one or more processors to perform process 800 of FIG. 8, process 900 of FIG. 9, or other processes as described herein. In some examples, executing instructions may include running the instructions, converting the instructions, compiling the instructions, and/or interpreting the instructions, among other examples.

In some aspects, a UE (e.g., a UE 120) may be a transmitter and includes means for generating multiple encoded bits of a data stream using a polar encoder; means for separating the multiple encoded bits into N layers for a MIMO transmission, N being a first integer that is even and greater than zero, the separating being based at least in part on a symbol length of M bits per symbol, M being a second integer; means for selecting V layer pairs from the N layers, each layer pair of the V layer pairs including a respective first layer and a respective second layer from the N layers, V being a third integer; means for grouping, for each layer pair of the V layer pairs, a first M symbol bits of the respective first layer of the layer pair and a second M symbol bits of the respective second layer of the layer pair to generate a MIMO input bit sequence that includes multiple bit pairs, and each bit pair of the multiple bit pairs includes a respective first bit of the first M symbol bits of the respective first layer and a respective second bit of the second M symbol bits of the respective second layer; and/or means for transmitting the MIMO transmission using the MIMO input bit sequence.

Alternatively, or additionally, the UE is a receiver and includes means for receiving a MIMO transmission that includes N MIMO layers, N being a first integer that is even and greater than zero; means for demodulating the MIMO transmission to generate a MIMO output LLR sequence that includes N sub-LLR sequences, each sub-LLR sequence of the N sub-LLR sequences being associated with a respective MIMO layer of the MIMO transmission, the MIMO output LLR sequence being based at least in part on a symbol length of M bits per symbol, M being a second integer; means for reordering, as at least part of an inverse mapping operation, the MIMO output LLR sequence to generate a decoder input LLR sequence, the reordering being based at least in part on: the N sub-LLR sequences being partitioned into V sub-LLR sequence pairs, V being a third integer, each sub-LLR sequence pair of the V sub-LLR sequence pairs including a respective first sub-LLR sequence of the N sub-LLR sequences and a respective second sub-LLR sequence of the N sub-LLR sequences, the respective first sub-LLR sequence being associated with a respective first MIMO layer of the N MIMO layers, the respective second sub-LLR sequence being associated with a respective second MIMO layer of the N MIMO layers, and the decoder input LLR sequence including multiple LLR pairs, each LLR pair of the multiple LLR pairs being associated with a sub-LLR sequence pair of the V sub-LLR sequence pairs, each LLR pair of the multiple LLR pairs being based at least in part on first M LLRs in the respective first sub-LLR sequence of the sub-LLR sequence pair that are associated with a respective first symbol and second M LLRs in the respective second sub-LLR sequence of the sub-LLR sequence pair that are associated with a respective second symbol, each LLR pair including a first respective LLR of the first M LLRs and a second respective LLR of the second M LLRs; and/or means for generating a decoded bit sequence from a polar decoder by inputting the decoder input LLR sequence to the polar decoder. In some aspects, the means for the UE to perform operations described herein may include, for example, one or more of communication manager 150, processing system 140, a radio, one or more RF chains, one or more transceivers, one or more antennas, one or more modems, a reception component (for example, reception component 1002 depicted and described in connection with FIG. 10), and/or a transmission component (for example, transmission component 1004 depicted and described in connection with FIG. 10), among other examples.

In some aspects, a network node (e.g., a network node 110) may be a transmitter and includes means for generating multiple encoded bits of a data stream using a polar encoder; means for separating the multiple encoded bits into N layers for a MIMO transmission, N being a first integer that is even and greater than zero, the separating being based at least in part on a symbol length of M bits per symbol, M being a second integer; means for selecting V layer pairs from the N layers, each layer pair of the V layer pairs including a respective first layer and a respective second layer from the N layers, V being a third integer; means for grouping, for each layer pair of the V layer pairs, a first M symbol bits of the respective first layer of the layer pair and a second M symbol bits of the respective second layer of the layer pair to generate a MIMO input bit sequence that includes multiple bit pairs, and each bit pair of the multiple bit pairs includes a respective first bit of the first M symbol bits of the respective first layer and a respective second bit of the second M symbol bits of the respective second layer; and/or means for transmitting the MIMO transmission using the MIMO input bit sequence. The means for grouping may include means for ordering, reordering, and/or alternating bits to form the multiple bit pairs that each include the respective first bit that is associated with the respective first layer and the respective second bit that is associated with the respective second layer.

Alternatively, or additionally, the network node is a receiver and includes means for receiving a MIMO transmission that includes N MIMO layers, N being a first integer that is even and greater than zero; means for demodulating the MIMO transmission to generate a MIMO output LLR sequence that includes N sub-LLR sequences, each sub-LLR sequence of the N sub-LLR sequences being associated with a respective MIMO layer of the MIMO transmission, the MIMO output LLR sequence being based at least in part on a symbol length of M bits per symbol, M being a second integer; means for reordering, as at least part of an inverse mapping operation, the MIMO output LLR sequence to generate a decoder input LLR sequence, the reordering being based at least in part on: the N sub-LLR sequences being partitioned into V sub-LLR sequence pairs, V being a third integer, each sub-LLR sequence pair of the V sub-LLR sequence pairs including a respective first sub-LLR sequence of the N sub-LLR sequences and a respective second sub-LLR sequence of the N sub-LLR sequences, the respective first sub-LLR sequence being associated with a respective first MIMO layer of the N MIMO layers, the respective second sub-LLR sequence being associated with a respective second MIMO layer of the N MIMO layers, and the decoder input LLR sequence including multiple LLR pairs, each LLR pair of the multiple LLR pairs being associated with a sub-LLR sequence pair of the V sub-LLR sequence pairs, each LLR pair of the multiple LLR pairs being based at least in part on first M LLRs in the respective first sub-LLR sequence of the sub-LLR sequence pair that are associated with a respective first symbol and second M LLRs in the respective second sub-LLR sequence of the sub-LLR sequence pair that are associated with a respective second symbol, each LLR pair including a first respective LLR of the first M LLRs and a second respective LLR of the second M LLRs; and/or means for generating a decoded bit sequence from a polar decoder by inputting the decoder input LLR sequence to the polar decoder. In some aspects, the means for the receiver to perform operations described herein may include, for example, one or more of communication manager 155, processing system 145, a radio, one or more RF chains, one or more transceivers, one or more antennas, one or more modems, a reception component (for example, reception component 1102 depicted and described in connection with FIG. 11), and/or a transmission component (for example, transmission component 1104 depicted and described in connection with FIG. 11), among other examples.

Figure 3:
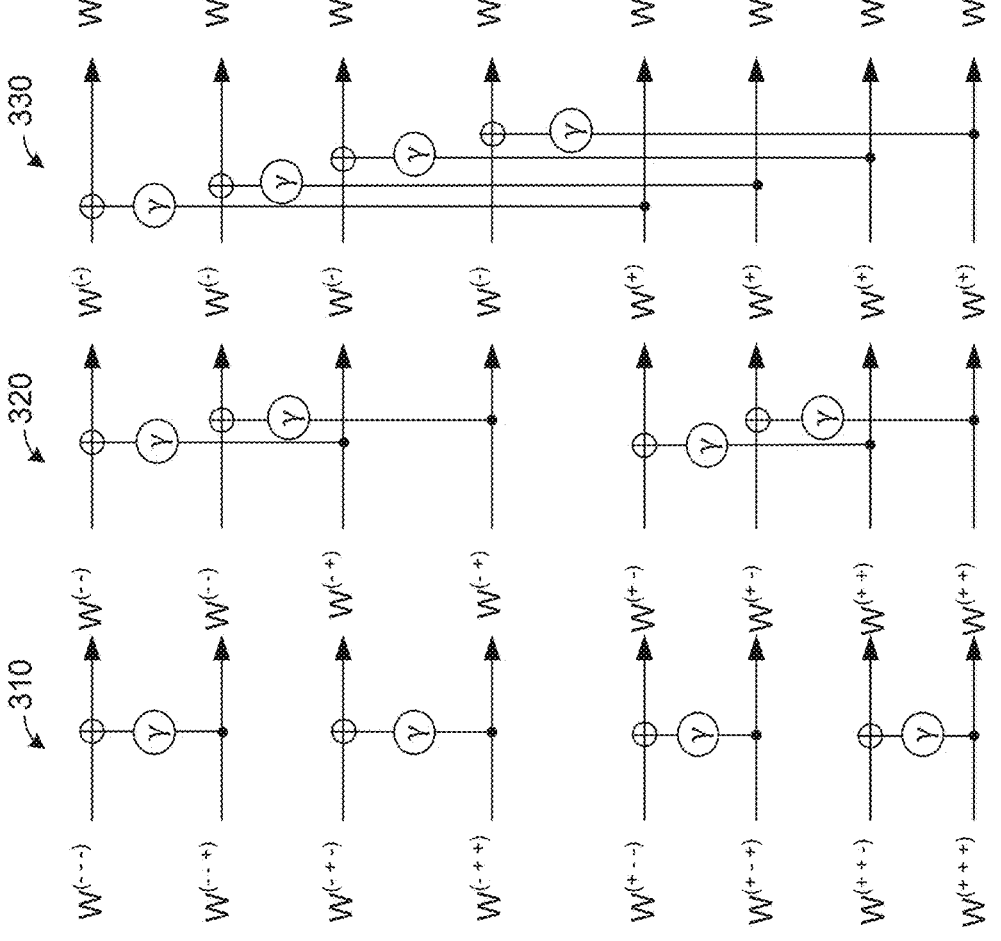
FIG. 3 is a diagram illustrating an example of a polar coding operation, in accordance with the present disclosure.

FIG. 3 is a diagram illustrating an example of a polar coding operation 300, in accordance with the present disclosure.

Wireless communications may be encoded using polar coding to improve resilience to non-ideal channel conditions. Polar encoding may involve constructing a codeword c having a length N. In some examples, encoding with an (N=2$^m$, K) code defined over a Galois Field (GF) with four elements (GF(4)), the codeword $$c = u \begin{pmatrix} 1 & 0 \\ \gamma & 1 \end{pmatrix}^{\otimes m},$$

where $u_i$, $c_i \in$ GF(4) and $\gamma$ is an element of GF(4) not equal to 0 or 1. A symbol $u_i$ of an encoded communication may carry information (e.g., a two-bit payload in GF(4) or a one-bit payload in GF(2)) or may be frozen (e.g., having a fixed value, such as $u_i=0$). N may be referred to herein as a value defining a plurality of symbols of the encoded communication. In the binary case (GF(2)), $\gamma=1$.

The matrix $$\begin{pmatrix} 1 & 0 \\ \gamma & 1 \end{pmatrix}^{\otimes m}$$

may polarize 2$^m$ copies of a channel W into subchannels W$^{(i)}$, which may be almost noisy (e.g., I(W$^{(i)}$)→0) or almost noiseless (e.g., I(W$^{(i)}$)→2). As an example, subchannels W$^{(i)}$ may be polarized into highly reliable (e.g., low noise) subchannels W$^{(i)}$ and highly unreliable (e.g., noisy) subchannels W$^{(i)}$. For example, for GF(4), the capacities of the subchannels W$^{(i)}$, I(W$^{(i)}$), may approach two for highly reliable subchannels W$^{(i)}$ and 0 for highly unreliable subchannels W$^{(i)}$. If GF(2), $\gamma=1$, and subchannels W$^{(i)}$ may be present where the capacities I(W$^{(i)}$) approach one (e.g., I(W$^{(i)}$)→1).

Polar coding provides for a set of information symbols $i_0, \ldots i_{K-1}$ to be mapped to reliable symbol positions (referred to as information locations) and for unreliable symbols (in frozen locations) to be replaced with frozen symbols. For example, the information symbols $i_0, \ldots i_{K-1}$ may correspond to the K largest capacities I(W$^{(i)}$). For example, a transmitter may transmit the information symbols $i_0, \ldots i_{K-1}$ through the subchannels WM that have the K largest capacities I(W$^{(i)}$).

The polar encoding operation 300 may include coupling a plurality of subchannels W$^{(i)}$ over multiple phases 310-330. Phase 310 involves coupling neighboring subchannels W$^{(i)}$. Phase 320 involves coupling subchannels W$^{(i)}$ separated by one subchannel W$^{(i)}$. Phase 330 involves coupling subchannels W$^{(i)}$ separated by three subchannels W$^{(i)}$. Polar decoding may involve performing the polar encoding operation 300 in reverse (e.g., phase 330, followed by phase 320, followed by phase 310).

Polar coding is described herein with reference to a general kernel $$G = \begin{pmatrix} 1 & 0 \\ \gamma & 1 \end{pmatrix},$$

where for GF(4), $\gamma \in \{1, \alpha, \alpha^2\}$, and $\alpha$ is the primitive element of GF(2$^2$). Thus, the elements of GF(2$^2$) may include $\{0, 1, \alpha, \alpha^2=\alpha+1\}$, which may be considered as the elements $\{00, 01, 10, 11\}$ of a two-dimensional vector space over GF(2). The summation of the elements may be defined coordinate-wise (e.g., where each coordinate is a single bit), and for multiplication of the elements, the following properties may be used: $0 \cdot x=0$, $1 \cdot x=x$, and $\alpha^3=1$. As described herein, for encoding in nonbinary polar coding, a recursive structure $$\begin{pmatrix} 1 & 0 \\ \gamma & 1 \end{pmatrix}^{\otimes m}$$

may be used. For GF(2), the general kernel $$G = \begin{pmatrix} 1 & 0 \\ 1 & 1 \end{pmatrix}$$

and for encoding in binary polar coding, a recursive structure $$\begin{pmatrix} 1 & 0 \\ 1 & 1 \end{pmatrix}^{\otimes m}$$

may be used.

"Channel splitting" denotes the process of creating reliable subchannels and unreliable subchannels that are used for channel polarization in polar encoding, and a polarization metric may indicate a degree of polarization between the reliable subchannels and the unreliable subchannels. That is, a polarization metric may indicate how distinguishable a reliable subchannel is from an unreliable subchannel. A polarization metric may have a value that is within a range between zero and one. For some types of polarization metrics (e.g., a mutual information polarization metric), a polarization metric that is closer to one than zero may indicate that the reliable subchannels and the unreliable subchannels have a high degree of polarization, and a polarization metric that is closer to zero than one may indicate that the reliable subchannels and the unreliable subchannels have a low degree of polarization. However, for other types of polarization metrics (Bhattacharyya parameter polarization metric), a polarization metric that is closer to zero may indicate that there is a high degree of polarization between the reliable subchannels and the unreliable subchannels, and a polarization metric that is closer to one may indicate there is a low degree of polarization between the reliable subchannels and the unreliable subchannels. In some cases, a polarization metric may be calculated for a particular code and/or a given code length, and a polarization metric that indicates a higher degree of polarization relative to other polarization metrics may indicate a probability of obtaining a higher capacity using the associated code.

As indicated above, FIG. 3 is provided as an example. Other examples may differ from what is described with respect to FIG. 3.

Figure 4A:
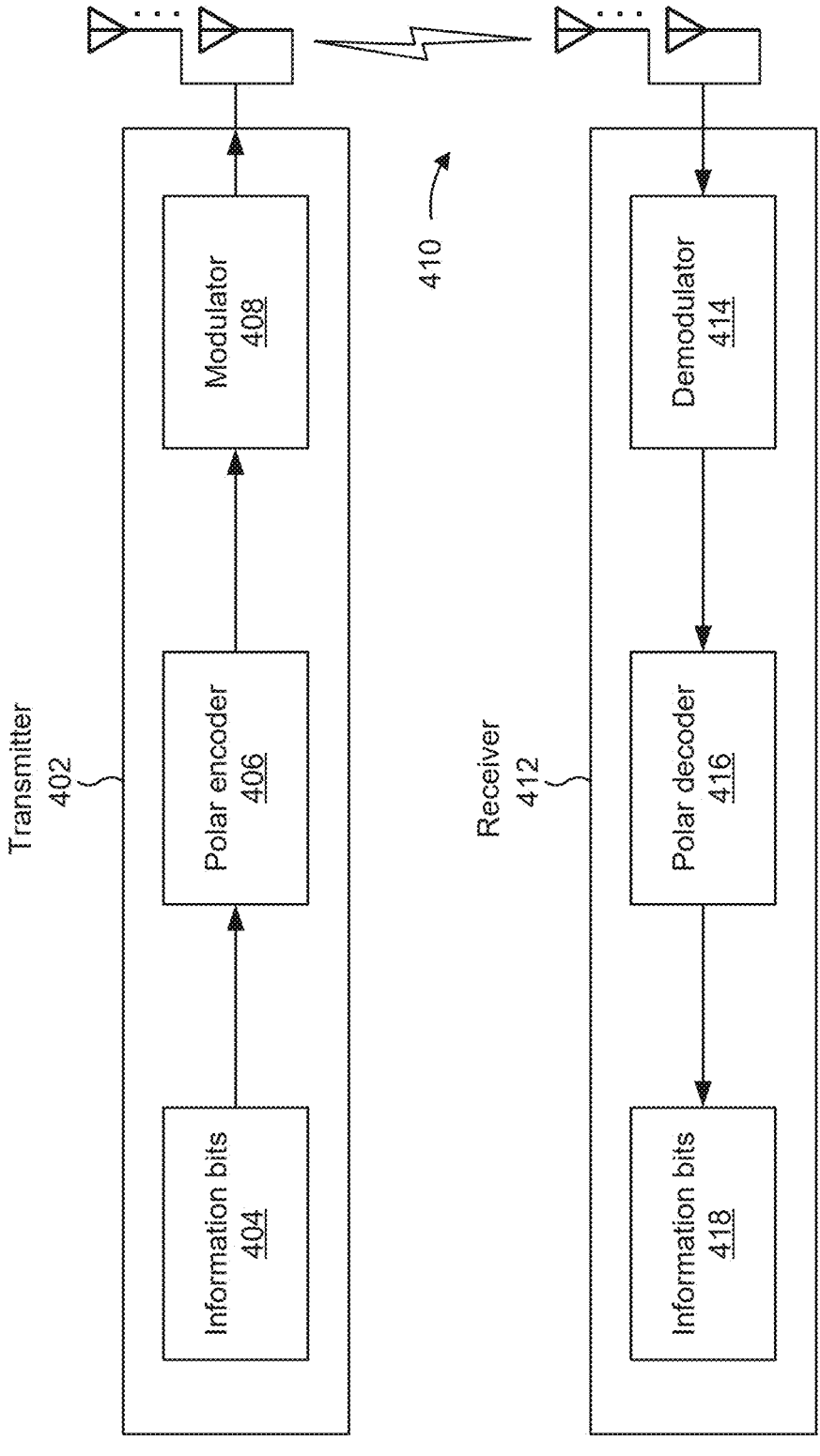
FIGS. 4A, 4B, and 4C are diagrams illustrating a first example of a transmitter block diagram and a receiver block diagram, and a second example of a polar decoder with a first input, and a third example of the polar decoder with a second input, that may be used for a multiple-input-multiple-output (MIMO) transmission that is based at least in part on polar codes, in accordance with the present disclosure.
Figure 4B:
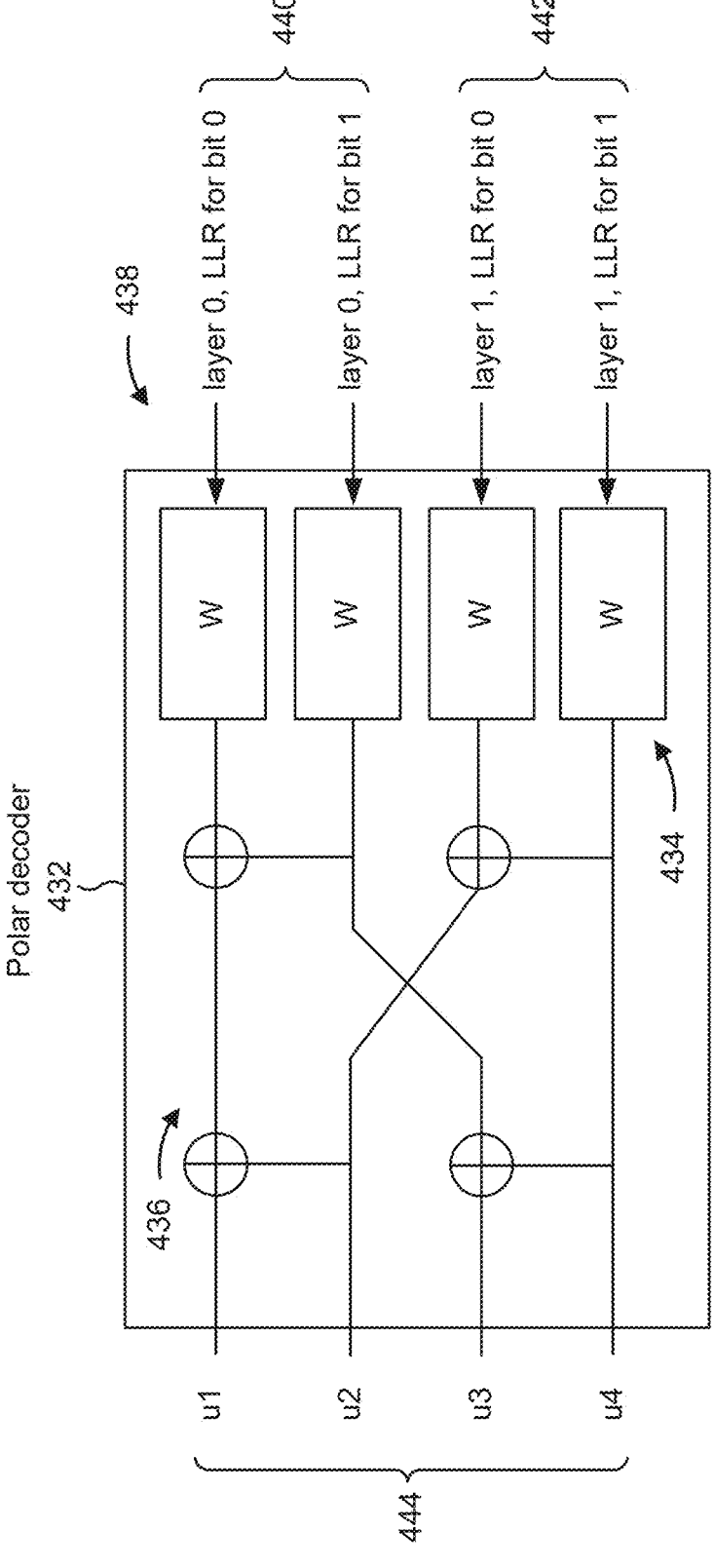
Figure 4C:
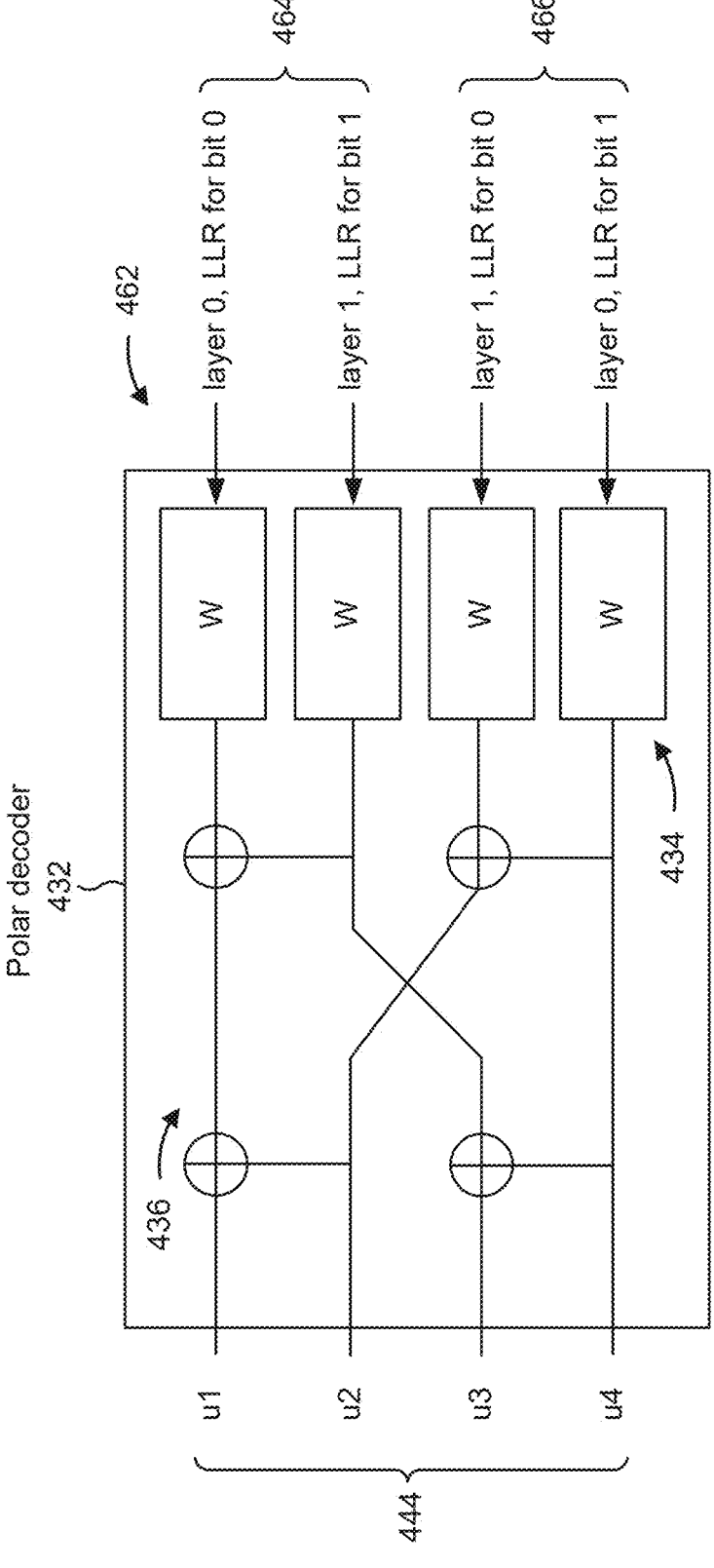

FIGS. 4A, 4B, and 4C are diagrams illustrating a first example 400 of a transmitter block diagram and a receiver block diagram, a second example 430 of a polar decoder 432 with a first input, and a third example 460 of the polar decoder 432 with a second input, that may be used for a MIMO transmission that is based at least in part on polar codes, in accordance with the present disclosure.

A wireless communication channel may introduce errors in communications due to random noise, interference, device impairments, and other factors. These errors may corrupt such communications at a receiver. Some wireless communications may be encoded using polar coding as described above to improve resilience to non-ideal channel conditions. Alternatively, or additionally, some wireless communications are configured as a MIMO communication to increase data throughput. A MIMO communication may transmit user data and/or information bits over parallel streams (e.g., spatial streams via respective beams), that may also be referred to as layers. For instance, a two (2)-layer MIMO communication may include two parallel spatial streams that carry respective user data streams that are independent from one another, or carry portions of a (same) user data stream. In some cases, the layers may be encoded based at least in part on one or more polar codes.

To illustrate, the first example 400 shown by FIG. 4A includes a transmitter 402. The transmitter 402 may include information bits 404 that are associated with a single user data stream. The transmitter 402 includes a polar encoder 406 that applies channel encoding (via one or more polar codes) to the information bits 404 as described with regard to FIG. 3 such that the polar encoder 406 outputs one or more codewords. Each codeword may be used as input to a modulator 408. In some cases, the modulator 408 may include MIMO capabilities to generate multiple MIMO layers as respective modulated signals. As one example, the modulator 408 may modulate a first portion of a codeword onto a first modulated signal (e.g., using OFDM) and a second portion of the codeword onto a second modulated signal to increase data throughput. The transmitter 402 may then spatially multiplex the modulated signals, such as via multiple antennas and beamforming. The modulated signals may propagate through a wireless channel 410 to a receiver 412 that performs complementary functionality to the transmitter 402 to recover the information bits.

For instance, the receiver 412 may receive each layer of the MIMO transmission using multiple antennas, and the MIMO layers may be used as input to a demodulator 414. The demodulator 414 may generate one or more LLRs for each bit of each symbol carried in each MIMO layer. That is, the demodulator 414 may generate an LLR sequence for each MIMO layer, where each LLR in a respective LLR sequence may be linked to a respective bit carried in the respective MIMO layer. As shown by FIG. 4A, the LLR sequence may be input to a polar decoder 416, and the polar decoder 416 may recover information bits 418 (e.g., an estimation of the information bits 404) based at least in part on the one or more polar codes used at the transmitter.

The second example 430 shown in FIG. 4B includes an example polar decoder 432 that may be used to receive LLRs associated with a codeword that is based at least in part on polar codes as described with regard to FIG. 4A and output information bits. In some examples, the polar decoder 432 may be the polar decoder 416 described with regard to FIG. 4A. As shown by reference number 434, the polar decoder 432 may include first processing (shown as "W") that models a binary-input, memoryless, and symmetric (BMS) channel and, using the model, computes synthetic channels (e.g., reliable channels and unreliable channels) used for encoding. Alternatively, or additionally, as shown by reference number 436, the polar decoder 432 may include processing for decoding the codeword (e.g., using successive cancellation decoding (SCD), successive cancellation list decoding (SCLD), and/or belief propagation decoding (BPD)). The processing shown by reference number 434 and reference number 436 includes recursive processing and/or nodes that compute intermediate LLR values and/or intermediate bit decisions.

As shown by reference number 438, the polar decoder 432 may receive first input in the form of LLRs for each bit in a codeword. In the second example 430, the codeword has a length of four (4), but in other examples, the polar decoder 432 may receive codewords that have a different length than 4. As shown by FIG. 4B, the codeword may be based at least in part on a two-layer MIMO transmission. For instance, a demodulator (e.g., the demodulator 414) may generate a first LLR pair 440 that is associated with layer 0 of the MIMO transmission and a second LLR pair 442 that is associated with layer 1 of the MIMO transmission. In some cases, the first LLR pair 440 may be associated with a first symbol carried in layer 0 and the second LLR pair 442 may be associated with a second symbol carried in layer 1. As shown by FIG. 4B, the polar decoder 432 may process the first LLR pair 440 and the second LLR pair 442 using the processing described with regard to reference number 434 and reference number 436 to generate estimated information bits 444.

The polar decoder 432 may be configured to process pairs of LLRs based at least in part on recursive operations at the polar decoder 432 that are associated with the synthetic channels and the polarization of the synthetic channels. Processing pairs of LLRs in the decoding process may enable the polar decoder 432 to leverage the polarization of the synthetic channels to refine bit decisions efficiently (e.g., using fewer computations and/or less processing time). To illustrate, the polar decoder 432 may process the LLRs in the first LLR pair 440 together and/or the LLRs in the second LLR pair 442 together using a recursive decoding procedure. As at least part of the recursive decoding process, the polar decoder 432 may combine the LLRs included in a respective LLR pair at one or more stages to make an intermediate bit determination and/or to refine a bit determination. A magnitude difference of the LLRs in an LLR pair may affect how reliably the polar decoder 432 estimates and/or decodes information bits. To illustrate, LLRs with similar magnitudes (e.g., within a difference threshold) may result in the polar decoder 432 having less certainty in a bit decision, which may lead to less reliable bit estimations and/or increased bit recovery errors. Increased bit recovery errors may lead to reduced data throughput, increased data transfer delays, and/or data loss in a wireless network. To illustrate, increased bit recovery errors may increase a quantity of retransmission requests, leading to longer data transfer delays for completion of a data transfer and/or increased air interface resource consumption for the data transfer.

Various aspects relate generally to grouping LLRs from different MIMO layers for polar decoding. Some aspects more specifically relate to applying mapping at a transmitter, and inverse mapping at a receiver, that collectively generate an LLR pair as an input of a polar decoder, where the LLR pair includes a first LLR that is associated with a first MIMO layer and a second LLR that is associated with a second MIMO layer. In some aspects, a transmitter may generate multiple encoded bits of a data stream using a polar encoder. The transmitter may separate the multiple encoded bits into N layers for a MIMO transmission. The separating may be based at least in part on N being a first integer that is even and greater than zero and a symbol length of M bits per symbol, M being a second integer. The transmitter may select V layer pairs (V being a third integer) from the N layers, where each layer pair of the V layer pairs includes a respective first layer and a respective second layer from the N layers. In some aspects, the transmitter may group, for each layer pair of the V layer pairs, a first M symbol bits of the respective first layer of the layer pair and a second M symbol bits of the respective second layer of the layer pair to generate a MIMO input bit sequence that includes multiple bit pairs. That is, the transmitter may group the bits such that each bit pair includes a respective first bit of the first M symbol bits of the respective first layer and a respective second bit of the second M symbol bits of the respective second layer. Grouping by the transmitter may include the transmitter ordering, reordering, and/or alternating bits to form the multiple bit pairs that each include the respective first bit that is associated with the respective first layer and the respective second bit that is associated with the respective second layer. The transmitter may transmit the MIMO transmission using the MIMO input bit sequence.

Alternatively, or additionally, a receiver may receive a MIMO transmission that includes N layers. As described above, N may be a first integer that is even and greater than zero. The receiver may demodulate the MIMO transmission to generate a MIMO output LLR sequence. In some aspects, the LLR sequence may be based at least in part on a symbol length of M bits per symbol (M being a second integer). The receiver may reorder the MIMO output LLR sequence as at least part of an inverse mapping operation, where the inverse mapping operation may generate a decoder input LLR sequence. In some aspects, the reordering is based at least in part on the N layers being partitioned into V layer pairs (V being a third integer). Each layer pair of the V layer pairs may include a respective first layer and a respective second layer of the N layers. Alternatively, or additionally, the reordering may be based at least in part on the MIMO output LLR sequence including multiple LLR pairs, where each LLR pair of the multiple LLR pairs is associated with a layer pair of the V layer pairs. In some aspects, each LLR pair of the multiple LLR pairs is based at least in part on first M LLRs in the MIMO output LLR sequence that are associated with a respective first symbol of the respective first layer and second M LLRs in the MIMO output LLR sequence that are associated with a respective second symbol of the respective second layer. Alternatively, or additionally, each LLR pair includes a first respective LLR of the first M LLRs and a second respective LLR of the second M LLRs. The receiver may generate a decoded bit sequence from a polar decoder by inputting the decoder input LLR sequence to the polar decoder.

The third example 460 shown by FIG. 4C includes the polar decoder 432 described with regard to FIG. 4B. As shown by reference number 462, the polar decoder 432 receives second input that includes a first LLR pair 464 and a second LLR pair 466. Each LLR pair includes a respective first LLR that is associated with layer 0 and a respective second LLR that is associated with layer 1. As described herein, a transmitter and receiver may, collectively, order bits and/or reorder LLRs to form LLR pairs at an input of a polar decoder such that the LLR pairs include LLRs from different MIMO layers.

Particular aspects of the subject matter described in this disclosure can be implemented to realize one or more of the following potential advantages. In some examples, by grouping LLRs from different MIMO layers in an LLR pair, the described techniques can be used to increase an LLR magnitude difference between the LLRs in the LLR pair and, consequently, increase a confidence in bit decoding at a polar decoder. To illustrate, in statistical terms and on average, the magnitudes of LLRs from different MIMO layers are more likely to have a larger difference than LLRs from the same MIMO layer. Increasing a confidence of bit decoding at a polar decoder may reduce bit decoding errors, increase data throughput, and/or decrease data transfer latencies.

As indicated above, FIGS. 4A, 4B, and 4C are provided as examples. Other examples may differ from what is described with regard to FIGS. 4A, 4B, and 4C.

Figure 5:
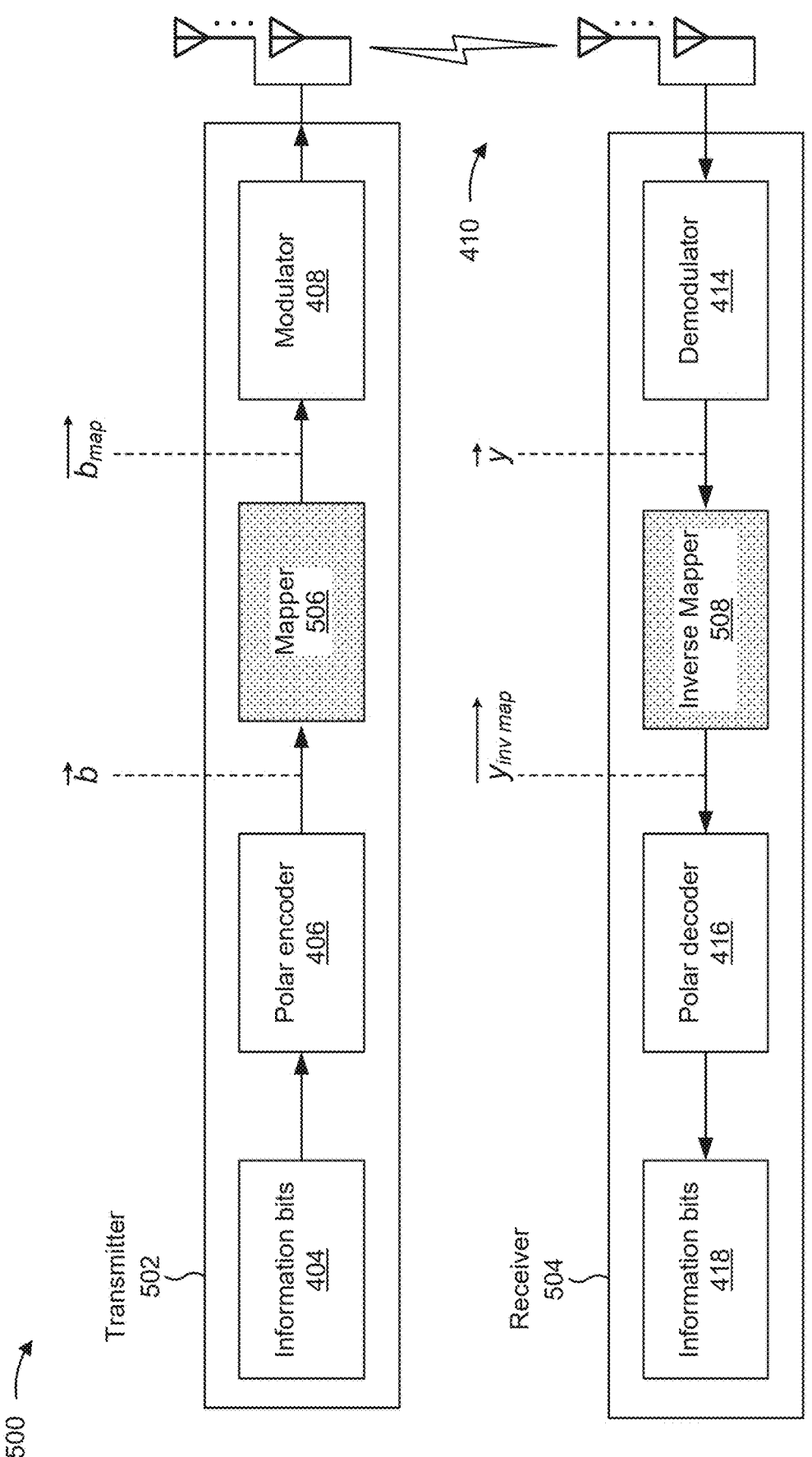
FIG. 5 is a diagram illustrating an example of mapping and inverse mapping that may be used at a transmitter and receiver, respectively, to group log-likelihood-ratio bit pairs with bits from different MIMO layers at a polar decoder input, in accordance with the present disclosure.

FIG. 5 is a diagram illustrating an example 500 of mapping and inverse mapping that may be used at a transmitter and receiver, respectively, to group LLR bit pairs with bits from different MIMO layers at a polar decoder input, in accordance with the present disclosure.

The example 500 includes a transmitter 502 and a receiver 504 that may communicate with one another using polar encoded wireless communications. The transmitter 502 includes the information bits 404, the polar encoder 406, and the modulator 408 as described with regard to FIG. 4, and the receiver 504 includes the demodulator 414, the polar decoder 416, and the information bits 418 as described with regard to FIG. 4A. As shown by FIG. 5, the transmitter 502 also includes a mapper 506 (shown with a dotted pattern) and the receiver 504 includes an inverse mapper 508 (shown with a dotted pattern). Collectively, the mapper 506 and the inverse mapper 508 may generate LLR pairs at an input of the polar decoder 416 that include LLRs that are associated with bits and/or symbols that are carried in different MIMO layers.

To illustrate, the polar encoder 406 may output a bit sequence, shown by FIG. 5 as $\vec{b}$. In some aspects, the bit sequence may be one or more codewords that are output by the polar decoder. To illustrate, $\vec{b} = [b_0 \ b_1 \ b_2 \ b_3]$ for a codeword that has a length of 4, where b is a bit value and the subscript i=0, 1, 2, and 3 is a bit index for each respective bit in the bit sequence. The mapper 506 may generate an output, shown as $\overrightarrow{b_{map}}$, that is based at least in part on positioning LLRs of bits at an input of the polar decoder 416 into LLR pairs that include LLRs associated with different MIMO layers. In some aspects, the mapper 506 may reposition the bits in the bit sequence $\vec{b}$ based at least in part on a permuted sequence $\vec{p}$ and/or a mapping sequence. The permuted sequence $\vec{p}$ and/or the mapping sequence may be based at least in part on generating the LLR pairs that include LLRs associated with different layers (e.g., at the input of the polar decoder 416). Alternatively, or additionally, the permuted sequence and/or mapping sequence may be based at least in part on N MIMO layers and/or a symbol length of M bits, where N and M are integers.

As one example, for a sequence of 4 and 2 MIMO layers, $\vec{p}$ may equal [0 3 2 1] in terms of bit index i, and the mapper 506 may reposition $\vec{b}$ based at least in part on $\vec{p}$ such that $\overrightarrow{b_{map}} = [b_0 \ b_3 \ b_2 \ b_1]$. The functionality of the mapper 506 may be expressed as $\vec{b}_{map}(\vec{p}) = \vec{b}$. $\overrightarrow{b_{map}}$ may be used as an input to the modulator 408, and the modulator 408 may modulate a first 2-bit symbol on MIMO layer 0 using $b_0 \ b_3$ and a second 2-bit symbol on MIMO layer 1 using $b_2 \ b_1$. MIMO layer 0 and MIMO layer 1 may propagate through the wireless channel 410 to the receiver 504.

As described with regard to FIG. 4B, the demodulator 414 may generate an LLR sequence that is shown by FIG. 5 as f. The LLR sequence may include a respective sub-LLR sequence for each MIMO layer, and each sub-LLR sequence may include one or more LLRs for each bit in each symbol carried in the respective MIMO. Referring to the above scenario of a 4 bit sequence that is split between 2 MIMO layers, an example of the LLR sequence may include $\vec{y} = [y(b_0) \ y(b_3) \ y(b_2) \ y(b_1)]$, where $y(b_0)$ is an LLR for $b_0$ carried in MIMO layer 0, $y(b_3)$ is an LLR for $b_3$ carried in MIMO layer 0, $y(b_2)$ is an LLR for $b_2$ carried in MIMO layer 1, and $y(b_1)$ is an LLR for $b_1$ carried in MIMO layer 1.

The LLR sequence may be used as an input to the inverse mapper 508, and the inverse mapper 508 may perform complementary and/or reciprocal functionality to the mapper 506 to generate a decoder input LLR sequence, shown by FIG. 5 as $\overrightarrow{y_{inv\ map}}$. Functionality performed by the inverse mapper 508 to generate the decoder input LLR sequence may be expressed as $\overrightarrow{y_{inv\ map}} = \vec{y}(\vec{p})$, where p is the permuted sequence associated with the mapper 506 and/or is an inverse mapping sequence that is complementary to a mapping sequence used by the mapper 506. To illustrate, using the above scenario, $\overrightarrow{y_{inv\ map}} = [y(b_0) \ y(b_1) \ y(b_2) \ y(b_3)]$. In some aspects, $y(b_0)$ and $y(b_1)$ may form a first LLR pair, where $y(b_0)$ is associated with MIMO layer 0 and $y(b_1)$ is associated with MIMO layer 1. Alternatively, or additionally, $y(b_2)$ and $y(b_3)$ may form a second LLR pair, where $y(b_2)$ is associated with MIMO layer 1 $y(b_3)$ is associated with MIMO layer 0. That is, each LLR pair at the input to the polar decoder 416 includes LLRs that are associated with different MIMO layers.

While described with regard to a bit sequence of 4 bits and a 2-layer MIMO transmission, a permuted sequence used by the mapper 506 and the inverse mapper 508 may be based at least in part on any number of MIMO layers (e.g., N MIMO layers) and any number of bits per symbol (e.g., M bits per symbol). Alternatively, or additionally, the mapper 506 and the inverse mapper 508 may be based at least in part on N LLR sequences (e.g., a respective LLR sequence for each MIMO layer) and M bits per symbol. For example, the N MIMO layers may be grouped into V layer pairs that each include a first MIMO layer and a second MIMO layer, and/or the N LLR sequences may be grouped into V LLR sequence pairs that include a first LLR sequence that is associated with a first (demodulated) MIMO layer and a second (demodulated) MIMO layer. An LLR sequence pair may be expressed as:

$$\text{LLR sequence pair}_v = (\text{LLRs of MIMO layer } 2v) \cup (\text{LLRs of MIMO layer}(2v+1))$$

where the subscript v=0, 1, . . . , $$\left(\frac{N}{2} - 1\right).$$

An inverse mapping sequence and/or a permuted sequence used at a receiver that may be used for the LLR sequence pair$_v$ may be expressed as:

$$l_{2v}b_0, l_{2v+1}b_1, l_{2v}b_2, \ldots, l_{2v}b_{m-2}, l_{2v+1}b_{m-1}$$

where, collectively, $l_k b_n$ is an LLR, $l_k$ indicates a MIMO layer that is associated with the LLR (e.g. $l_{2v}$ represents a first MIMO layer that is associated with the LLR sequence pair v and $l_{2v+1}$ is a second MIMO layer that is associated with the LLR sequence pair v), $b_n$ is a bit in symbol index n, n ranges from 0 to (m−1), and m is a number of bits per symbol. The inverse mapper 508 at the receiver 504 may be complementary to the mapper 506 at the transmitter 502. Alternatively, or additionally, an inverse mapping sequence used by the inverse mapper 508 for MIMO layer pairs may be complementary to a mapping sequence used by the mapper 506.

In some aspects, the receiver 504 may pair LLR sequences based at least in part on optimizing and/or maximizing an LLR magnitude difference for an LLR pair. To illustrate, the demodulator 414 may use QR decomposition, where Q is an orthogonal matrix, and R is an upper triangular matrix, and the demodulator 414 may output MIMO layers (e.g., respective LLR sequences) based at least in part on a measurement metric, such as a signal-to-noise ratio (SNR) metric. For example, for a 4 layer MIMO transmission, the demodulator 414 may output a first layer with the highest SNR first, followed by a second layer with the second highest SNR, followed by a third layer with the third highest SNR, and a fourth layer with the lowest SNR. In such a scenario, the receiver 504 may form a first LLR pair using the first layer and the third layer, and a second LLR pair using the second layer and the fourth layer, to maximize an LLR magnitude difference for each LLR pair at an input of a polar decoder. Alternately, or additionally, the transmitter 502 may select MIMO layer pairs based at least in part on predicting and/or computing an expected SNR and/or an expected LLR magnitude difference at the receiver 504, such as by analyzing CSI indicated by the receiver 504, transmission parameters selected by the transmitter 502, and/or uplink and downlink channel reciprocity. The transmitter may select the MIMO layer pairs based at least in part on maximizing an LLR magnitude difference and/or an expected SNR difference.

Alternatively, or additionally, the transmitter 502 and the receiver 504 may coordinate which mapping sequence and inverse mapping sequence (e.g., p) is used by the mapper 506 and the inverse mapper 508. As one example, as at least part of establishing a connection, the transmitter 502 may indicate one or more tables of potential mapping sequences, such as via radio resource control (RRC) signaling and/or Layer 3 signaling. At a later point in time, the transmitter 502 may indicate selection of a particular mapping sequence within the table, and the receiver 504 may derive an inverse mapping sequence based at least in part on the particular mapping sequence. For instance, the transmitter 502 may indicate, in DCI and/or a MAC CE, selection of the particular mapping sequence and/or inverse mapping sequence, such as by indicating an index that points to a particular entry in a table. Alternatively, or additionally, the transmitter 502 may indicate a table of potential inverse mapping sequences (e.g., via RRC signaling), and indicate selection of a particular inverse mapping sequence at a later point in time. As a second example, a communication standard may specify multiple potential mapping sequences (and/or potential inverse mapping sequences). Alternatively, or additionally, the communication standard may specify a respective identifier for each potential mapping sequence (and/or inverse mapping sequence). The transmitter 502 may indicate selection of a particular mapping sequence (and/or inverse mapping sequence) specified by the communication standard based at least in part on indicating the associated identifier (e.g., in DCI, a MAC CE, and/or RRC signaling) to the receiver 504.

Grouping LLRs from different MIMO layers in an LLR pair at an input of a polar decoder may increase an LLR magnitude difference between the LLRs in the LLR pair (e.g., relative to an LLR pair that includes LLRs from a same MIMO layer) and, consequently, increase a confidence in bit decoding at a polar decoder. To illustrate, in statistical terms and on average, the magnitudes of LLRs from different MIMO layers are more likely to have a larger difference than LLRs from the same MIMO layer. Increasing a confidence of bit decoding at a polar decoder may reduce bit decoding errors, increase data throughput, and/or decrease data transfer latencies.

As indicated above, FIG. 5 is provided as an example. Other examples may differ from what is described with regard to FIG. 5.

Figure 6:
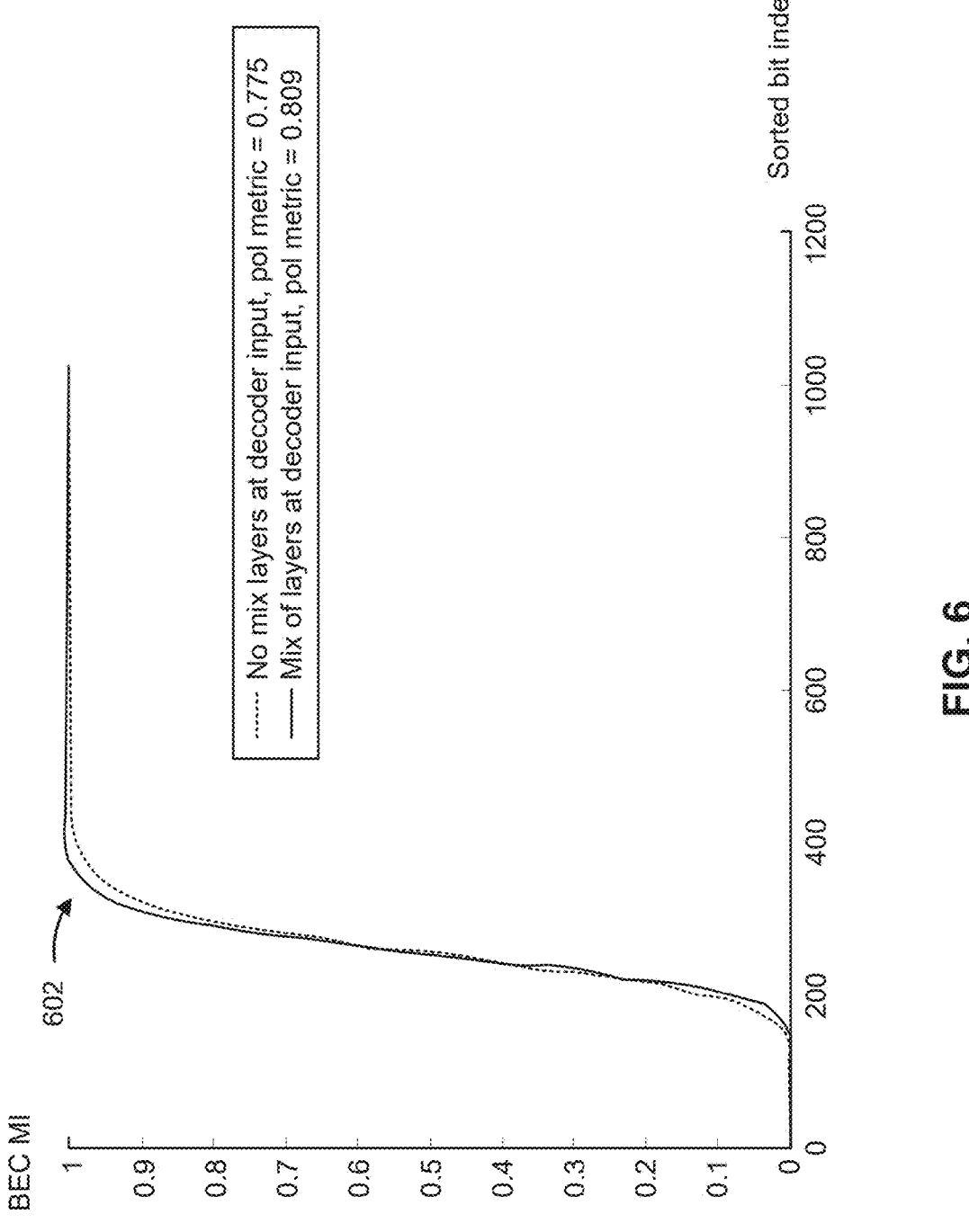
FIG. 6 is a diagram illustrating an example of density evolution simulation results for polar encoding that is based at least in part on a binary erasure channel, in accordance with the present disclosure.

FIG. 6 is a diagram illustrating an example 600 of density evolution simulation results for polar encoding that is based at least in part on a binary erasure channel (BEC), in accordance with the present disclosure.

The example 600 includes a graph that compares a first density evolution simulation for polar decoding that does not use LLR pairs that include mixed LLRs associated with different MIMO layers (shown with a dotted line) and a second density evolution simulation for polar decoding that uses LLR pairs that include LLRs associated with different MIMO layers (shown with a solid line). The horizontal axis of the graph represents a sorted bit index, and the vertical axis of the graph represents BEC mutual information (MI) that quantifies an amount of information that may be reliably transmitted and recovered through a channel. In the graph, the BEC MI is sorted from low to high.

In the example 600, the first density evolution simulation and the second density evolution simulation are based at least in part on a code block length of 1024, and an input LLRs average eraser probability of Level 1: $p_{eraser}=0.8$ and Level 2: $p_{eraser}=0.2$. The first density evolution simulation (e.g., in which LLR pairs do not include mixed LLRs from different MIMO layers) uses a first mapping sequence in which all inputs from LLRs with average level 1 are followed by all inputs from LLRs with average level 2. The second density evolution simulation (e.g., in which LLR pairs use mixed LLRs from different MIMO layers) uses a second mapping sequence that interlaces between LLRs with average level 1 and average level 2.

As shown by FIG. 6 in the legend, the first density evolution simulation has a polarization metric of 0.775, and the second density evolution simulation has a polarization metric of 0.809. Generation of the polarization metrics is based at least in on the following equation:

$$PolarMet = \frac{1}{N} \sum_i \text{Indicator}((I_i > 1 - \epsilon) \cup (I_i < \epsilon))$$

where N is a codeblock length, $I_i$ is the MI of bit i, the erasure probability is $\epsilon=0.01$, and Indicator( ) is specified as:

$$\text{Indicator}(cond) = \begin{cases} 0 & cond = \text{false} \\ 1 & cond = \text{true} \end{cases}$$

As shown by reference number 602, the mixed LLR pairs associated with the second density evolution simulation results in more channel polarization relative to the unmixed LLR pairs that are associated with the first density evolution simulation. The increased polarization may increase a confidence in bit decoding at a polar decoder and, consequently, reduce bit decoding errors, increase data throughput, and/or decrease data transfer latencies.

As indicated above, FIG. 6 is provided as an example. Other examples may differ from what is described with regard to FIG. 6.

Figure 7:
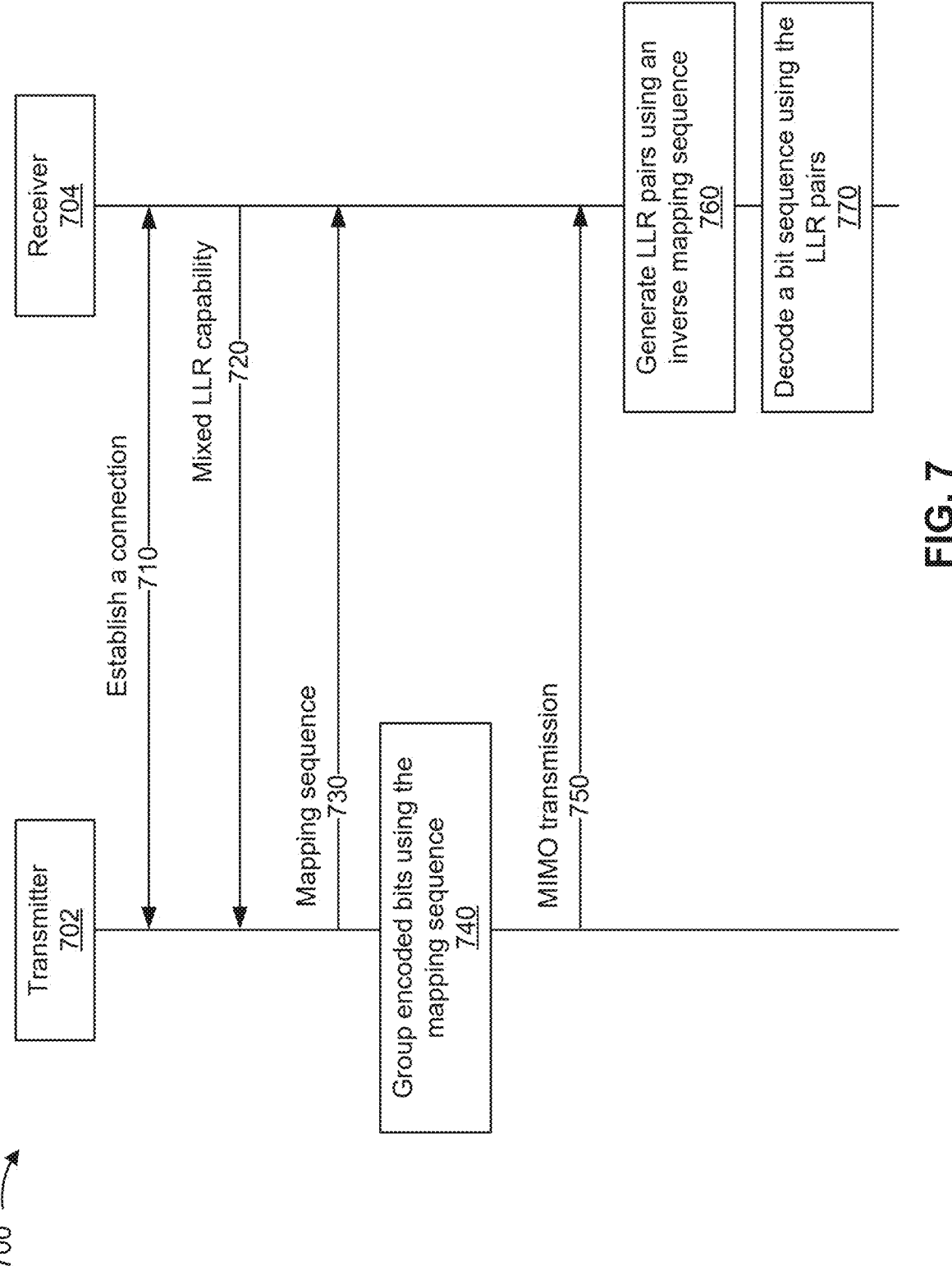
FIG. 7 is a diagram illustrating an example of a wireless communication process between a transmitter and a receiver, in accordance with the present disclosure.

FIG. 7 is a diagram illustrating an example 700 of a wireless communication process between a transmitter 702 (e.g., a network node 110 or a UE 120) and a receiver (e.g., a UE 120 or a network node 110), in accordance with the present disclosure. The transmitter 702 may transmit and/or receive communications with the receiver 704, and the receiver 704 may transmit and/or receive communications with the transmitter 702. In the example 700, the transmitter 702 is a first wireless communication device that performs polar encoding and mapping as described with regard to FIG. 5, and the receiver is a second wireless communication device that performs inverse mapping and polar decoding as described with regard to FIG. 5. However, the transmitter 702 may also include inverse mapping and polar decoding functionality as described with regard to the receiver 704, and/or the receiver 704 may include polar encoding and mapping functionality as described with regarding to the transmitter 702.

As shown by reference number 710, a transmitter 702 and a receiver 704 may establish a connection. To illustrate, in a first example, the transmitter 702 may be a network node 110 and the receiver 704 may be a UE 120. In a second example, the transmitter 702 may be a UE 120 and the receiver 704 may be a network node 110. In both the first example and the second example, the UE 120 may power up in a cell coverage area provided by the network node 110, and the UE 120 and the network node 110 may perform one or more procedures (e.g., a random access channel (RACH) procedure and/or an RRC procedure) to establish a wireless connection. As another example, the UE 120 may move into the cell coverage area provided by the network node 110 and may perform a handover from a source network node (e.g., another network node 110) to the network node 110. Alternatively, or additionally, the network node 110 and the UE 120 may communicate via the connection based at least in part on any combination of Layer 1 signaling (e.g., DCI and/or UCI), Layer 2 signaling (e.g., a MAC CE), and/or Layer 3 signaling (e.g., RRC signaling). To illustrate, the network node 110 may request, via RRC signaling, UE capability information and/or the UE 120 may transmit, via RRC signaling, the UE capability information. As part of communicating via the connection, the network node 110 may transmit configuration information via Layer 3 signaling (e.g., RRC signaling), and activate and/or deactivate a particular configuration via Layer 2 signaling (e.g., a MAC CE) and/or Layer 1 signaling (e.g., DCI). To illustrate, the network node 110 may transmit the configuration information via Layer 3 signaling at a first point in time associated with the UE 120 being tolerant of communication delays, and the network node 110 may transmit an activation of the configuration via Layer 2 signaling and/or Layer 1 signaling at a second point in time associated with the UE being less tolerant to communication delays.

As shown by reference number 720, the receiver 704 may transmit, and the transmitter 702 may receive, an indication of a mixed LLR capability. For instance, the receiver 704 may be a UE 120 that indicates support for a mapping sequence and/or an inverse mapping sequence that is associated with LLR pairs that are mixed LLR pairs associated with different MIMO layers. While the example 700 includes the receiver 704 indicating a mixed LLR capability to the transmitter 702, other examples may include the transmitter 702 indicating a mixed LLR capability to the receiver 704, such as in the second example described above in which the transmitter is a UE 120 and the receiver 704 is a network node 110.

For clarity, FIG. 7 illustrates the receiver 704 transmitting the indication of the mixed LLR capability in a separate transaction than establishing a connection with the transmitter 702. However, in some aspects, the receiver 704 may transmit the indication of the mixed LLR capability as part of establishing a connection with the transmitter 702.

As shown by reference number 730, the transmitter 702 may transmit, and the receiver 704 may receive, an indication of a mapping sequence. The transmitter 702 may transmit the indication of the mapping sequence based at least in part on receiving the indication of the mixed LLR capability from the receiver 704. Based at least in part on receiving the indication of the mapping sequence, the receiver 704 may derive an inverse mapping sequence. Alternatively or additionally, the transmitter 702 may transmit, and the receiver 704 may receive, an indication of an inverse mapping sequence. While shown in FIG. 7 as a single signaling transaction, the transmitter 702 may indicate the mapping sequence (and/or inverse mapping sequence) using multiple signaling transactions. For instance, as described with regard to FIG. 5, the transmitter 702 may transmit one or more tables of potential mapping sequences and/or potential inverse mapping sequences in Layer 3 signaling, and transmit a selection indication for a particular mapping sequence in DCI and/or a MAC CE. As a second example, the transmitter 702 may indicate selection of a particular mapping sequence and/or inverse mapping sequence specified by a communication standard in DCI, a MAC CE, and/or RRC signaling. In some aspects, the transmitter 702 may indicate the mapping sequence (and/or an inverse mapping sequence) in the MIMO transmission described with regard to reference number 750, such as in header information and/or control information. In some aspects, the transmitter 702 may indicate an index and/or identifier that is associated with a mapping sequence, and the receiver 704 may derive an inverse mapping sequence as a sequence that is complementary to the indicated mapping sequence. In other aspects, the transmitter 702 may indicate an index and/or identifier that is associated with an inverse mapping sequence.

While the example 700 includes the transmitter 702 indicating the mapping sequence, other examples may include the receiver 704 indicating the mapping sequence to the transmitter 702, such as in the second example described above in which the transmitter is a UE 120 and the receiver 704 is a network node 110.

As shown by reference number 740, the transmitter 702 may group, order, and/or reorder encoded bits using the mapping sequence. For instance, as described with regard to FIG. 5, the transmitter 702 may separate multiple encoded bits output by a polar encoder into N layers for an N-layer MIMO transmission. The transmitter 702 may separate the multiple encoded bits based at least in part on a symbol length of M bits per symbol. As part of grouping the multiple encoded bits, the transmitter may select V layer pairs from the N layers such that each layer pair of the V layer pairs includes a respective first layer and a respective second layer from the N layers. The respective first layer and the respective second layer may be associated with different MIMO layers. In some aspects, the transmitter 702 may select the V layer pairs associated with the grouping based at least in part on maximizing an estimated LLR magnitude difference at an input of a polar decoder at the receiver 704.

To group the encoded bits, the transmitter may, for each layer pair of the V layer pairs, group, order, and/or reorder a first M symbol bits of the respective first layer of the layer pair and a second M symbol bits of the respective second layer of the layer pair. The grouping, ordering, and/or reordering may generate a MIMO input bit sequence that includes multiple bit pairs, and each bit pair of the multiple bit pairs may include a respective first bit of the first M symbol bits of the respective first layer and a respective second bit of the second M symbol bits of the respective second layer.

In some aspects, the transmitter 702 may group, order, and/or reorder the encoded bits based at least in part on the mapping sequence described with regard to reference number 730. To illustrate, the transmitter may group the first M symbol bits of the respective first layer of a layer pair and the second M symbol bits of a respective second layer of the layer pair based at least in part on the particular mapping sequence. The mapping sequence and/or the grouping may be designed to increase, at a polar decoder input, an LLR magnitude difference between bits in each bit pair of the multiple bit pairs relative to another bit pair that includes bits from a same layer of the N layers, such as a mapping sequence that moves adjacent bits in a codeword to different positions that are associated with different MIMO layers. The multiple encoded bits output by the polar encoder may have a first ordering of bits, and the MIMO input bit sequence may have a second ordering of bits that is different from the first ordering of bits.

As shown by reference number 750, the transmitter 702 may transmit, and the receiver 704 may receive, a MIMO transmission. For instance, the transmitter 702 may transmit the MIMO input bit sequence using N layers as described with regard to FIG. 5. In some aspects, the transmitter 702 is a network node 110, and the MIMO transmission is a PDSCH transmission. In other aspects, the transmitter 702 is a UE 120, and the MIMO transmission is a PUSCH transmission.

As shown by reference number 760, the receiver 704 may generate one or more LLR pairs using an inverse mapping sequence. For example, based at least in part on receiving the MIMO transmission with N MIMO layers, the receiver 704 may demodulate the MIMO transmission in a manner that generates a MIMO output LLR sequence. The MIMO output LLR sequence may include N sub-LLR sequences, and each sub-LLR sequence may be associated with a respective MIMO layer of the MIMO transmission. The MIMO output LLR sequence and/or the N sub-LLR sequences may be based at least in part on a symbol bit length (e.g., M bits per symbol).

The receiver 704 may reorder the MIMO output LLR sequence and/or the N sub-LLR sequences as at least part of an inverse mapping operation, and the inverse mapping operation may be based at least in part on the mapping sequence described with regard to 730. In reordering the MIMO LLR sequence, the receiver 704 may generate a decoder input LLR sequence. The reordering may be based at least in part on the N sub-LLR sequences being partitioned into V sub-LLR sequence pairs, and each sub-LLR sequence pair of the V sub-LLR sequence pairs may include a respective first sub-LLR sequence of the N sub-LLR sequences and a respective second sub-LLR sequence of the N sub-LLR sequences. In some aspects, the first sub-LLR sequence is associated with a respective first MIMO layer of the N MIMO layers and the second sub-LLR sequence is associated with a respective second MIMO layer of the N MIMO layers. The decoder input LLR sequence may include multiple LLR pairs, and each LLR pair of the multiple LLR pairs may be associated with a sub-LLR sequence pair of the V sub-LLR sequence pairs. For instance, each LLR pair may be based at least in part on first M LLRs in the respective first sub-LLR sequence of the sub-LLR sequence pair and second M LLRs in the respective second sub-LLR sequence of the sub-LLR sequence pair. As one example, the first M LLRs may be associated with a respective first symbol and the second M LLRs may be associated with a respective second symbol such that each LLR pair includes a first respective LLR of the first M LLRs and a second LLR of the second M LLRs. Accordingly, the first M LLRs and the second M LLRs may yield M LLR pairs.

As shown by reference number 770, the receiver 704 may decode a bit sequence using the LLR pairs. For instance, the receiver 704 may input the decoder input LLR sequence to a polar decoder. Each LLR pair may include a first LLR that is associated with a first MIMO layer and a second LLR that is associated with a second MIMO layer as described above.

Grouping LLRs from different MIMO layers in an LLR pair at an input of a polar decoder may increase an LLR magnitude difference between the LLRs in the LLR pair (e.g., relative to an LLR pair that includes LLRs from a same MIMO layer) and, consequently, increase a confidence in bit decoding at a polar decoder. To illustrate, in statistical terms and on average, the magnitudes of LLRs from different MIMO layers are more likely to have a larger difference than LLRs from the same MIMO layer. Increasing a confidence of bit decoding at a polar decoder may reduce bit decoding errors, increase data throughput, and/or decrease data transfer latencies.

As indicated above, FIG. 7 is provided as an example. Other examples may differ from what is described with regard to FIG. 7.

FIG. 8 is a diagram illustrating an example process 800 performed, for example, at a transmitter or an apparatus of a transmitter, in accordance with the present disclosure. Example process 800 is an example where the apparatus or the transmitter (e.g., a UE 120 or a network node 110) performs operations associated with grouping LLRs from different MIMO layers for polar decoding.

As shown in FIG. 8, in some aspects, process 800 may include generating multiple encoded bits of a data stream using a polar encoder (block 810). For example, the transmitter (e.g., using communication manager 1006, depicted in FIG. 10 as a UE 120 and using communication manager 1106, depicted in FIG. 11 as a network node 110) may generate multiple encoded bits of a data stream using a polar encoder, as described above.

As further shown in FIG. 8, in some aspects, process 800 may include separating the multiple encoded bits into N layers for a MIMO transmission, N being a first integer that is even and greater than zero, the separating being based at least in part on a symbol length of M bits per symbol, M being a second integer (block 820). For example, the transmitter (e.g., using communication manager 1006, depicted in FIG. 10 or using communication manager 1106, depicted in FIG. 11) may separate the multiple encoded bits into N layers for a MIMO transmission, N being a first integer that is even and greater than zero, the separating being based at least in part on a symbol length of M bits per symbol, M being a second integer, as described above.

As further shown in FIG. 8, in some aspects, process 800 may include selecting V layer pairs from the N layers, each layer pair of the V layer pairs including a respective first layer and a respective second layer from the N layers, V being a third integer (block 830). For example, the transmitter (e.g., using communication manager 1006, depicted in FIG. 10 or using communication manager 1106, depicted in FIG. 11) may select V layer pairs from the N layers, each layer pair of the V layer pairs including a respective first layer and a respective second layer from the N layers, V being a third integer, as described above.

As further shown in FIG. 8, in some aspects, process 800 may include grouping, for each layer pair of the V layer pairs, a first M symbol bits of the respective first layer of the layer pair and a second M symbol bits of the respective second layer of the layer pair to generate a MIMO input bit sequence that includes multiple bit pairs, and each bit pair of the multiple bit pairs includes a respective first bit of the first M symbol bits of the respective first layer and a respective second bit of the second M symbol bits of the respective second layer (block 840). For example, the transmitter (e.g., using communication manager 1006, depicted in FIG. 10 or using communication manager 1106, depicted in FIG. 11) may group, for each layer pair of the V layer pairs, a first M symbol bits of the respective first layer of the layer pair and a second M symbol bits of the respective second layer of the layer pair to generate a MIMO input bit sequence that includes multiple bit pairs, and each bit pair of the multiple bit pairs includes a respective first bit of the first M symbol bits of the respective first layer and a respective second bit of the second M symbol bits of the respective second layer, as described above. The grouping may include ordering, reordering, and/or alternating bits to form the multiple bit pairs that each include the respective first bit that is associated with the respective first layer and the respective second bit that is associated with the respective second layer.

As further shown in FIG. 8, in some aspects, process 800 may include transmitting the MIMO transmission using the MIMO input bit sequence (block 850). For example, the transmitter (e.g., using transmission component 1004 and/or communication manager 1006, depicted in FIG. 10 or using transmission component 1104 and/or communication manager 1106, depicted in FIG. 11) may transmit the MIMO transmission using the MIMO input bit sequence, as described above.

Process 800 may include additional aspects, such as any single aspect or any combination of aspects described below and/or in connection with one or more other processes described elsewhere herein.

In a first aspect, grouping, for each layer pair of the V layer pairs, the first M symbol bits of the respective first layer and the second M symbol bits of the respective second layer is based at least in part on increasing, at a polar decoder, a LLR magnitude difference between one or more LLR pairs at an input of a polar decoder relative to another LLR pair that includes LLRs from a same layer of the N layers, the one or more LLR pairs being associated with the multiple bit pairs.

In a second aspect, selecting the V layer pairs from the N layers is based at least in part on an estimated LLR magnitude difference at a polar decoder input.

In a third aspect, selecting the V layer pairs is based at least in part on maximizing the estimated LLR magnitude difference.

In a fourth aspect, the multiple encoded bits have a first ordering of bits, and the MIMO input bit sequence has a second ordering of bits that is different from the first ordering of bits.

In a fifth aspect, the transmitter is a network node, and the MIMO transmission is a physical downlink shared channel transmission.

In a sixth aspect, the transmitter is a UE, and the MIMO transmission is a physical uplink shared channel transmission.

In a seventh aspect, process 800 includes transmitting an indication of a particular mapping sequence, and grouping the first M symbol bits of the respective first layer of the layer pair and the second M symbol bits of the respective second layer of the layer pair is based at least in part on the particular mapping sequence.

Although FIG. 8 shows example blocks of process 800, in some aspects, process 800 may include additional blocks, fewer blocks, different blocks, or differently arranged blocks than those depicted in FIG. 8. Additionally, or alternatively, two or more of the blocks of process 800 may be performed in parallel.

FIG. 9 is a diagram illustrating an example process 900 performed, for example, at a receiver or an apparatus of a receiver, in accordance with the present disclosure. Example process 900 is an example where the apparatus or the receiver (e.g., a UE 120 or a network node 110) performs operations associated with grouping LLRs pair from different MIMO layers for polar decoding.

As shown in FIG. 9, in some aspects, process 900 may include receiving a MIMO transmission that includes N MIMO layers, N being a first integer that is even and greater than zero (block 910). For example, the receiver (e.g., using reception component 1002 and/or communication manager 1006, depicted in FIG. 10, or using reception component 1102 and/or communication manager 1106, depicted in FIG. 11) may receive a MIMO transmission that includes N MIMO layers, N being a first integer that is even and greater than zero, as described above.

As further shown in FIG. 9, in some aspects, process 900 may include demodulating the MIMO transmission to generate a MIMO output LLR sequence that includes N sub-LLR sequences, each sub-LLR sequence of the N sub-LLR sequences being associated with a respective MIMO layer of the MIMO transmission, the MIMO output LLR sequence being based at least in part on a symbol length of M bits per symbol, M being a second integer (block 920). For example, the receiver (e.g., using reception component 1002 and/or communication manager 1006, depicted in FIG. 10, or using reception component 1102 and/or communication manager 1106, depicted in FIG. 11) may demodulate the MIMO transmission to generate a MIMO output LLR sequence that includes N sub-LLR sequences, each sub-LLR sequence of the N sub-LLR sequences being associated with a respective MIMO layer of the MIMO transmission, the MIMO output LLR sequence being based at least in part on a symbol length of M bits per symbol, M being a second integer, as described above.

As further shown in FIG. 9, in some aspects, process 900 may include reordering, as at least part of an inverse mapping operation, the MIMO output LLR sequence to generate a decoder input LLR sequence, the reordering being based at least in part on: the N sub-LLR sequences being partitioned into V sub-LLR sequence pairs, V being a third integer, each sub-LLR sequence pair of the V sub-LLR sequence pairs including a respective first sub-LLR sequence of the N sub-LLR sequences and a respective second sub-LLR sequence of the N sub-LLR sequences, the respective first sub-LLR sequence being associated with a respective first MIMO layer of the N MIMO layers, the respective second sub-LLR sequence being associated with a respective second MIMO layer of the N MIMO layers, and the decoder input LLR sequence including multiple LLR pairs, each LLR pair of the multiple LLR pairs being associated with a sub-LLR sequence pair of the V sub-LLR sequence pairs, each LLR pair of the multiple LLR pairs being based at least in part on first M LLRs in the respective first sub-LLR sequence of the sub-LLR sequence pair that are associated with a respective first symbol and second M LLRs in the respective second sub-LLR sequence of the sub-LLR sequence pair that are associated with a respective second symbol, each LLR pair including a first respective LLR of the first M LLRs and a second respective LLR of the second M LLRs (block 930). For example, the receiver (e.g., using communication manager 1006, depicted in FIG. 10, or using communication manager 1106, depicted in FIG. 11) may reorder, as at least part of an inverse mapping operation, the MIMO output LLR sequence to generate a decoder input LLR sequence, the reordering being based at least in part on: the N sub-LLR sequences being partitioned into V sub-LLR sequence pairs, V being a third integer, each sub-LLR sequence pair of the V sub-LLR sequence pairs including a respective first sub-LLR sequence of the N sub-LLR sequences and a respective second sub-LLR sequence of the N sub-LLR sequences, the respective first sub-LLR sequence being associated with a respective first MIMO layer of the N MIMO layers, the respective second sub-LLR sequence being associated with a respective second MIMO layer of the N MIMO layers, and the decoder input LLR sequence including multiple LLR pairs, each LLR pair of the multiple LLR pairs being associated with a sub-LLR sequence pair of the V sub-LLR sequence pairs, each LLR pair of the multiple LLR pairs being based at least in part on first M LLRs in the respective first sub-LLR sequence of the sub-LLR sequence pair that are associated with a respective first symbol and second M LLRs in the respective second sub-LLR sequence of the sub-LLR sequence pair that are associated with a respective second symbol, each LLR pair including a first respective LLR of the first M LLRs and a second respective LLR of the second M LLRs, as described above.

As further shown in FIG. 9, in some aspects, process 900 may include generating a decoded bit sequence from a polar decoder by inputting the decoder input LLR sequence to the polar decoder (block 940). For example, the receiver (e.g., using communication manager 1006, depicted in FIG. 10, or using communication manager 1106, depicted in FIG. 11) may generate a decoded bit sequence from a polar decoder by inputting the decoder input LLR sequence to the polar decoder, as described above.

Process 900 may include additional aspects, such as any single aspect or any combination of aspects described below and/or in connection with one or more other processes described elsewhere herein.

In a first aspect, selection of the V sub-LLR sequence pairs from the N sub-LLR sequences is based at least in part on maximizing an LLR magnitude difference between the first respective LLR of the first M LLRs and the second respective LLR of the second M LLRs.

In a second aspect, the MIMO output LLR sequence has a first ordering of LLRs, and the decoder input LLR sequence has a second ordering of LLRs that is different from the first ordering of bits.

In a third aspect, the receiver is a network node, and the MIMO transmission is a physical uplink shared channel transmission.

In a fourth aspect, the receiver is a UE, and the MIMO transmission is a physical downlink shared channel transmission. In a fifth aspect, process 900 includes receiving an indication of a particular mapping sequence, deriving an inverse mapping sequence using the particular mapping sequence, and reordering the MIMO output LLR sequence to generate the decoder input LLR sequence is based at least in part on the inverse mapping sequence.

In a sixth aspect, for each sub-LLR sequence pair of the V sub-LLR sequence pairs, the first M LLRs of the respective first sub-LLR sequence and the second M LLRs of the respective second sub-LLR sequence are based at least in part on increasing an LLR magnitude difference between LLRs in each LLR pair of the multiple LLR pairs relative to another LLR pair that includes LLRs that are associated with a same MIMO layer.

Although FIG. 9 shows example blocks of process 900, in some aspects, process 900 may include additional blocks, fewer blocks, different blocks, or differently arranged blocks than those depicted in FIG. 9. Additionally, or alternatively, two or more of the blocks of process 900 may be performed in parallel.

Figure 10:
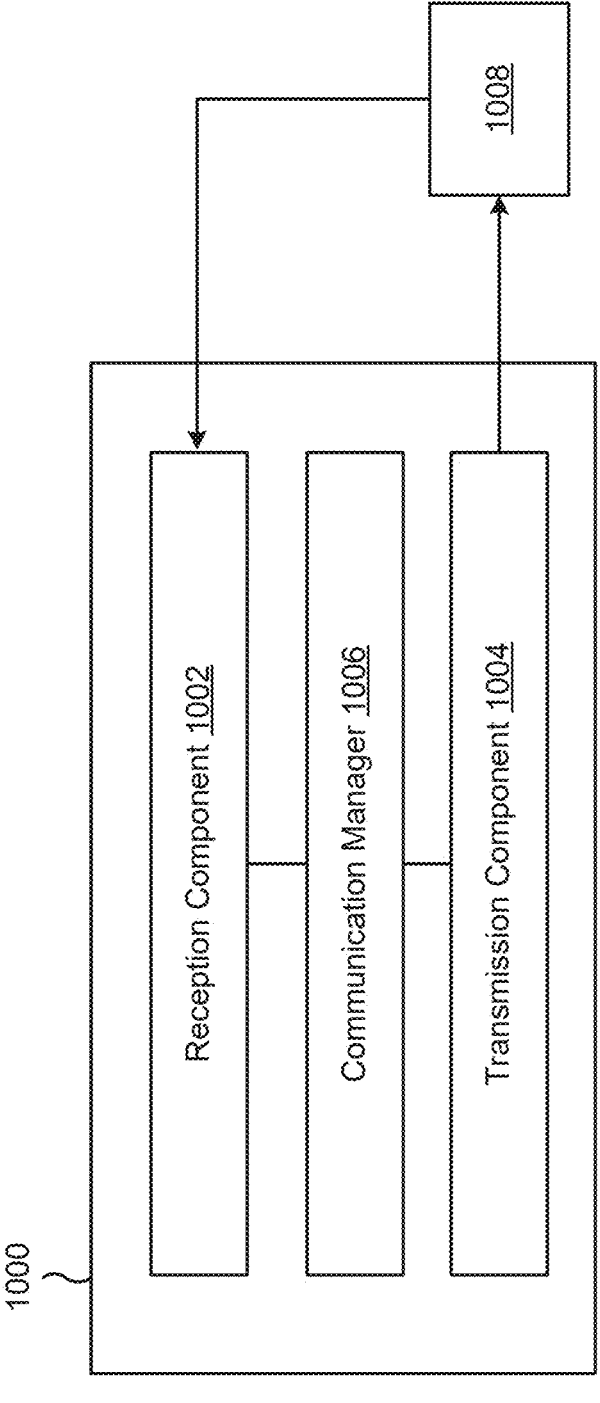
FIG. 10 is a diagram of an example apparatus for wireless communication, in accordance with the present disclosure.

FIG. 10 is a diagram of an example apparatus 1000 for wireless communication, in accordance with the present disclosure. The apparatus 1000 may be a UE 120, or a UE 120 may include the apparatus 1000. In some aspects, the apparatus 1000 includes a reception component 1002, a transmission component 1004, and/or a communication manager 1006, which may be in communication with one another (for example, via one or more buses and/or one or more other components). In some aspects, the communication manager 1006 is the communication manager 150 described in connection with FIG. 1. As shown, the apparatus 1000 may communicate with another apparatus 1008, such as a UE or a network node (such as a CU, a DU, an RU, or a base station), using the reception component 1002 and the transmission component 1004. The communication manager 1006 may be included in, or implemented via, a processing system (for example, the processing system 140 described in connection with FIG. 1) of the transmitter.

In some aspects, the apparatus 1000 may be configured to perform one or more operations described herein in connection with FIGS. 4B-7. Additionally, or alternatively, the apparatus 1000 may be configured to perform one or more processes described herein, such as process 800 of FIG. 8, process 900 of FIG. 9, or a combination thereof. In some aspects, the apparatus 1000 and/or one or more components shown in FIG. 10 may include one or more components of the UE 120 described in connection with FIG. 1. Additionally, or alternatively, one or more components shown in FIG. 10 may be implemented within one or more components described in connection with FIG. 1. Additionally, or alternatively, one or more components of the set of components may be implemented at least in part as software stored in one or more memories. For example, a component (or a portion of a component) may be implemented as instructions or code stored in a non-transitory computer-readable medium and executable by one or more controllers or one or more processors to perform the functions or operations of the component.

The reception component 1002 may receive communications, such as reference signals, control information, data communications, or a combination thereof, from the apparatus 1008. The reception component 1002 may provide received communications to one or more other components of the apparatus 1000. In some aspects, the reception component 1002 may perform signal processing on the received communications, and may provide the processed signals to the one or more other components of the apparatus 1000. In some aspects, the reception component 1002 may include one or more components of the transmitter described above in connection with FIG. 1, such as a radio, one or more RF chains, one or more transceivers, or one or more modems, each of which may in turn be coupled with one or more antennas of the transmitter.

The transmission component 1004 may transmit communications, such as reference signals, control information, data communications, or a combination thereof, to the apparatus 1008. In some aspects, one or more other components of the apparatus 1000 may generate communications and may provide the generated communications to the transmission component 1004 for transmission to the apparatus 1008. In some aspects, the transmission component 1004 may perform signal processing on the generated communications, and may transmit the processed signals to the apparatus 1008. In some aspects, the transmission component 1004 may include one or more components of the transmitter described above in connection with FIG. 1, such as a radio, one or more RF chains, one or more transceivers, or one or more modems, each of which may in turn be coupled with one or more antennas of the transmitter described in connection with FIG. 1. In some aspects, the transmission component 1004 may be co-located with the reception component 1002.

The communication manager 1006 may support operations of the reception component 1002 and/or the transmission component 1004. For example, the communication manager 1006 may receive information associated with configuring reception of communications by the reception component 1002 and/or transmission of communications by the transmission component 1004. Additionally, or alternatively, the communication manager 1006 may generate and/or provide control information to the reception component 1002 and/or the transmission component 1004 to control reception and/or transmission of communications.

In some aspects, the apparatus 1000 may be a transmitter and/or may include a transmitter. Based at least in part on the apparatus 1000 operating as a transmitter, the communication manager 1006 may generate multiple encoded bits of a data stream using a polar encoder. The communication manager 1006 may separate the multiple encoded bits into N layers for a MIMO transmission, N being a first integer that is even and greater than zero, the separating being based at least in part on a symbol length of M bits per symbol, M being a second integer. The communication manager 1006 may select V layer pairs from the N layers, each layer pair of the V layer pairs including a respective first layer and a respective second layer from the N layers, V being a third integer. The communication manager 1006 may group, for each layer pair of the V layer pairs, a first M symbol bits of the respective first layer of the layer pair and a second M symbol bits of the respective second layer of the layer pair to generate a MIMO input bit sequence that includes multiple bit pairs, and each bit pair of the multiple bit pairs includes a respective first bit of the first M symbol bits of the respective first layer and a respective second bit of the second M symbol bits of the respective second layer. To group the first M symbol bits and the second M symbol bits, the communication manager 1006 may order, reorder, and/or alternate bits to form the multiple bit pairs that each include the respective first bit that is associated with the respective first layer and the respective second bit that is associated with the respective second layer. The transmission component 1004 may transmit the MIMO transmission using the MIMO input bit sequence.

The transmission component 1004 may transmit an indication of a particular mapping sequence, and grouping the first M symbol bits of the respective first layer of the layer pair and the second M symbol bits of the respective second layer of the layer pair is based at least in part on the particular mapping sequence.

Alternatively, or additionally, the apparatus 1000 may be a receiver and/or may include a receiver. Based at least in part on the apparatus 1000 operating as a receiver, the reception component 1002 may receive a MIMO transmission that includes N MIMO layers, N being a first integer that is even and greater than zero. The communication manager 1006 may demodulate the MIMO transmission to generate a MIMO output LLR sequence that includes N sub-LLR sequences, each sub-LLR sequence of the N sub-LLR sequences being associated with a respective MIMO layer of the MIMO transmission, the MIMO output LLR sequence being based at least in part on a symbol length of M bits per symbol, M being a second integer. The communication manager 1006 may reorder, as at least part of an inverse mapping operation, the MIMO output LLR sequence to generate a decoder input LLR sequence, the reordering being based at least in part on the N sub-LLR sequences being partitioned into V sub-LLR sequence pairs, V being a third integer, each sub-LLR sequence pair of the V sub-LLR sequence pairs including a respective first sub-LLR sequence of the N sub-LLR sequences and a respective second sub-LLR sequence of the N sub-LLR sequences, the respective first sub-LLR sequence being associated with a respective first MIMO layer of the N MIMO layers, the respective second sub-LLR sequence being associated with a respective second MIMO layer of the N MIMO layers, and the decoder input LLR sequence including multiple LLR pairs, each LLR pair of the multiple LLR pairs being associated with a sub-LLR sequence pair of the V sub-LLR sequence pairs, each LLR pair of the multiple LLR pairs being based at least in part on first M LLRs in the respective first sub-LLR sequence of the sub-LLR sequence pair that are associated with a respective first symbol and second M LLRs in the respective second sub-LLR sequence of the sub-LLR sequence pair that are associated with a respective second symbol, each LLR pair including a first respective LLR of the first M LLRs and a second respective LLR of the second M LLRs. The communication manager 1006 may generate a decoded bit sequence from a polar decoder by inputting the decoder input LLR sequence to the polar decoder.

The reception component 1002 may receive an indication of a particular mapping sequence. The communication manager 1006 may derive an inverse mapping sequence using the particular mapping sequence, and reorder the MIMO output LLR sequence to generate the decoder input LLR sequence based at least in part on the inverse mapping sequence.

The number and arrangement of components shown in FIG. 10 are provided as an example. In practice, there may be additional components, fewer components, different components, or differently arranged components than those shown in FIG. 10. Furthermore, two or more components shown in FIG. 10 may be implemented within a single component, or a single component shown in FIG. 10 may be implemented as multiple, distributed components. Additionally, or alternatively, a set of (one or more) components shown in FIG. 10 may perform one or more functions described as being performed by another set of components shown in FIG. 10.

Figure 11:
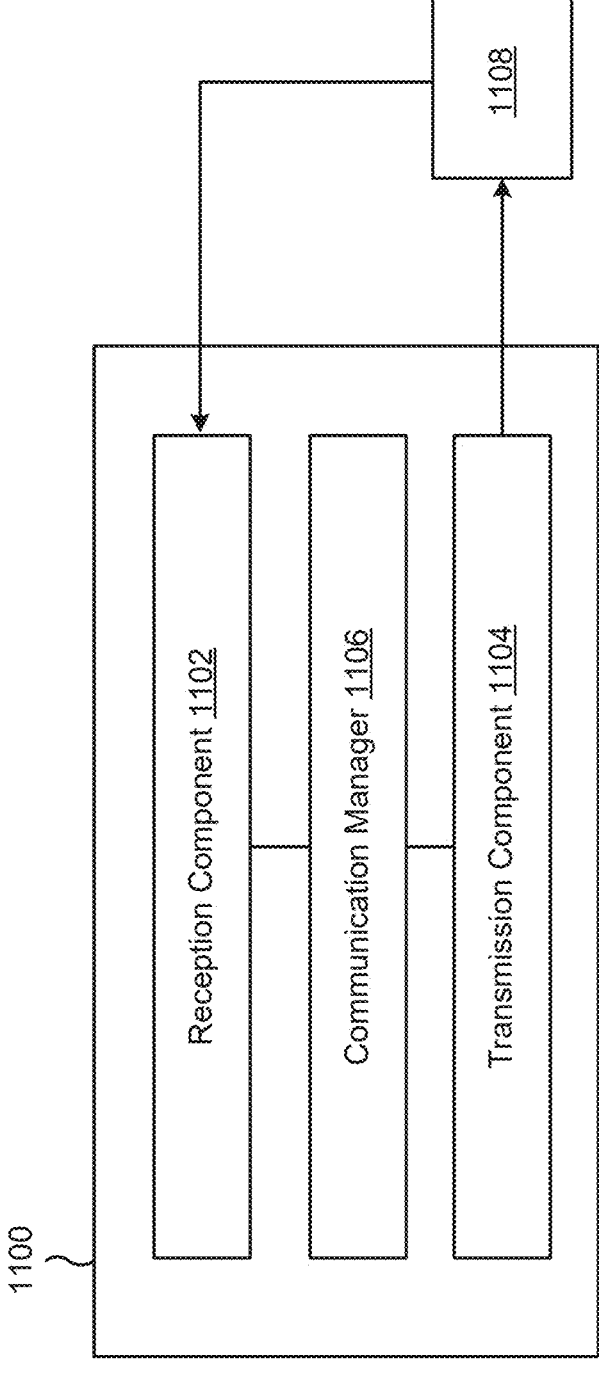
FIG. 11 is a diagram of an example apparatus for wireless communication, in accordance with the present disclosure.

FIG. 11 is a diagram of an example apparatus 1100 for wireless communication, in accordance with the present disclosure. The apparatus 1100 may be a network node 110, or a network node 110 may include the apparatus 1100. In some aspects, the apparatus 1100 includes a reception component 1102, a transmission component 1104, and/or a communication manager 1106, which may be in communication with one another (for example, via one or more buses and/or one or more other components). In some aspects, the communication manager 1106 is the communication manager 155 described in connection with FIG. 1. As shown, the apparatus 1100 may communicate with another apparatus 1108, such as a UE or a network node (such as a CU, a DU, an RU, or a base station), using the reception component 1102 and the transmission component 1104. The communication manager 1106 may be included in, or implemented via, a processing system (for example, the processing system 145 described in connection with FIG. 1) of the receiver.

In some aspects, the apparatus 1100 may be configured to perform one or more operations described herein in connection with FIGS. 4B-7. Additionally, or alternatively, the apparatus 1100 may be configured to perform one or more processes described herein, such as process 800 of FIG. 8, process 900 of FIG. 9, or a combination thereof. In some aspects, the apparatus 1100 and/or one or more components shown in FIG. 11 may include one or more components of the receiver described in connection with FIG. 1. Additionally, or alternatively, one or more components shown in FIG. 11 may be implemented within one or more components described in connection with FIG. 1. Additionally, or alternatively, one or more components of the set of components may be implemented at least in part as software stored in one or more memories. For example, a component (or a portion of a component) may be implemented as instructions or code stored in a non-transitory computer-readable medium and executable by one or more controllers or one or more processors to perform the functions or operations of the component.

The reception component 1102 may receive communications, such as reference signals, control information, data communications, or a combination thereof, from the apparatus 1108. The reception component 1102 may provide received communications to one or more other components of the apparatus 1100. In some aspects, the reception component 1102 may perform signal processing on the received communications, and may provide the processed signals to the one or more other components of the apparatus 1100. In some aspects, the reception component 1102 may include one or more components of the receiver described above in connection with FIG. 1, such as a radio, one or more RF chains, one or more transceivers, or one or more modems, each of which may in turn be coupled with one or more antennas of the receiver.

The transmission component 1104 may transmit communications, such as reference signals, control information, data communications, or a combination thereof, to the apparatus 1108. In some aspects, one or more other components of the apparatus 1100 may generate communications and may provide the generated communications to the transmission component 1104 for transmission to the apparatus 1108. In some aspects, the transmission component 1104 may perform signal processing on the generated communications, and may transmit the processed signals to the apparatus 1108. In some aspects, the transmission component 1104 may include one or more components of the receiver described above in connection with FIG. 1, such as a radio, one or more RF chains, one or more transceivers, or one or more modems, each of which may in turn be coupled with one or more antennas of the receiver described in connection with FIG. 1. In some aspects, the transmission component 1104 may be co-located with the reception component 1102.

The communication manager 1106 may support operations of the reception component 1102 and/or the transmission component 1104. For example, the communication manager 1106 may receive information associated with configuring reception of communications by the reception component 1102 and/or transmission of communications by the transmission component 1104. Additionally, or alternatively, the communication manager 1106 may generate and/or provide control information to the reception component 1102 and/or the transmission component 1104 to control reception and/or transmission of communications.

In some aspects, the apparatus 1100 may be a transmitter and/or may include a transmitter. Based at least in part on the apparatus 1100 operating as a transmitter, the communication manager 1106 may generate multiple encoded bits of a data stream using a polar encoder. The communication manager 1106 may separate the multiple encoded bits into N layers for a MIMO transmission, N being a first integer that is even and greater than zero, the separating being based at least in part on a symbol length of M bits per symbol, M being a second integer. The communication manager 1106 may select V layer pairs from the N layers, each layer pair of the V layer pairs including a respective first layer and a respective second layer from the N layers, V being a third integer. The communication manager 1106 may group, for each layer pair of the V layer pairs, a first M symbol bits of the respective first layer of the layer pair and a second M symbol bits of the respective second layer of the layer pair to generate a MIMO input bit sequence that includes multiple bit pairs, and each bit pair of the multiple bit pairs includes a respective first bit of the first M symbol bits of the respective first layer and a respective second bit of the second M symbol bits of the respective second layer. To group the first M symbol bits and the second M symbol bits, the communication manager 1106 may order, reorder, and/or alternate bits to form the multiple bit pairs that each include the respective first bit that is associated with the respective first layer and the respective second bit that is associated with the respective second layer. The transmission component 1104 may transmit the MIMO transmission using the MIMO input bit sequence.

The transmission component 1104 may transmit an indication of a particular mapping sequence, and grouping the first M symbol bits of the respective first layer of the layer pair and the second M symbol bits of the respective second layer of the layer pair is based at least in part on the particular mapping sequence.

Alternatively, or additionally, the apparatus 1100 may be a receiver and/or may include a receiver. Based at least in part on the apparatus 1100 operating as a receiver, the reception component 1102 may receive a MIMO transmission that includes N MIMO layers, N being a first integer that is even and greater than zero. The communication manager 1106 may demodulate the MIMO transmission to generate a MIMO output LLR sequence that includes N sub-LLR sequences, each sub-LLR sequence of the N sub-LLR sequences being associated with a respective MIMO layer of the MIMO transmission, the MIMO output LLR sequence being based at least in part on a symbol length of M bits per symbol, M being a second integer. The communication manager 1106 may reorder, as at least part of an inverse mapping operation, the MIMO output LLR sequence to generate a decoder input LLR sequence, the reordering being based at least in part on the N sub-LLR sequences being partitioned into V sub-LLR sequence pairs, V being a third integer, each sub-LLR sequence pair of the V sub-LLR sequence pairs including a respective first sub-LLR sequence of the N sub-LLR sequences and a respective second sub-LLR sequence of the N sub-LLR sequences, the respective first sub-LLR sequence being associated with a respective first MIMO layer of the N MIMO layers, the respective second sub-LLR sequence being associated with a respective second MIMO layer of the N MIMO layers, and the decoder input LLR sequence including multiple LLR pairs, each LLR pair of the multiple LLR pairs being associated with a sub-LLR sequence pair of the V sub-LLR sequence pairs, each LLR pair of the multiple LLR pairs being based at least in part on first M LLRs in the respective first sub-LLR sequence of the sub-LLR sequence pair that are associated with a respective first symbol and second M LLRs in the respective second sub-LLR sequence of the sub-LLR sequence pair that are associated with a respective second symbol, each LLR pair including a first respective LLR of the first M LLRs and a second respective LLR of the second M LLRs. The communication manager 1106 may generate a decoded bit sequence from a polar decoder by inputting the decoder input LLR sequence to the polar decoder.

The reception component 1102 may receive an indication of a particular mapping sequence. The communication manager 1106 may derive an inverse mapping sequence using the particular mapping sequence, and reordering the MIMO output LLR sequence to generate the decoder input LLR sequence is based at least in part on the inverse mapping sequence.

The number and arrangement of components shown in FIG. 11 are provided as an example. In practice, there may be additional components, fewer components, different components, or differently arranged components than those shown in FIG. 11. Furthermore, two or more components shown in FIG. 11 may be implemented within a single component, or a single component shown in FIG. 11 may be implemented as multiple, distributed components. Additionally, or alternatively, a set of (one or more) components shown in FIG. 11 may perform one or more functions described as being performed by another set of components shown in FIG. 11.

The following provides an overview of some Aspects of the present disclosure:

Aspect 1: A method of wireless communication performed by a transmitter, comprising: generating multiple encoded bits of a data stream using a polar encoder; separating the multiple encoded bits into N layers for a multiple-input-multiple-output (MIMO) transmission, N being a first integer that is even and greater than zero, the separating being based at least in part on a symbol length of M bits per symbol, M being a second integer; selecting V layer pairs from the N layers, each layer pair of the V layer pairs including a respective first layer and a respective second layer from the N layers, V being a third integer; grouping, for each layer pair of the V layer pairs, a first M symbol bits of the respective first layer of the layer pair and a second M symbol bits of the respective second layer of the layer pair to generate a MIMO input bit sequence that includes multiple bit pairs, and each bit pair of the multiple bit pairs includes a respective first bit of the first M symbol bits of the respective first layer and a respective second bit of the second M symbol bits of the respective second layer; and transmitting the MIMO transmission using the MIMO input bit sequence.

Aspect 2: The method of Aspect 1, wherein grouping, for each layer pair of the V layer pairs, the first M symbol bits of the respective first layer and the second M symbol bits of the respective second layer is based at least in part on increasing, at a polar decoder, a log-likelihood-ratio (LLR) magnitude difference between one or more LLR pairs at an input of a polar decoder relative to another LLR pair that includes LLRs from a same layer of the N layers, the one or more LLR pairs being associated with the multiple bit pairs.

Aspect 3: The method of Aspect 1 or Aspect 2, wherein selecting the V layer pairs from the N layers is based at least in part on an estimated log-likelihood-ratio (LLR) magnitude difference at a polar decoder input.

Aspect 4: The method of Aspect 3, wherein selecting the V layer pairs is based at least in part on maximizing the estimated LLR magnitude difference.

Aspect 5: The method of any one of Aspects 1-4, wherein the multiple encoded bits have a first ordering of bits, and wherein the MIMO input bit sequence has a second ordering of bits that is different from the first ordering of bits.

Aspect 6: The method any one of Aspects 1-5, wherein the transmitter is a network node, and wherein the MIMO transmission is a physical downlink shared channel transmission.

Aspect 7: The method any one of Aspects 1-5, wherein the transmitter is a user equipment, and wherein the MIMO transmission is a physical uplink shared channel transmission.

Aspect 8: The method any one of Aspects 1-7, further comprising: transmitting an indication of a particular mapping sequence, wherein grouping the first M symbol bits of the respective first layer of the layer pair and the second M symbol bits of the respective second layer of the layer pair is based at least in part on the particular mapping sequence.

Aspect 9: A method of wireless communication performed by a receiver, comprising: receiving a multiple-input-multiple-output (MIMO) transmission that includes N MIMO layers, N being a first integer that is even and greater than zero; demodulating the MIMO transmission to generate a MIMO output log-likelihood-ratio (LLR) sequence that includes N sub-LLR sequences, each sub-LLR sequence of the N sub-LLR sequences being associated with a respective MIMO layer of the MIMO transmission, the MIMO output LLR sequence being based at least in part on a symbol length of M bits per symbol, M being a second integer; reordering, as at least part of an inverse mapping operation, the MIMO output LLR sequence to generate a decoder input LLR sequence, the reordering being based at least in part on: the N sub-LLR sequences being partitioned into V sub-LLR sequence pairs, V being a third integer, each sub-LLR sequence pair of the V sub-LLR sequence pairs including a respective first sub-LLR sequence of the N sub-LLR sequences and a respective second sub-LLR sequence of the N sub-LLR sequences, the respective first sub-LLR sequence being associated with a respective first MIMO layer of the N MIMO layers, the respective second sub-LLR sequence being associated with a respective second MIMO layer of the N MIMO layers, and the decoder input LLR sequence including multiple LLR pairs, each LLR pair of the multiple LLR pairs being associated with a sub-LLR sequence pair of the V sub-LLR sequence pairs, each LLR pair of the multiple LLR pairs being based at least in part on first M LLRs in the respective first sub-LLR sequence of the sub-LLR sequence pair that are associated with a respective first symbol and second M LLRs in the respective second sub-LLR sequence of the sub-LLR sequence pair that are associated with a respective second symbol, each LLR pair including a first respective LLR of the first M LLRs and a second respective LLR of the second M LLRs; and generating a decoded bit sequence from a polar decoder by inputting the decoder input LLR sequence to the polar decoder.

Aspect 10: The method of Aspect 9, wherein, for each sub-LLR sequence pair of the V sub-LLR sequence pairs, the first M LLRs of the respective first sub-LLR sequence and the second M LLRs of the respective second sub-LLR sequence are based at least in part on increasing an LLR magnitude difference between LLRs in each LLR pair of the multiple LLR pairs relative to another LLR pair that includes LLRs that are associated with a same MIMO layer.

Aspect 11: The method of Aspect 9 or Aspect 10, wherein selection of the V sub-LLR sequence pairs from the N sub-LLR sequences is based at least in part on maximizing an LLR magnitude difference between the first respective LLR of the first M LLRs and the second respective LLR of the second M LLRs.

Aspect 12: The method of any one of Aspects 9-11, wherein the MIMO output LLR sequence has a first ordering of LLRs, and wherein the decoder input LLR sequence has a second ordering of LLRs that is different from the first ordering of bits.

Aspect 13: The method any one of Aspects 9-12, wherein the receiver is a network node, and wherein the MIMO transmission is a physical uplink shared channel transmission.

Aspect 14: The method any one of Aspects 9-12, wherein the receiver is a user equipment, and wherein the MIMO transmission is a physical downlink shared channel transmission.

Aspect 15: The method any one of Aspects 9-14, further comprising: receiving an indication of a particular inverse mapping sequence, and deriving an inverse mapping sequence using the particular mapping sequence, wherein reordering the MIMO output LLR sequence to generate the decoder input LLR sequence is based at least in part on the inverse mapping sequence.

Aspect 16: An apparatus for wireless communication at a device, comprising a processor; memory coupled with the processor; and instructions stored in the memory and executable by the processor to cause the apparatus to perform the method of one or more of Aspects 1-8

Aspect 17: A device for wireless communication, comprising a memory and one or more processors coupled to the memory, the one or more processors configured to perform the method of one or more of Aspects 1-8.

Aspect 18: An apparatus for wireless communication, comprising at least one means for performing the method of one or more of Aspects 1-8.

Aspect 19: A non-transitory computer-readable medium storing code for wireless communication, the code comprising instructions executable by a processor to perform the method of one or more of Aspects 1-8.

Aspect 20: A non-transitory computer-readable medium storing a set of instructions for wireless communication, the set of instructions comprising one or more instructions that, when executed by one or more processors of a device, cause the device to perform the method of one or more of Aspects 1-8.

Aspect 21: An apparatus for wireless communication at a device, comprising a processor; memory coupled with the processor; and instructions stored in the memory and executable by the processor to cause the apparatus to perform the method of one or more of Aspects 9-15.

Aspect 22: A device for wireless communication, comprising a memory and one or more processors coupled to the memory, the one or more processors configured to perform the method of one or more of Aspects 9-15.

Aspect 23: An apparatus for wireless communication, comprising at least one means for performing the method of one or more of Aspects 9-15.

Aspect 24: A non-transitory computer-readable medium storing code for wireless communication, the code comprising instructions executable by a processor to perform the method of one or more of Aspects 9-15.

Aspect 25: A non-transitory computer-readable medium storing a set of instructions for wireless communication, the set of instructions comprising one or more instructions that, when executed by one or more processors of a device, cause the device to perform the method of one or more of Aspects 9-15.

The foregoing disclosure provides illustration and description but is not intended to be exhaustive or to limit the aspects to the precise forms disclosed. Modifications and variations may be made in light of the above disclosure or may be acquired from practice of the aspects. No element, act, or instruction described herein should be construed as critical or essential unless explicitly described as such.

It will be apparent that systems or methods described herein may be implemented in different forms of hardware or a combination of hardware and software. The actual specialized control hardware or software used to implement these systems or methods is not limiting of the aspects. Thus, the operation and behavior of the systems or methods are described herein without reference to specific software code, because those skilled in the art will understand that software and hardware can be designed to implement the systems or methods based, at least in part, on the description herein. A component being configured to perform a function means that the component has a capability to perform the function, and does not require the function to be actually performed by the component, unless noted otherwise.

As used herein, the articles "a" and "an" are intended to refer to one or more items and may be used interchangeably with "one or more" or "at least one." Further, as used herein, the article "the" is intended to include one or more items referenced in connection with the article "the" and may be used interchangeably with "the one or more." Furthermore, as used herein, the terms "set" and "group" are intended to include one or more items and may be used interchangeably with "one or more." Where only one item is intended, the phrase "only one" or "a single one" or similar language is used. Also, as used herein, the terms "has," "have," "having," "comprise," "comprising," "include" and "including," and derivatives thereof or similar terms are intended to be open-ended terms that do not limit an element that they modify (for example, an element "having" A may also have B). Also, as used herein, the term "or" is intended to be inclusive when used in a series and may be used interchangeably with "and/or," unless explicitly stated otherwise (for example, if used in combination with "either" or "only one of"). As used herein, a phrase referring to "at least one of" a list of items refers to any combination of those items, including single members. As an example, "at least one of: a, b, or c" is intended to cover a, b, c, a+b, a+c, b+c, and a+b+c, as well as any combination with multiples of the same element (for example, a+a, a+a+a, a+a+b, a+a+c, a+b+b, a+c+c, b+b, b+b+b, b+b+c, c+c, and c+c+c, or any other ordering of a, b, and c).

As used herein, the term "determine" or "determining" encompasses a wide variety of actions and, therefore, "determining" can include calculating, computing, processing, deriving, estimating, investigating, looking up (such as via looking up in a table, a database, or another data structure), searching, inferring, ascertaining, and/or measuring, among other possibilities. Also, "determining" can include receiving (such as receiving information), accessing (such as accessing data stored in memory) or transmitting (such as transmitting information), among other possibilities. Additionally, "determining" can include resolving, selecting, obtaining, choosing, establishing, and/or other such similar actions.

As used herein, the phrase "based on" is intended to mean "based at least in part on" or "based on or otherwise in association with" unless explicitly stated otherwise. As used herein, "satisfying a threshold" may, depending on the context, refer to a value being greater than the threshold, greater than or equal to the threshold, less than the threshold, less than or equal to the threshold, equal to the threshold, or not equal to the threshold, among other examples.

Even though particular combinations of features are recited in the claims or disclosed in the specification, these combinations are not intended to limit the scope of all aspects described herein. Many of these features may be combined in ways not specifically recited in the claims or disclosed in the specification. The disclosure of various aspects includes each dependent claim in combination with every other claim in the claim set.

What is claimed is:

1. An apparatus for wireless communication at a transmitter, comprising:

one or more memories; and one or more processors, coupled to the one or more memories, configured to cause the transmitter to:

generate multiple encoded bits of a data stream using a polar encoder;

separate the multiple encoded bits into N layers for a
multiple-input-multiple-output (MIMO) transmis-
sion, N being a first integer that is even and greater
than zero, the separating being based at least in part
on a symbol length of M bits per symbol, M being a
second integer;

select V layer pairs from the N layers, each layer pair
of the V layer pairs including a respective first layer
and a respective second layer from the N layers, V
being a third integer;

group, for each layer pair of the V layer pairs, a first M
symbol bits of the respective first layer of the layer
pair and a second M symbol bits of the respective
second layer of the layer pair to generate a MIMO
input bit sequence that includes multiple bit pairs,
and each bit pair of the multiple bit pairs includes a
respective first bit of the first M symbol bits of the
respective first layer and a respective second bit of
the second M symbol bits of the respective second
layer; and transmit the MIMO transmission using the MIMO
input bit sequence.

2. The apparatus of claim 1, wherein the one or more
processors, to cause the transmitter to group the first M
symbol bits of the respective first layer and the second M
symbol bits of the respective second layer, are further
configured to cause the transmitter to:

group the first M symbol bits of the respective first layer
and the second M symbol bits of the respective second
layer based at least in part on increasing, at a polar
decoder, a log-likelihood-ratio (LLR) magnitude dif-
ference between one or more LLR pairs at an input of
a polar decoder relative to another LLR pair that, are
configured to cause the transmitter to LLRs from a
same layer of the N layers, the one or more LLR pairs
being associated with the multiple bit pairs.

3. The apparatus of claim 1, wherein the one or more
processors, to cause the transmitter to select the V layer pairs
from the N layers, are further configured to cause the
transmitter to:

select the V layer pairs from the N layers based at least in
part on an estimated log-likelihood-ratio (LLR) mag-
nitude difference at a polar decoder input.

4. The apparatus of claim 3, wherein the one or more
processors, to cause the transmitter to select the V layer pairs
from the N layers, are further configured to cause the
transmitter to:

select the V layer pairs based at least in part on maxi-
mizing the estimated LLR magnitude difference.

5. The apparatus of claim 1, wherein the multiple encoded
bits have a first ordering of bits, and wherein the MIMO input bit sequence has a second
ordering of bits that is different from the first ordering
of bits.

6. The apparatus of claim 1, wherein the transmitter is a
network node, and wherein the MIMO transmission is a physical downlink
shared channel transmission.

7. The apparatus of claim 1, wherein the transmitter is a
user equipment, and wherein the MIMO transmission is a physical uplink
shared channel transmission.

8. The apparatus of claim 1, wherein the one or more
processors are further configured to cause the transmitter to:

transmit an indication of a particular mapping sequence,
wherein the one or more processors, to cause the trans-
mitter to group the first M symbol bits of the respective first layer of the layer pair and the second M symbol
bits of the respective second layer of the layer pair, are
further configured to cause the transmitter to:

group the first M symbol bits of the respective first
layer of the layer pair and the second M symbol bits
of the respective second layer of the layer pair based
at least in part on the particular mapping sequence.

9. An apparatus for wireless communication at a receiver,
comprising:

one or more memories; and one or more processors, coupled to the one or more
memories, configured to cause the receiver to:

receive a multiple-input-multiple-output (MIMO)
transmission that includes N MIMO layers, N being
a first integer that is even and greater than zero;

demodulate the MIMO transmission to generate a
MIMO output log-likelihood-ratio (LLR) sequence
that includes N sub-LLR sequences, each sub-LLR
sequence of the N sub-LLR sequences being asso-
ciated with a respective MIMO layer of the MIMO
transmission, the MIMO output LLR sequence being
based at least in part on a symbol length of M bits per
symbol, M being a second integer;

reorder, as at least part of an inverse mapping opera-
tion, the MIMO output LLR sequence to generate a
decoder input LLR sequence, the reordering being
based at least in part on:

the N sub-LLR sequences being partitioned into V
sub-LLR sequence pairs, V being a third integer, each sub-LLR sequence pair of the V sub-LLR
sequence pairs including a respective first sub-
LLR sequence of the N sub-LLR sequences and a
respective second sub-LLR sequence of the N
sub-LLR sequences, the respective first sub-LLR
sequence being associated with a respective first
MIMO layer of the N MIMO layers, the respective
second sub-LLR sequence being associated with a
respective second MIMO layer of the N MIMO
layers, and the decoder input LLR sequence including multiple
LLR pairs, each LLR pair of the multiple LLR
pairs being associated with a sub-LLR sequence
pair of the V sub-LLR sequence pairs, each LLR
pair of the multiple LLR pairs being based at least
in part on first M LLRs in the respective first
sub-LLR sequence of the sub-LLR sequence pair
that are associated with a respective first symbol
and second M LLRs in the respective second
sub-LLR sequence of the sub-LLR sequence pair
that are associated with a respective second sym-
bol, each LLR pair including a first respective
LLR of the first M LLRs and a second respective
LLR of the second M LLRs; and generate a decoded bit sequence from a polar decoder
by inputting the decoder input LLR sequence to the
polar decoder.

10. The apparatus of claim 9, wherein, for each sub-LLR
sequence pair of the V sub-LLR sequence pairs, the first M
LLRs of the respective first sub-LLR sequence and the
second M LLRs of the respective second sub-LLR sequence
based at least in part on increasing an LLR magnitude
difference between LLRs in each LLR pair of the multiple
LLR pairs relative to another LLR pair that includes LLRs
that are associated with a same MIMO layer.

11. The apparatus of claim 9, wherein selection of the V
sub-LLR sequence pairs from the N sub-LLR sequences is
based at least in part on maximizing an LLR magnitude difference between the first respective LLR of the first M LLRs and the second respective LLR of the second M LLRs.

12. The apparatus of claim 9, wherein the MIMO output LLR sequence has a first ordering of LLRs, and wherein the decoder input LLR sequence has a second ordering of LLRs that is different from the first ordering of bits.

13. The apparatus of claim 9, wherein the receiver is a network node, and wherein the MIMO transmission is a physical uplink shared channel transmission.

14. The apparatus of claim 9, wherein the receiver is a user equipment, and wherein the MIMO transmission is a physical downlink shared channel transmission.

15. The apparatus of claim 9, wherein the one or more processors are further configured to cause the receiver to:

receive an indication of a particular mapping sequence; and derive an inverse mapping sequence using the particular mapping sequence, wherein the one or more processors, to cause the receiver to reorder the MIMO output LLR sequence, are further configured to cause the receiver to:

reorder the MIMO output LLR sequence to generate the decoder input LLR sequence based at least in part on the inverse mapping sequence.

16. A method of wireless communication performed by a transmitter, comprising:

generating multiple encoded bits of a data stream using a polar encoder;

separating the multiple encoded bits into N layers for a multiple-input-multiple-output (MIMO) transmission, N being a first integer that is even and greater than zero, the separating being based at least in part on a symbol length of M bits per symbol, M being a second integer;

selecting V layer pairs from the N layers, each layer pair of the V layer pairs including a respective first layer and a respective second layer from the N layers, V being a third integer;

grouping, for each layer pair of the V layer pairs, a first M symbol bits of the respective first layer of the layer pair and a second M symbol bits of the respective second layer of the layer pair to generate a MIMO input bit sequence that includes multiple bit pairs, and each bit pair of the multiple bit pairs includes a respective first bit of the first M symbol bits of the respective first layer and a respective second bit of the second M symbol bits of the respective second layer; and transmitting the MIMO transmission using the MIMO input bit sequence.

17. The method of claim 16, wherein grouping the first M symbol bits of the respective first layer and the second M symbol bits of the respective second layer is based at least in part on increasing, at a polar decoder, a log-likelihood-ratio (LLR) magnitude difference between one or more LLR pairs at an input of a polar decoder relative to another LLR pair that includes LLRs from a same layer of the N layers, the one or more LLR pairs being associated with the multiple bit pairs.

18. The method of claim 16, wherein selecting the V layer pairs from the N layers is based at least in part on an estimated log-likelihood-ratio (LLR) magnitude difference at a polar decoder input.

19. The method of claim 18, wherein selecting the V layer pairs from the N layers is based at least in part on maximizing the estimated LLR magnitude difference.

20. The method of claim 16, wherein the multiple encoded bits have a first ordering of bits, and wherein the MIMO input bit sequence has a second ordering of bits that is different from the first ordering of bits.

21. The method of claim 16, wherein the transmitter is a network node, and wherein the MIMO transmission is a physical downlink shared channel transmission.

22. The method of claim 16, wherein the transmitter is a user equipment, and wherein the MIMO transmission is a physical uplink shared channel transmission.

23. The method of claim 16, further comprising:

transmitting an indication of a particular mapping sequence, wherein grouping the first M symbol bits of the respective first layer of the layer pair and the second M symbol bits of the respective second layer of the layer pair is based at least in part on the particular mapping sequence.

24. A method of wireless communication performed by a receiver, comprising:

receiving a multiple-input-multiple-output (MIMO) transmission that includes N MIMO layers, N being a first integer that is even and greater than zero;

demodulating the MIMO transmission to generate a MIMO output log-likelihood-ratio (LLR) sequence that includes N sub-LLR sequences, each sub-LLR sequence of the N sub-LLR sequences being associated with a respective MIMO layer of the MIMO transmission, the MIMO output LLR sequence being based at least in part on a symbol length of M bits per symbol, M being a second integer;

reordering, as at least part of an inverse mapping operation, the MIMO output LLR sequence to generate a decoder input LLR sequence, the reordering being based at least in part on:

the N sub-LLR sequences being partitioned into V sub-LLR sequence pairs, V being a third integer, each sub-LLR sequence pair of the V sub-LLR sequence pairs including a respective first sub-LLR sequence of the N sub-LLR sequences and a respective second sub-LLR sequence of the N sub-LLR sequences, the respective first sub-LLR sequence being associated with a respective first MIMO layer of the N MIMO layers, the respective second sub-LLR sequence being associated with a respective second MIMO layer of the N MIMO layers, and the decoder input LLR sequence including multiple LLR pairs, each LLR pair of the multiple LLR pairs being associated with a sub-LLR sequence pair of the V sub-LLR sequence pairs, each LLR pair of the multiple LLR pairs being based at least in part on first M LLRs in the respective first sub-LLR sequence of the sub-LLR sequence pair that are associated with a respective first symbol and second M LLRs in the respective second sub-LLR sequence of the sub-LLR sequence pair that are associated with a respective second symbol, each LLR pair including a first respective LLR of the first M LLRs and a second respective LLR of the second M LLRs; and generating a decoded bit sequence from a polar decoder by inputting the decoder input LLR sequence to the polar decoder.

25. The method of claim 24, wherein, for each sub-LLR sequence pair of the V sub-LLR sequence pairs, the first M LLRs of the respective first sub-LLR sequence and the second M LLRs of the respective second sub-LLR sequence are based at least in part on increasing an LLR magnitude difference between LLRs in each LLR pair of the multiple LLR pairs relative to another LLR pair that includes LLRs that are associated with a same MIMO layer.

26. The method of claim 25, wherein selection of the V sub-LLR sequence pairs from the N sub-LLR sequences is based at least in part on maximizing an LLR magnitude difference between the first respective LLR of the first M LLRs and the second respective LLR of the second M LLRs.

27. The method of claim 24, wherein the MIMO output LLR sequence has a first ordering of LLRs, and wherein the decoder input LLR sequence has a second ordering of LLRs that is different from the first ordering of bits.

28. The method of claim 24, wherein the receiver is a network node, and wherein the MIMO transmission is a physical uplink shared channel transmission.

29. The method of claim 24, wherein the receiver is a user equipment, and wherein the MIMO transmission is a physical downlink shared channel transmission.

30. The method of claim 24, further comprising:

receiving an indication of a particular mapping sequence; and deriving an inverse mapping sequence using the particular mapping sequence, wherein reordering the MIMO output LLR sequence to generate the decoder input LLR sequence is based at least in part on the particular inverse mapping sequence.

* * * * *